United States Patent
Cha et al.

(10) Patent No.: US 12,382,770 B2
(45) Date of Patent: Aug. 5, 2025

(54) DISPLAY DEVICE AND TILED DISPLAY DEVICE INCLUDING THE SAME

(71) Applicant: Samsung Display Co., LTD., Yongin-si (KR)

(72) Inventors: Na Hyeon Cha, Yongin-si (KR); Sun Kwun Son, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 440 days.

(21) Appl. No.: 17/701,171

(22) Filed: Mar. 22, 2022

(65) Prior Publication Data
US 2023/0033837 A1    Feb. 2, 2023

(30) Foreign Application Priority Data
Jul. 27, 2021   (KR) .......................... 10-2021-0098477

(51) Int. Cl.
*H01L 27/12*    (2006.01)
*H10H 29/14*    (2025.01)

(52) U.S. Cl.
CPC ................ *H10H 29/142* (2025.01)

(58) Field of Classification Search
CPC ....... H01L 27/12; H01L 27/15; H01L 27/124; H01L 27/156; H01L 25/16; H01L 25/167; H01L 25/075; H01L 25/0753; H01L 33/62; H10H 29/14; H10H 29/142; H10H 20/857; H10H 86/40; H10H 86/441; G06F 3/041; G06F 3/044; G06F 3/04164;
(Continued)

(56) References Cited

U.S. PATENT DOCUMENTS

| 2008/0203391 A1* | 8/2008 | Kim ..................... G02F 1/1345 |
| | | 257/E27.111 |
| 2018/0261627 A1 | 9/2018 | An |
| 2019/0103455 A1 | 4/2019 | Song et al. |

(Continued)

FOREIGN PATENT DOCUMENTS

| KR | 10-2006-0121574 A | 11/2006 |
| KR |      2013-0018493 A |  2/2013 |

(Continued)

OTHER PUBLICATIONS

Korean Office Action issued in corresponding Application No. KR 10-2021-0098477, dated Feb. 3, 2025, 5 pages.

*Primary Examiner* — Chuong A Luu
(74) *Attorney, Agent, or Firm* — Womble Bond Dickinson (US) LLP

(57) ABSTRACT

A display device includes a first substrate, a plurality of gate fan-out lines and a plurality of data fan-out lines in a first metal layer on the first substrate, a second substrate on the first metal layer, a data line in a second metal layer on the second substrate and extending in a first direction, a gate electrode of a thin film transistor in a third metal layer on the second metal layer, a plurality of gate lines in a fourth metal layer on the third metal layer and extending in a second direction crossing the first direction, and at least one connection line in at least one of the second to fourth metal layers, crossing the plurality of data fan-out lines in a plan view, and electrically connecting some of the plurality of gate fan-out lines to corresponding gate lines of the plurality of gate lines.

15 Claims, 31 Drawing Sheets

(58) Field of Classification Search
CPC ......... G06F 2203/04111; G09F 9/3023; G09F 9/302; G09F 9/33; G09F 3/32; G09G 2300/0408
USPC ........................................................ 257/89
See application file for complete search history.

(56) References Cited

U.S. PATENT DOCUMENTS

| | | |
|---|---|---|
| 2019/0393294 A1 | 12/2019 | Song et al. |
| 2020/0343326 A1 | 10/2020 | Park et al. |
| 2021/0066444 A1 | 3/2021 | Song et al. |
| 2021/0208433 A1 | 7/2021 | Ahn et al. |
| 2022/0299811 A1 | 9/2022 | Ahn et al. |

FOREIGN PATENT DOCUMENTS

| | | |
|---|---|---|
| KR | 10-1353493 B1 | 1/2014 |
| KR | 10-2019-0038718 A | 4/2019 |
| KR | 2019-0068112 A | 6/2019 |
| KR | 10-2020-0124798 A | 11/2020 |
| KR | 10-2200258 B1 | 1/2021 |
| KR | 10-2021-0089282 A | 7/2021 |

* cited by examiner

SP: SP1, SP2, SP3

DISPLAY DEVICE AND TILED DISPLAY DEVICE INCLUDING THE SAME

CROSS-REFERENCE TO RELATED APPLICATION

This application claims priority to and the benefit of Korean Patent Application No. 10-2021-0098477 filed on Jul. 27, 2021, in the Korean Intellectual Property Office (KIPO), the entire content of which is incorporated by reference herein.

BACKGROUND

1. Field

The present disclosure relates to a display device and a tiled display device including the same.

2. Description of the Related Art

As the information society develops, the demand for display devices for displaying images has increased and diversified. For example, display devices have been applied to various electronic devices such as smartphones, digital cameras, laptop computers, navigation devices, and smart televisions. The display devices may be flat panel display devices such as liquid crystal display devices, field emission display devices, or organic light emitting display devices. Among such flat panel display devices, a light emitting display device may display an image without a backlight unit providing light to a display panel because each of pixels of the display panel includes a light emitting element that may emit light by itself.

When the display device is manufactured in a large size, a defect rate of the light emitting element may increase due to an increase in the number of pixels, and productivity or reliability may decrease. In order to solve such a problem, a tiled display device may realize a screen having a large size by connecting a plurality of display devices having a relatively small size to each other. The tiled display device may include boundary portions called seams between the plurality of display devices due to non-display areas or bezel areas of each of the plurality of display devices adjacent to each other. When one image is displayed on the entire screen, the boundary portions between the plurality of display devices give a sense of discontinuity to the entire screen to decrease a degree of immersion of the image.

SUMMARY

Aspects of the present disclosure are directed toward a display device capable of electrically connecting gate fan-out lines in a display area on a substrate to gate lines without adding a separate metal layer by connecting the gate fan-out lines on the substrate to the gate lines at an edge of the display area through connection lines on a display layer, and a tiled display device including the same.

Aspects of the present disclosure are directed toward a tiled display device capable of removing a sense of discontinuity between a plurality of display devices and improving a degree of immersion of an image by preventing or substantially preventing non-display areas of the plurality of display devices (e.g., boundary portions between adjacent display devices) from being recognized.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to one or more embodiments of the present disclosure, a display device includes a plurality of gate fan-out lines and a plurality of data fan-out lines in a first metal layer on the first substrate, a second substrate on the first metal layer, a data line in a second metal layer on the second substrate and extending in a first direction, a gate electrode of a thin film transistor in a third metal layer on the second metal layer, a plurality of gate lines in a fourth metal layer on the third metal layer and extending in a second direction crossing the first direction, and at least one connection line in at least one of the second, the third, or the fourth metal layers, crossing the plurality of data fan-out lines in a plan view, and electrically connecting some of the plurality of gate fan-out lines to corresponding gate lines of the plurality of gate lines.

The at least one connection line may include a first connection line electrically connecting a first gate fan-out line of the plurality of gate fan-out lines to a first gate line of the plurality of gate lines. The first connection line may include a first-first connection line in the second metal layer, the first-first connection line being connected to the first gate fan-out line, a first-second connection line in the fourth metal layer, the first-second connection line being connected to the first-first connection line, and a first-third connection line in the second metal layer, the first-third connection line electrically connecting the first-second connection line and the first gate line to each other.

The display device may further include a sensing line and a first voltage line in the second metal layer, the sensing line and the first voltage line extending in the first direction. The first-second connection line may cross the data line, the sensing line, and the first voltage line in a plan view.

The display device may further include a second voltage line in the fourth metal layer, the second voltage line extending in the second direction. The first-first connection line and the first-third connection line may cross at least one of the plurality of gate lines and the second voltage line in a plan view.

The at least one connection line may further include a second connection line electrically connecting a second gate fan-out line of the plurality of gate fan-out lines to a second gate line of the plurality of gate lines. The second connection line may be in the second metal layer and extends in the first direction.

The second connection line may cross at least one of the plurality of gate lines in a plan view.

The at least one connection line may include a first connection line electrically connecting a first gate fan-out line of the plurality of gate fan-out lines to a first gate line of the plurality of gate lines. The first connection line may include a first-first connection line in the third metal layer, the first-first connection line being connected to the first gate fan-out line, a first-second connection line in the fourth metal layer, the first-second connection line being connected to the first-first connection line, and a first-third connection line in the third metal layer, the first-third connection line electrically connecting the first-second connection line and the first gate line to each other.

The at least one connection line may further include a second connection line electrically connecting a second gate fan-out line of the plurality of gate fan-out lines to a second gate line of the plurality of gate lines. The second connection line may be in the third metal layer, the second connection line extending in the first direction.

The at least one connection line may include a first connection line electrically connecting a first gate fan-out line of the plurality of gate fan-out lines to a first gate line of the plurality of gate lines. The first connection line may include a first-first connection line in the second metal layer, the first-first connection line being connected to the first gate fan-out line, a first-second connection line in the third metal layer, the first-second connection line being connected to the first-first connection line, and a first-third connection line in the second metal layer, the first-third connection line electrically connecting the first-second connection line and the first gate line to each other.

The at least one connection line may include a first connection line electrically connecting a first gate fan-out line of the plurality of gate fan-out lines to a first gate line of the plurality of gate lines. The first connection line may include a first-first connection line in the second metal layer, the first-first connection line being connected to the first gate fan-out line, a first-second connection line in the fourth metal layer, the first-second connection line being connected to the first-first connection line, and a first-third connection line in the third metal layer, the first-third connection line electrically connecting the first-second connection line and the first gate line to each other.

The at least one connection line may include a first connection line electrically connecting a first gate fan-out line of the plurality of gate fan-out lines to a first gate line of the plurality of gate lines. The first connection line may include a first-first connection line in the second metal layer, the first-first connection line being connected to the first gate fan-out line, and a first-second connection line in the third metal layer, the first-second connection line electrically connecting the first-first connection line and the first gate line to each other.

The first-first connection line may extend in the first direction. The first-second connection line may extend from the first-first connection line in the second direction and may be then bent, and may extend in the first direction.

The at least one connection line may include a first connection line electrically connecting a first gate fan-out line of the plurality of gate fan-out lines to a first gate line of the plurality of gate lines. The first connection line may be in the third metal layer, the first connection line may be bent multiple times.

According to one or more embodiments of the present disclosure, a display device includes a first substrate including a display area and a non-display area, a gate fan-out line at an edge of a side of the display area on the first substrate, a data fan-out line at an edge of another side of the display area adjacent to the edge of the side of the display area on the first substrate, a gate line on the gate fan-out line and the data fan-out line, and a first connection line electrically connecting the gate fan-out line and the gate line spaced from each other with the data fan-out line interposed therebetween.

The gate fan-out line and the data fan-out line may be in a first metal layer on the first substrate. The display device may further include a data line in a second metal layer on the first metal layer, the data line extending in a first direction, and a gate electrode of a thin film transistor in a third metal layer on the second metal layer. The gate line may be in a fourth metal layer on the third metal layer, the gate line extending in a second direction crossing the first direction.

The first connection line may include a first-first connection line in the second metal layer, the first-first connection line being connected to the gate fan-out line, a first-second connection line in the fourth metal layer, the first-second connection line being connected to the first-first connection line, and a first-third connection line in the second metal layer, the first-third connection line electrically connecting the first-second connection line and the gate line to each other.

The first connection line may include a first-first connection line in the third metal layer, the first-first connection line being connected to the gate fan-out line, a first-second connection line in the fourth metal layer, the first-second connection line being connected to the first-first connection line, and a first-third connection line in the third metal layer, the first-third connection line electrically connecting the first-second connection line and the gate line to each other.

The first connection line may include a first-first connection line in the second metal layer, the first-first connection line being connected to the gate fan-out line, a first-second connection line in the third metal layer, the first-second connection line being connected to the first-first connection line, and a first-third connection line in the second metal layer, the first-third connection line electrically connecting the first-second connection line and the gate line to each other.

The first connection line may include a first-first connection line in the second metal layer, the first-first connection line being connected to the gate fan-out line, a first-second connection line in the fourth metal layer, the first-second connection line being connected to the first-first connection line, and a first-third connection line in the third metal layer, the first-third connection line electrically connecting the first-second connection line and the gate line to each other.

The first connection line may include a first-first connection line in the second metal layer, the first-first connection line being connected to the gate fan-out line, and a first-second connection line in the third metal layer, the first-second connection line electrically connecting the first-first connection line and the gate line to each other. The first-first connection line may extend in the first direction. The first-second connection line may extend from the first-first connection line in the second direction and may be then bent, and may extend in the first direction.

The first connection line may be in the third metal layer and may be bent multiple times.

According to one or more embodiments of the present disclosure, a tiled display device includes a plurality of display devices each including a display area including a plurality of pixels and a non-display area around (e.g., surrounding) the display area, and a coupling part coupling the plurality of display devices to each other. Each of the plurality of display devices includes a first substrate, a plurality of gate fan-out lines and a plurality of data fan-out lines in a first metal layer on the first substrate, a second substrate on the first metal layer, a data line in a second metal layer on the second substrate and extending in a first direction, a gate electrode of a thin film transistor in a third metal layer on the second metal layer, a plurality of gate lines in a fourth metal layer on the third metal layer and extending in a second direction crossing the first direction, and at least one connection line in at least one of the second, the third, or the fourth metal layers, crossing the plurality of data fan-out lines in a plan view, and electrically connecting some of the plurality of gate fan-out lines to corresponding gate lines of the plurality of gate lines.

With the display device according to embodiments and the tiled display device including the same, a flexible film disposed on a lower surface of a substrate may be connected to gate fan-out lines and data fan-out lines disposed in a display area on the substrate. Some of the gate fan-out lines may be connected to gate lines disposed at an edge of the display area through connection lines disposed on a display layer. Accordingly, the display device may electrically connect the gate fan-out lines disposed in the display area to the gate lines without including a separate metal layer or mask.

With the display device according to embodiments and the tiled display device including the same, an area of a non-display area of the display device may be minimized or reduced by electrically connecting a flexible film disposed under the substrate and fan-out lines disposed on the substrate to each other. Accordingly, the tiled display device may minimize or reduce an interval between a plurality of display devices to prevent or substantially prevent non-display areas of or boundary portions between the plurality of display devices from being recognized by a user and remove or reduce a sense of discontinuity between the plurality of display devices, thereby improving a degree of immersion of an image.

The effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

Figure 1:
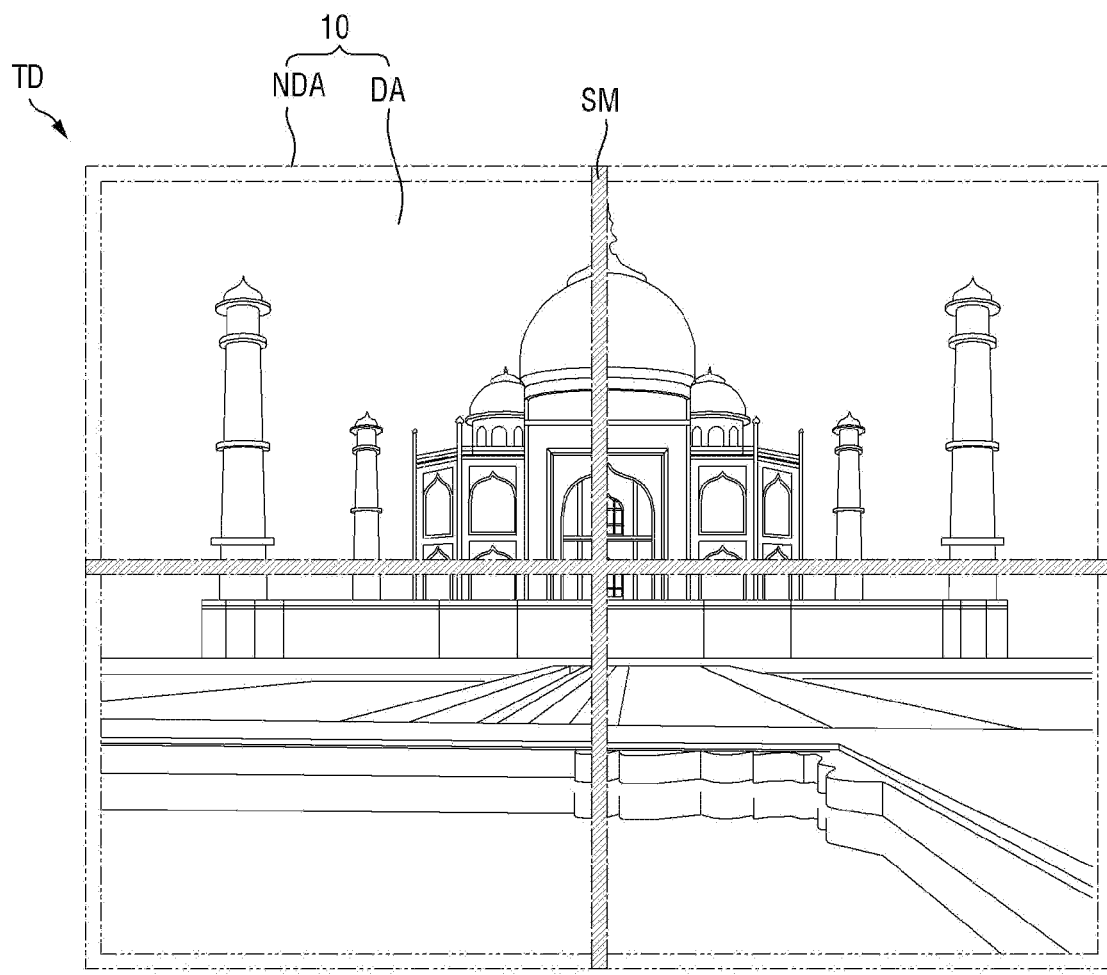
FIG. 1 is a plan view illustrating a tiled display device according to one or more embodiments.

In the following description, for the purposes of explanation, numerous specific details are set forth in order to provide a thorough understanding of various embodiments or implementations of the present disclosure. As used herein "embodiments" and "implementations" are interchangeable words that are non-limiting examples of devices or methods employed in accordance with the present disclosure. It is apparent, however, that various embodiments may be practiced within the spirit and scope of the present disclosure without these specific details or with one or more equivalent arrangements. Structures and devices may be shown in block diagram form in order to avoid unnecessarily obscuring various embodiments. Further, various embodiments may be different, but do not have to be mutually exclusive. For example, specific shapes, configurations, and characteristics of an embodiment may be used or implemented in other embodiments without departing from the spirit and scope of the present disclosure.

Unless otherwise specified, the illustrated embodiments are to be understood as providing features of varying detail of some ways in which the present disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the spirit and scope of the present disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items. Further, the use of "may" when describing embodiments of the present disclosure refers to "one or more embodiments of the present disclosure."

Although the terms "first," "second," and the like may be used herein to describe various types of elements, these elements should not be limited by these terms. These terms are used to distinguish one element from another element. Thus, a first element discussed below could be termed a second element without departing from the teachings of the present disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the present disclosure. Further, the blocks, units, parts, and/or modules of some embodiments may be physically combined into more complex blocks, units, parts, and/or modules without departing from the scope of the present disclosure.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the present disclosure, and should not be interpreted in an ideal or overly formal sense, unless clearly so defined herein.

Hereinafter, detailed embodiments of the present disclosure will be described with reference to the accompanying drawings.

FIG. 1 is a plan view illustrating a tiled display device according to one or more embodiments.

Referring to FIG. 1, a tiled display device TD may include a plurality of display devices 10. The plurality of display devices 10 may be arranged in a lattice shape, but are not limited thereto. The plurality of display devices 10 may be connected to each other in a first direction (X-axis direction) or a second direction (Y-axis direction), and the tiled display device TD may have a specific shape. As an example, the plurality of display devices 10 may have the same size, but are not limited thereto. For example, the plurality of display devices 10 may have different sizes.

Each of the plurality of display devices 10 may have a rectangular shape including long sides and short sides. The plurality of display devices 10 may be disposed with long sides or short sides connected to each other. Some display devices 10 may be disposed at edges of the tiled display device TD, and may form one side of the tiled display device TD. Some other display device 10 may be disposed at corners of the tiled display device TD, and may form two adjacent sides of the tiled display device TD. Some other display devices 10 may be disposed inside the tiled display device TD, and be surrounded by the other display devices 10.

Each of the plurality of display devices 10 may include a display area DA and a non-display area NDA. The display area DA may include a plurality of pixels to display an image. Each of the plurality of pixels may include an organic light emitting diode including an organic light emitting layer, a micro light emitting diode (micro LED), a quantum dot light emitting diode including a quantum dot light emitting layer, or an inorganic semiconductor light emitting diode including an inorganic semiconductor. Hereinafter, each of the plurality of pixels may be primarily described as including an inorganic light emitting diode, but the present disclosure is not limited thereto. The non-display area NDA may be disposed around the display area DA to surround the display area DA, and may not display an image.

The tiled display device TD may have an overall planar shape (e.g., may have a flat display surface), but is not limited thereto. The tiled display device TD may have a three-dimensional shape to provide a three-dimensional effect to a user. As an example, when the tiled display device TD has the three-dimensional shape, at least some of the plurality of display devices 10 may have a curved shape (e.g., may have a curved display surface). As another example, the plurality of display devices 10 may have a planar shape (e.g., have a flat display surface) and may be connected to each other at an angle (e.g., a predetermined angle), such that the tiled display device TD may have a three-dimensional shape.

The tiled display device TD may include coupling areas SM disposed between the plurality of display areas DA. The tiled display device TD may be formed by connecting the non-display areas NDA of each of adjacent display devices 10 to each other. The plurality of display devices 10 may be connected to each other through coupling parts or adhesive members disposed in the coupling areas SM. The coupling areas SM of each of the plurality of display devices 10 may not include pad parts or flexible films attached to the pad parts. Accordingly, a distance between the display areas DA of each of the plurality of display devices 10 may be too small for the coupling areas SM between the plurality of display devices 10 to be recognized by the user. In addition, an external light reflectivity of the display areas DA of each of the plurality of display devices 10 may be substantially the same as an external light reflectivity of the coupling areas SM between the plurality of display devices 10. Accordingly, the tiled display device TD may remove or reduce a sense of discontinuity between the plurality of display devices 10 and improve a degree of immersion of an image by preventing or substantially preventing the coupling areas SM between the plurality of display devices 10 from being recognized by the user.

Figure 2:
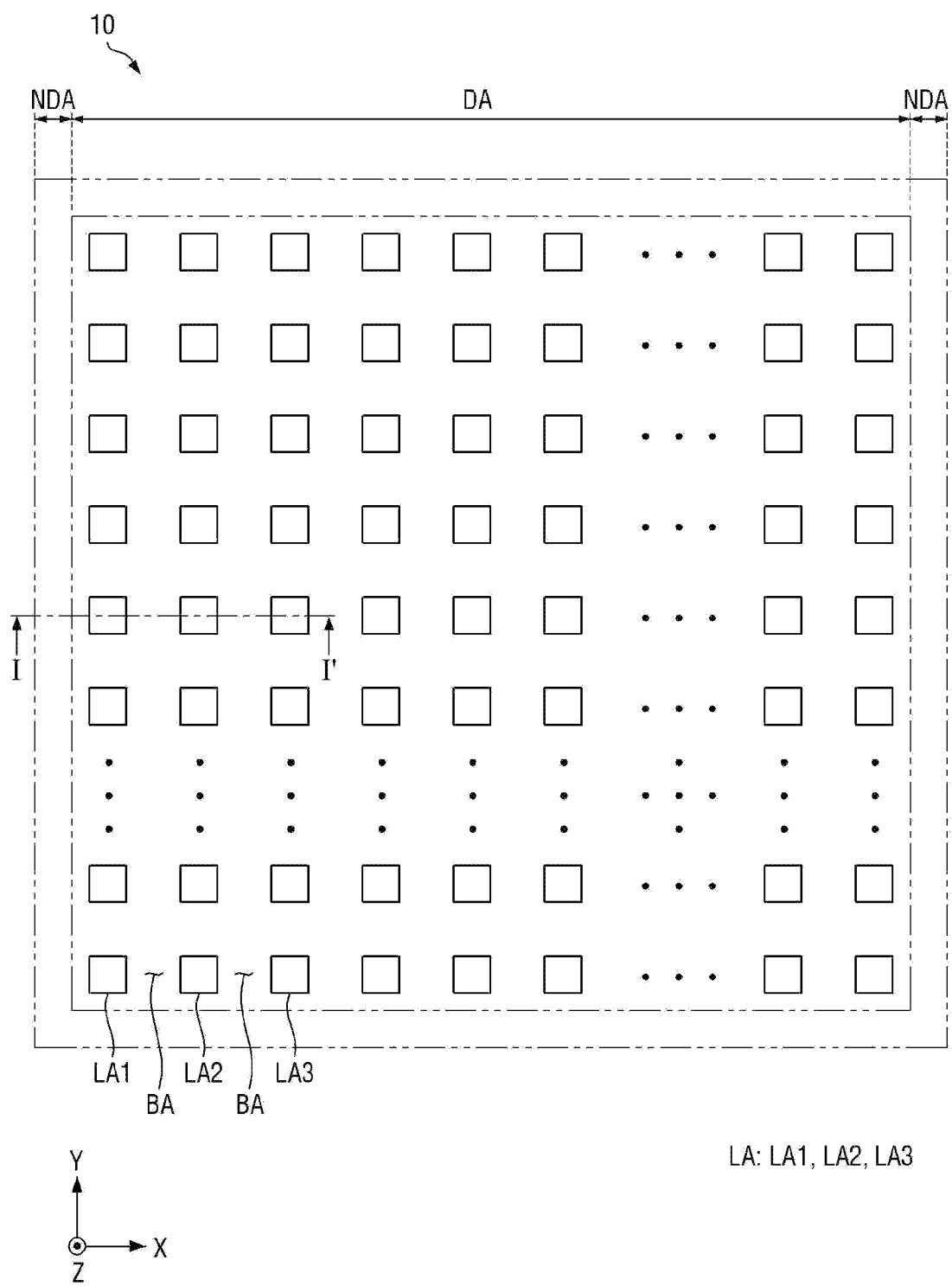
FIG. 2 is a plan view illustrating a display device according to one or more embodiments.

FIG. 2 is a plan view illustrating a display device according to one or more embodiments.

Referring to FIG. 2, the display device 10 may include a plurality of pixels arranged along a plurality of rows and columns in the display area DA. Each of the plurality of pixels may include an emission area LA defined by a pixel defining film or a bank, and may emit light having a peak wavelength (e.g., a predetermined peak wavelength) through the emission area LA. For example, the display area DA of the display device 10 may include first to third emission areas LA1, LA2, and LA3. Each of the first to third emission areas LA1, LA2, and LA3 may be an area in which light generated by a light emitting element of the display device 10 is emitted to the outside of the display device 10.

The first to third emission areas LA1, LA2, and LA3 may emit light having a peak wavelength (e.g., a predetermined peak wavelength) to the outside of the display device 10. The first emission area LA1 may emit light of a first color, the second emission area LA2 may emit light of a second color, and the third emission area LA3 may emit light of a third color. For example, the light of the first color may be red light having a peak wavelength in the range of 610 nm to 650 nm, the light of the second color may be green light having a peak wavelength in the range of 510 nm to 550 nm, and the light of the third color may be blue light having a peak wavelength in the range of 440 nm to 480 nm, but the present disclosure is not limited thereto.

The first to third emission areas LA1, LA2, and LA3 may be sequentially and repeatedly disposed along the first direction (X-axis direction) of the display area DA. As an example, an area of the first emission area LA1 may be greater than that of the second emission area LA2, and an area of the second emission area LA2 may be greater than that of the third emission area LA3. In one or more embodiments, an area of the first emission area LA1 may be greater than that of the second emission area LA2, and an area of the second emission area LA2 may be smaller than that of the third emission area LA3. As another example, an area of the first emission area LA1, an area of the second emission area LA2, and an area of the third emission area LA3 may be the same or substantially the same as each other.

The display area DA of the display device 10 may include light blocking areas BA surrounding a plurality of emission areas LA. The light blocking areas BA may prevent or substantially prevent color mixing of light emitted from the first to third emission areas LA1, LA2, and LA3.

Figure 3:
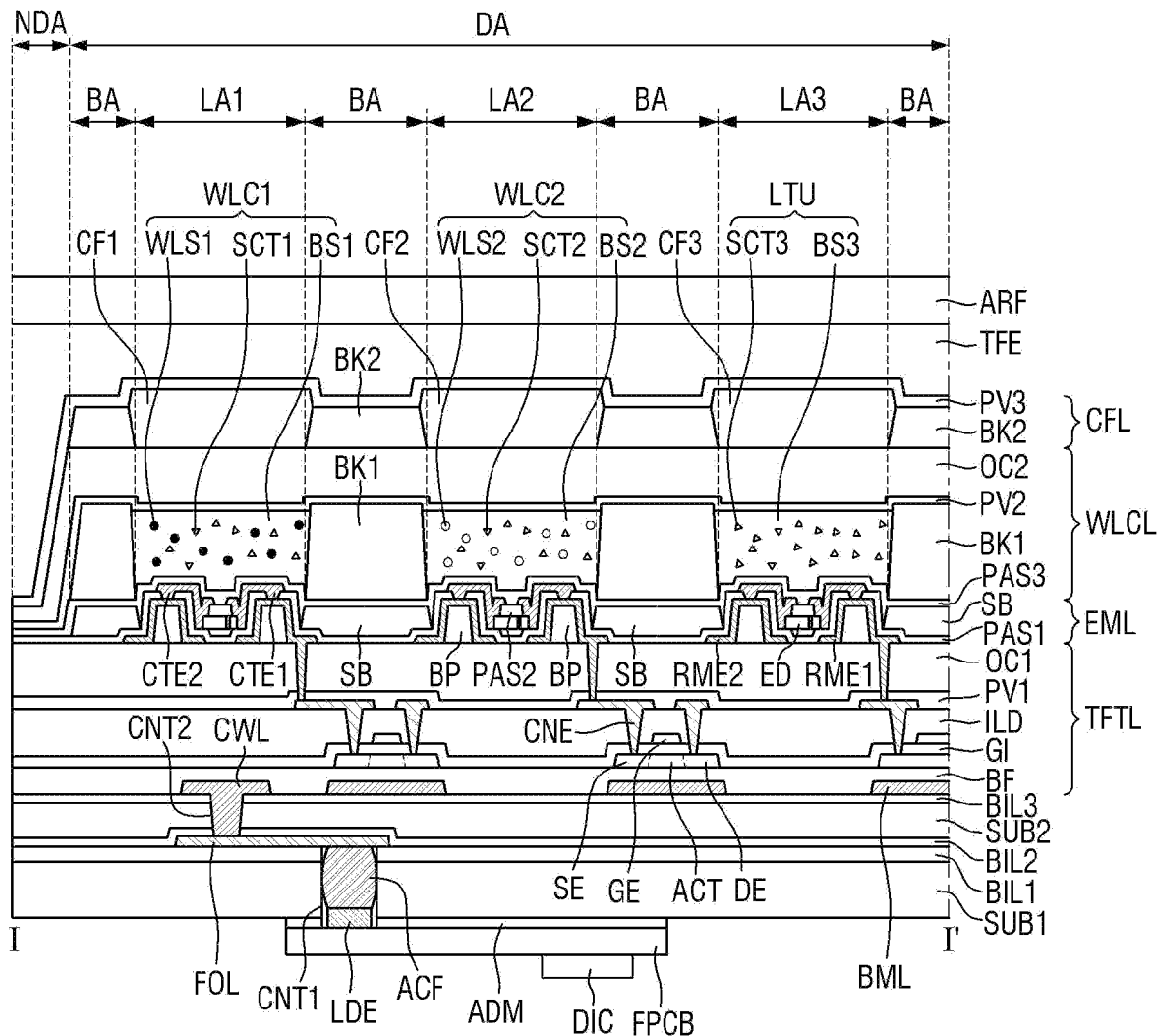
FIG. 3 is a cross-sectional view taken along the line I-I' of FIG. 2.

FIG. 3 is a cross-sectional view taken along the line I-I' of FIG. 2.

Referring to FIG. 3, the display area DA of the display device 10 may include first to third emission areas LA1, LA2, and LA3. Each of the first to third emission areas LA1, LA2, and LA3 may be an area in which light generated by a light emitting element ED of the display device 10 is emitted to the outside of the display device 10.

The display device 10 may include a first substrate SUB1, a first barrier insulating film BIL1, a fan-out line FOL, a second barrier insulating film BIL2, a second substrate SUB2, and a third barrier insulating film BIL3, a display layer DPL, an encapsulation layer TFE, an anti-reflection film ARF, a flexible film FPCB, a connection film ACF, and a display driver DIC.

The first substrate SUB1 may support the display device 10. The first substrate SUB1 may be a base substrate or a base member. The first substrate SUB1 may be a flexible substrate that may be bent, folded, or rolled. As an example, the first substrate SUB1 may include an insulating material such as a polymer resin, for example, polyimide PI, but is not limited thereto. As another example, the first substrate SUB1 may be a rigid substrate including a glass material.

The first barrier insulating film BIL1 may be disposed on the first substrate SUB1. The first barrier insulating film BIL1 may include an inorganic film capable of preventing or substantially preventing penetration of air and/or moisture. For example, the first barrier insulating film BIL1 may include at least one of a silicon nitride layer, a silicon oxynitride layer, a silicon oxide layer, a titanium oxide layer, an aluminum oxide layer, and an amorphous silicon layer, but is not limited thereto.

The first substrate SUB1 and the first barrier insulating film BIL1 may include a first contact hole CNT1. The first contact hole CNT1 may be etched from a lower surface of the first substrate SUB1 to penetrate up to an upper surface of the first barrier insulating film BIL1. In one or more embodiments, a width of a lower portion of the first contact hole CNT1 may be greater than a width of an upper portion of the first contact hole CNT1. In a process of manufacturing the display device 10, a lower surface of the fan-out line FOL may be exposed by the first contact hole CNT1, and the fan-out line FOL may be in contact with the connection film ACF inserted into the first contact hole CNT1.

The fan-out line FOL may be disposed in the display area DA on the first barrier insulating film BIL1. The display device 10 includes the fan-out line FOL disposed in the display area DA, such that an area of the non-display area NDA may be minimized or reduced. In one or more embodiments, the fan-out line FOL may be a single layer or multiple layers made of any one of molybdenum (Mo), aluminum (Al), chromium (Cr), gold (Au), titanium (Ti), nickel (Ni), neodymium (Nd), and copper (Cu), or alloys thereof.

The fan-out line FOL may electrically connect the flexible film FPCB and a connection line CWL to each other. The fan-out line FOL may be electrically connected to the flexible film FPCB through the connection film ACF. The fan-out line FOL may be electrically connected to a data line, a power line, or a gate line through the connection line CWL. The data line, the power line, or the gate line may be connected to a thin film transistor TFT of the pixel. Accordingly, the fan-out line FOL may supply an electrical signal received from the flexible film FPCB to the thin film transistor TFT of the pixel through the connection line CWL.

The second barrier insulating film BIL2 may be disposed on the first barrier insulating film BIL1 and the fan-out line FOL. The second barrier insulating film BIL2 may include an inorganic film capable of preventing or reducing penetration of air and/or moisture. For example, the second barrier insulating film BIL2 may include at least one of a silicon nitride layer, a silicon oxynitride layer, a silicon oxide layer, a titanium oxide layer, an aluminum oxide layer, and an amorphous silicon layer, but is not limited thereto.

The second substrate SUB2 may be disposed on the second barrier insulating film BIL2. The second substrate SUB2 may be a base substrate or a base member. The second substrate SUB2 may be a flexible substrate that may be bent, folded, or rolled. As an example, the second substrate SUB2 may include an insulating material such as a polymer resin, for example, polyimide PI, but is not limited thereto.

The third barrier insulating film BIL3 may be disposed on the second substrate SUB2. The third barrier insulating film BIL3 may include an inorganic film capable of preventing or reducing penetration of air and/or moisture. For example, the third barrier insulating film BIL3 may include at least one of a silicon nitride layer, a silicon oxynitride layer, a silicon oxide layer, a titanium oxide layer, an aluminum oxide layer, and an amorphous silicon layer, but is not limited thereto.

The third barrier insulating film BIL3, the second substrate SUB2, and the second barrier insulating film BIL2 may include a second contact hole CNT2. The second contact hole CNT2 may be etched from an upper surface of the third barrier insulating film BIL3 to penetrate up to a lower surface of the second barrier insulating film BIL2. In one or more embodiments, a width of an upper portion of the second contact hole CNT2 may be greater than a width of a lower portion of the second contact hole CNT2. In the process of manufacturing the display device 10, an upper surface of the fan-out line FOL may be exposed by the second contact hole CNT2, and the fan-out line FOL may be in contact with the connection line CWL inserted into the second contact hole CNT2.

The display layer DPL may be disposed on the third barrier insulating film BIL3. The display layer DPL may include a thin film transistor layer TFTL, a light emitting element layer EML, a wavelength conversion layer WLCL, and a color filter layer CFL. The thin film transistor layer TFTL may include a metal line BML, the connection line CWL, a buffer layer BF, a thin film transistor TFT, a gate insulating film GI, an interlayer insulating film ILD, a connection electrode CNE, a first passivation layer PV1, and a first planarization layer OC1.

The metal line BML may be disposed on the third barrier insulating film BIL3. The metal line BML may extend in the second direction (Y-axis direction) and be electrically connected to the thin film transistor TFT. For example, the metal line BML may be a data line or a power line, but is not limited thereto. The metal line BML may be formed as a single layer or multiple layers made of any one of molybdenum (Mo), aluminum (Al), chromium (Cr), gold (Au), silver (Ag), titanium (Ti), nickel (Ni), neodymium (Nd), and copper (Cu), or alloys thereof.

The connection line CWL may be disposed on the third barrier insulating film BIL3 so as to be spaced from the metal line BML. The connection line CWL may be formed of the same material as the metal line BML on or at the same layer as the metal line BML, but a material of the connection line CWL is not limited thereto. The connection line CWL may be inserted into the second contact hole CNT2 to be connected to the fan-out line FOL. As an example, the connection line CWL may be connected to a data line to supply a data voltage to the thin film transistor TFT. As another example, the connection line CWL may be connected to a power line to supply a source voltage to the thin film transistor TFT. As still another example, the connection line CWL may be connected to a gate line to supply a gate signal to the thin film transistor TFT. Accordingly, the connection line CWL may supply the electrical signal received from the fan-out line FOL to the thin film transistor TFT of the pixel.

The buffer layer BF may be disposed on the metal line BML, the connection line CWL, and the third barrier insulating film BIL3. The buffer layer BF may include an inorganic material capable of preventing or reducing permeation of air and/or moisture. In one or more embodiments, the buffer layer BF may include a plurality of inorganic films that are alternately stacked.

The thin film transistor TFT may be disposed on the buffer layer BF, and may constitute a pixel circuit of each of the plurality of pixels. For example, the thin film transistor TFT may be a driving transistor or a switching transistor of the pixel circuit. The thin film transistor TFT may include a semiconductor region ACT, a gate electrode GE, a drain electrode DE, and a source electrode SE.

The semiconductor region ACT, the drain electrode DE, and the source electrode SE may be disposed on the buffer layer BF. The semiconductor region ACT may overlap the gate electrode GE in a thickness direction (Z-axis direction) of the display device 10, and may be insulated from the gate electrode GE by the gate insulating film GI. The drain electrode DE and the source electrode SE may be provided by making a material of the semiconductor region ACT into conductors.

The gate electrode GE may be disposed on the gate insulating film GI. The gate electrode GE may overlap the semiconductor region ACT with the gate insulating film GI interposed therebetween.

The gate insulating film GI may be disposed on the semiconductor region ACT, the drain electrode DE, and the source electrode SE. For example, the gate insulating film GI may cover the semiconductor region ACT, the drain electrode DE, the source electrode SE, and the buffer layer BF, and may insulate the semiconductor region ACT and the gate electrode GE from each other. The gate insulating film GI may include a contact hole through which the connection electrode CNE penetrates.

The interlayer insulating film ILD may be disposed on the gate electrode GE. The connection electrode CNE may be connected to the source electrode SE of the thin film transistor TFT through the interlayer insulating film ILD. The interlayer insulating film ILD may include a contact hole through which the connection electrode CNE penetrates.

The connection electrode CNE may be disposed on the interlayer insulating film ILD. The connection electrode CNE may connect the source electrode SE of the thin film transistor TFT and a first electrode RME1 to each other. The connection electrode CNE may be in contact with the source electrode SE through the contact holes provided in the interlayer insulating film ILD and the gate insulating film GI.

The first passivation layer PV1 may be disposed on the connection electrode CNE and the interlayer insulating film ILD. The first passivation layer PV1 may protect the thin film transistor TFT. The first passivation layer PV1 may include a contact hole through which the first electrode RME1 penetrates.

The first planarization layer OC1 may be provided on the first passivation layer PV1 to planarize an upper end of the thin film transistor layer TFTL. For example, the first planarization layer OC1 may include a contact hole through which the first electrode RME1 penetrates. Here, the contact hole of the first planarization layer OC1 may be connected to the contact hole of the first passivation layer PV1. The first planarization layer OC1 may include an organic insulating material such as polyimide (PI).

The light emitting element layer EML may be disposed on the thin film transistor layer TFTL. The light emitting element layer EML may include protrusion patterns BP, the first electrode RME1, a second electrode RME2, a first insulating film PAS1, a sub-bank SB, light emitting elements ED, a second insulating film PAS2, a first contact electrode CTE1, a second contact electrode CTE2, and a third insulating film PAS3.

The protrusion patterns BP may be disposed on the first planarization layer OC1. The protrusion patterns BP may protrude from an upper surface of the first planarization layer OC1. A plurality of protrusion patterns BP may be disposed in emission areas LA or opening areas of each of the plurality of pixels. A plurality of light emitting elements ED may be disposed between the plurality of protrusion patterns BP. The protrusion patterns BP may have inclined side surfaces, and light emitted from the plurality of light emitting elements ED may be reflected by the first and second electrodes RME1 and RME2 disposed on the protrusion patterns BP. In one or more embodiments, the protrusion pattern BP may include an organic insulating material such as polyimide PI.

The first electrode RME1 may be disposed on the first planarization layer OC1 and the protrusion pattern BP. The first electrode RME1 may be disposed on the protrusion pattern BP disposed on one side of the plurality of light emitting elements ED. The first electrode RME1 may be disposed on the inclined side surfaces of the protrusion pattern BP to reflect the light emitted from the light emitting elements ED. The first electrode RME1 may be inserted into the contact holes provided in the first planarization layer OC1 and the first passivation layer PV1 to be connected to the connection electrode CNE. The first electrode RME1 may be electrically connected to one end of the light emitting element ED through the first contact electrode CTE1. In this case, the first electrode RME1 may receive a voltage proportional to luminance of the light emitting element ED from the thin film transistor TFT of the pixel.

The second electrode RME2 may be disposed on the first planarization layer OC1 and the protrusion pattern BP. The second electrode RME2 may be disposed on the protrusion pattern BP disposed on the other sides of the plurality of light emitting elements ED. The second electrode RME2 may be disposed on the inclined side surfaces of the protrusion pattern BP to reflect the light emitted from the light emitting elements ED. The second electrode RME2 may be electrically connected to the other end of the light emitting element ED through the second contact electrode CTE2. In this case, the second electrode RME2 may receive a low potential voltage supplied to all pixels from a low potential line.

The first and second electrodes RME1 and RME2 may include a conductive material having high reflectivity. As an example, the first and second electrodes RME1 and RME2 may include at least one of silver (Ag), copper (Cu), aluminum (Al), nickel (Ni), and lanthanum (La). As another example, the first and second electrodes RME1 and RME2 may include a material such as indium tin oxide (ITO), indium zinc oxide (IZO), or indium tin zinc oxide (ITZO). As still another example, the first and second electrodes RME1 and RME2 may include a plurality of layers having a transparent conductive material layer and a metal layer having high reflectivity or include a single layer including a transparent conductive material and a metal having high reflectivity. The first and second electrodes RME1 and RME2 may have a stacked structure such as ITO/Ag/ITO, ITO/Ag/IZO, or ITO/Ag/ITZO/IZO.

The first insulating film PAS1 may be disposed on the first planarization layer OC1 and the first and second electrodes RME1 and RME2. The first insulating film PAS1 may insulate the first and second electrodes RME1 and RME2 from each other while protecting the first and second electrodes RME1 and RME2. The first insulating film PAS1 may prevent or substantially prevent the light emitting elements ED from being in direct contact with and damaged by the first and second electrodes RME1 and RME2 in a process of aligning the light emitting elements ED.

The sub-bank SB may be disposed in the light blocking areas BA on the first insulating film PAS1. The sub-bank SB may be disposed at boundaries between the plurality of pixels to divide the light emitting elements ED of each of the plurality of pixels. The sub-bank SB may have a height (e.g., a predetermined height) and may include an organic insulating material such as polyimide PI.

The plurality of light emitting elements ED may be disposed on the first insulating film PAS1. The plurality of light emitting elements ED may be aligned in parallel with each other between the first and second electrodes RME1 and RME2. A length of the light emitting element ED may be greater than a length between the first and second electrodes RME1 and RME2. The light emitting element ED may include a plurality of semiconductor layers, and one end of the light emitting element ED and the other end of the light emitting element ED opposite to the one end may be defined on the basis of any one semiconductor layer. One end of the light emitting element ED may be disposed on the first electrode RME1, and the other end of the light emitting element ED may be disposed on the second electrode RME2. One end of the light emitting element ED may be electrically connected to the first electrode RME1 through the first contact electrode CTE1, and the other end of the light emitting element ED may be electrically connected to the second electrode RME2 through the second contact electrode CTE2.

The light emitting elements ED may have a size of a micrometer or a nanometer unit, and may be inorganic light emitting diodes including an inorganic material. The inorganic light emitting diodes may be aligned between the first and second electrodes RME1 and RME2 according to an electric field formed in a specific direction between the first and second electrodes RME1 and RME2 facing each other.

In one or more embodiments, the plurality of light emitting elements ED may include active layers having the same material to emit light of the same wavelength band or light of the same color. Light emitted from each of the first to third emission areas LA1, LA2, and LA3 of the light emitting element layer EML may have the same color. For example, the plurality of light emitting elements ED may emit light of a third color or blue light having a peak wavelength in the range of 440 nm to 480 nm, but is not limited thereto.

The second insulating film PAS2 may be disposed on the plurality of light emitting elements ED. For example, the second insulating film PAS2 may partially surround the plurality of light emitting elements ED and may not cover both ends of each of the plurality of light emitting elements ED. The second insulating film PAS2 may protect the plurality of light emitting elements ED and may fix the plurality of light emitting elements ED in the process of manufacturing the display device 10. The second insulating film PAS2 may fill spaces between the light emitting elements ED and the first insulating film PAS1.

The first contact electrode CTE1 may be disposed on the first insulating film PAS1, and may be inserted into a contact hole provided in the first insulating film PAS1 to be connected to the first electrode RME1. For example, the contact hole of the first insulating film PAS1 may be provided on the protrusion pattern BP, but is not limited thereto. One end of the first contact electrode CTE1 may be connected to the first electrode RME1 on the protrusion pattern BP, and the other end of the first contact electrode CTE1 may be connected to one end of the light emitting element ED.

The second contact electrode CTE2 may be disposed on the first insulating film PAS1, and may be inserted into a contact hole provided in the first insulating film PAS1 to be connected to the second electrode RME2. For example, the contact hole of the first insulating film PAS1 may be provided on the protrusion pattern BP, but is not limited thereto. One end of the second contact electrode CTE2 may be connected to the other end of the light emitting element ED, and the other end of the second contact electrode CTE2 may be connected to the second electrode RME2 on the protrusion pattern BP.

The third insulating film PAS3 may be disposed on the first and second contact electrodes CTE1 and CTE2, the sub-bank SB, and the first and second insulating films PAS1 and PAS2. The third insulating film PAS3 may be disposed at an upper end of the light emitting element layer EML to protect the light emitting element layer EML.

The wavelength conversion layer WLCL may be disposed on the light emitting element layer EML. The wavelength conversion layer WLCL may include a first light blocking member BK1, a first wavelength conversion part WLC1, a second wavelength conversion part WLC2, a light transmission part LTU, a second passivation layer PV2, and a second planarization layer OC2.

The first light blocking member BK1 may be disposed in the light blocking areas BA on the third insulating film PAS3. The first light blocking member BK1 may overlap the sub-bank SB in the thickness direction (Z-axis direction) of the display device 10. The first light blocking member BK1 may block transmission of light. The first light blocking member BK1 may prevent or substantially prevent the light from permeating between the first to third emission areas LA1, LA2, and LA3 and mixing colors with each other to improve a color reproduction rate of the display device 10. The first light blocking member BK1 may be disposed in a lattice shape surrounding the first to third emission areas LA1, LA2, and LA3 in a plan view.

The first wavelength conversion part WLC1 may be disposed in the first emission area LA1 on the third insulating film PAS3. The first wavelength conversion part WLC1 may be surrounded by the first light blocking member BK1. The first wavelength conversion part WLC1 may include a first base resin BS1, first scatterers SCT1, and first wavelength shifters WLS1.

The first base resin BS1 may include a material having a relatively high light transmittance. The first base resin BS1 may be made of a transparent organic material. For example, the first base resin BS1 may include at least one of organic materials such as an epoxy-based resin, an acrylic resin, a cardo-based resin, and an imide-based resin.

The first scatterer SCT1 may have a refractive index different from that of the first base resin BS1, and may form an optical interface with the first base resin BS1. The first scatterer SCT1 may include a light scattering material or a light scattering particle to scatter at least a portion of transmitted light. For example, the first scatterer SCT1 may include a metal oxide such as titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$) or include an organic particle such as an acrylic resin or a urethane-based resin. The first scatterer SCT1 may scatter light in a random direction regardless of an incident direction of incident light without substantially converting a peak wavelength of the incident light.

The first wavelength shifter WLS1 may convert or shift the peak wavelength of the incident light to a first peak wavelength. For example, the first wavelength shifter WLS1 may convert the blue light provided from the display device 10 into red light having a single peak wavelength in the range of 610 nm to 650 nm and emit the red light. The first wavelength shifter WLS1 may be a quantum dot, a quantum rod, or a phosphor. The quantum dot may be a particulate matter emitting light having a specific color while electrons are transitioning from a conduction band to a valence band.

A portion of the blue light provided from the light emitting element layer EML may be transmitted through the first wavelength conversion part WLC1 without being converted into red light by the first wavelength shifter WLS1. Light incident on a first color filter CF1 without being converted by the first wavelength conversion part WLC1 from among the blue light provided from the light emitting element layer EML may be blocked by the first color filter CF1. In addition, the red light converted by the first wavelength conversion part WLC1 from among the blue light provided from the light emitting element layer EML may be transmitted through the first color filter CF1 and then emitted to the outside. Accordingly, the first emission area LA1 may emit the red light.

The second wavelength conversion part WLC2 may be disposed in the second emission area LA2 on the third insulating film PAS3. The second wavelength conversion part WLC2 may be surrounded by the first light blocking member BK1. The second wavelength conversion part WLC2 may include a second base resin BS2, second scatterers SCT2, and second wavelength shifters WLS2.

The second base resin BS2 may include a material having a relatively high light transmittance. The second base resin BS2 may be made of a transparent organic material. For example, the second base resin BS2 may be made of the same material as the first base resin BS1 or be made of the material exemplified in the first base resin BS1.

The second scatterer SCT2 may have a refractive index different from that of the second base resin BS2, and may form an optical interface with the second base resin BS2. The second scatterer SCT2 may include a light scattering material or a light scattering particle to scatter at least a portion of transmitted light. For example, the second scatterer SCT2 may be made of the same material as the first scatterer SCT1 or be made of the material exemplified in the first scatterer SCT1.

The second wavelength shifter WLS2 may convert or shift the peak wavelength of the incident light to a second peak wavelength different from the first peak wavelength of the first wavelength shifter WLS1. For example, the second wavelength shifter WLS2 may convert the blue light provided from the display device 10 into green light having a single peak wavelength in the range of 510 nm to 550 nm and emit the green light. The second wavelength shifter WLS2 may be a quantum dot, a quantum rod, or a phosphor. The second wavelength shifter WLS2 may include the material exemplified in the first wavelength shifter WLS1. The second wavelength shifter WLS2 may be made of the quantum dot, the quantum rod, or the phosphor such that a wavelength conversion range of the second wavelength shifter WLS2 is different from a wavelength conversion range of the first wavelength shifter WLS1.

The light transmission part LTU may be disposed in the third emission area LA3 on the third insulating film PAS3. The light transmission part LTU may be surrounded by the first light blocking member BK1. The light transmission part LTU may transmit incident light therethrough while maintaining a peak wavelength of the incident light. The light transmission part LTU may include a third base resin BS3 and third scatterers SCT3.

The third base resin BS3 may include a material having a relatively high light transmittance. The third base resin BS3 may be made of a transparent organic material. For example, the third base resin BS3 may be made of the same material as the first or second base resin BS1 or BS2 or be made of the material exemplified in the first base resin BS1.

The third scatterer SCT3 may have a refractive index different from that of the third base resin BS3, and may form an optical interface with the third base resin BS3. The third scatterer SCT3 may include a light scattering material or a light scattering particle to scatter at least a portion of transmitted light. For example, the third scatterer SCT3 may be made of the same material as the first or second scatterer SCT1 or SCT2 or be made of the material exemplified in the first scatterer SCT1.

Because the wavelength conversion layer WLCL is disposed on (e.g., directly disposed on) the third insulating film PAS3 of the light emitting element layer EML, the display device 10 may not require a separate substrate for the first and second wavelength conversion parts WLC1 and WLC2 and the light transmission part LTU. Accordingly, the first and second wavelength conversion parts WLC1 and WLC2 and the light transmission part LTU may be aligned (e.g., easily aligned) in the first to third emission areas LA1, LA2, and LA3, respectively, and a thickness of the display device 10 may be relatively reduced.

The second passivation layer PV2 may cover the first and second wavelength conversion parts WLC1 and WLC2, the light transmission part LTU, and the first light blocking member BK1. For example, the second passivation layer PV2 may seal the first and second wavelength conversion parts WLC1 and WLC2 and the light transmission part LTU to prevent or reduce damage to or contamination of the first and second wavelength conversion parts WLC1 and WLC2 and the light transmission part LTU. In one or more embodiments, the second passivation layer PV2 may include an inorganic material.

The second planarization layer OC2 may be disposed on the second passivation layer PV2 to planarize upper ends of the first and second wavelength conversion parts WLC1 and WLC2 and the light transmission part LTU. In one or more embodiments, the second planarization layer OC2 may include an organic insulating material such as polyimide (PI).

The color filter layer CFL may be disposed on the wavelength conversion layer WLCL. The color filter layer CFL may include a second light blocking member BK2, first to third color filters CF1, CF2, and CF3, and a third passivation layer PV3.

The second light blocking member BK2 may be disposed in the light blocking areas BA on the second planarization layer OC2 of the wavelength conversion layer WLCL. The second light blocking member BK2 may overlap the first light blocking member BK1 or the sub-bank SB in the thickness direction (Z-axis direction) of the display device 10. The second light blocking member BK2 may block transmission of light. The second light blocking member BK2 may prevent or substantially prevent the light from permeating between the first to third emission areas LA1, LA2, and LA3 and mixing colors with each other to improve a color reproduction rate of the display device 10. The second light blocking member BK2 may be disposed in a lattice shape surrounding the first to third emission areas LA1, LA2, and LA3 in a plan view.

The first color filter CF1 may be disposed in the first emission area LA1 on the second planarization layer OC2. The first color filter CF1 may be surrounded by the second light blocking member BK2. The first color filter CF1 may overlap the first wavelength conversion part WLC1 in the thickness direction (Z-axis direction) of the display device 10. The first color filter CF1 may transmit (e.g., selectively transmit) light of a first color (e.g., red light) and block or absorb light of a second color (e.g., green light) and light of a third color (e.g., blue light). For example, the first color filter CF1 may be a red color filter and include a red colorant.

The second color filter CF2 may be disposed in the second emission area LA2 on the second planarization layer OC2. The second color filter CF2 may be surrounded by the second light blocking member BK2. The second color filter CF2 may overlap the second wavelength conversion part WLC2 in the thickness direction (Z-axis direction) of the display device 10. The second color filter CF2 may transmit (e.g., selectively transmit) the light of the second color (e.g., the green light) and block or absorb the light of the first color (e.g., the red light) and the light of the third color (e.g., the blue light). For example, the second color filter CF2 may be a green color filter and include a green colorant.

The third color filter CF3 may be disposed in the third emission area LA3 on the second planarization layer OC2. The third color filter CF3 may be surrounded by the second light blocking member BK2. The third color filter CF3 may overlap the light transmission part LTU in the thickness direction (Z-axis direction) of the display device 10. The third color filter CF3 may transmit (e.g., selectively transmit) the light of the third color (e.g., the blue light) and block or absorb the light of the first color (e.g., the red light) and the light of the second color (e.g., the green light). For example, the third color filter CF3 may be a blue color filter and include a blue colorant.

The first to third color filters CF1, CF2, and CF3 may absorb a portion of light introduced from the outside of the display device 10 to reduce reflected light due to external light. Therefore, the first to third color filters CF1, CF2, and CF3 may prevent or reduce distortion of colors due to external light reflection.

Because the first to third color filters CF1, CF2, and CF3 are disposed on (e.g., directly disposed on) the second planarization layer OC2 of the wavelength conversion layer WLCL, the display device 10 may not require a separate substrate for the first to third color filters CF1, CF2, and CF3. Accordingly, a thickness of the display device 10 may be relatively reduced.

The third passivation layer PV3 may cover the first to third color filters CF1, CF2, and CF3. The third passivation layer PV3 may protect the first to third color filters CF1, CF2, and CF3.

The encapsulation layer TFE may be disposed on the third passivation layer PV3 of the color filter layer CFL. The encapsulation layer TFE may cover an upper surface and side surfaces of the display layer DPL. For example, the encapsulation layer TFE may include at least one inorganic film to prevent or reduce permeation of oxygen or moisture. In addition, the encapsulation layer TFE may include at least one organic film to protect the display device 10 from foreign matters such as dust.

The anti-reflection film ARF may be disposed on the encapsulation layer TFE. The anti-reflection film ARF may prevent or reduce reflection of external light to suppress or reduce a decrease in visibility due to the reflection of the external light. The anti-reflection film ARF may protect an upper surface of the display device 10. In one or more embodiments, the anti-reflection film ARF may be omitted. As another example, the anti-reflection film (ARF) may be replaced with a polarizing film.

The flexible film FPCB may be disposed under the first substrate SUB1. The flexible film FPCB may be attached to a lower surface of the first substrate SUB1 using an adhesive member ADM. Optionally, the adhesive member ADM may be omitted. One side of the flexible film FPCB may be adjacent to the first contact hole CNT1. The flexible film FPCB may include a lead electrode LDE disposed on one side of an upper surface thereof. At least a portion of the lead electrode LDE may be inserted into the first contact hole CNT1. The flexible film FPCB may support the display driver DIC disposed on the other side of a lower surface thereof. The lead electrode LDE may be electrically connected to the display driver DIC through a lead line disposed on the lower surface of the flexible film FPCB. The lead electrode LDE may be electrically connected to the fan-out line FOL through the connection film ACF. The other side of the flexible film FPCB may be connected to a source circuit board under the first substrate SUB1. The flexible film FPCB may transmit a signal of the display driver DIC to the display device 10.

The connection film ACF may attach the lead electrode LDE of the flexible film FPCB to the lower surface of the fan-out line FOL. One surface of the connection film ACF may be attached to the fan-out line FOL, and the other surface of the connection film ACF may be attached to the lead electrode LDE. For example, the connection film ACF may include an anisotropic conductive film. When the connection film ACF includes the anisotropic conductive film, the connection film ACF may have conductivity in regions with which the fan-out line FOL and the lead electrode LDE are in contact, and may electrically connect the flexible film FPCB to the fan-out line FOL.

The display driver DIC may be an integrated circuit (IC). As an example, the display driver DIC may convert digital video data into an analog data voltage based on a data control signal of a timing controller, and may supply the analog data voltage to the data line of the display area DA through the flexible film FPCB. As another example, the display driver DIC may generate a gate signal based on the gate control signal of the timing controller and may supply the gate signal to the gate line of the display area DA through the flexible film FPCB. The display device 10 includes the fan-out line FOL disposed on the first substrate SUB1 and the flexible film FPCB disposed under the first substrate SUB1, such that an area of the non-display area NDA may be minimized or reduced.

Figure 4:
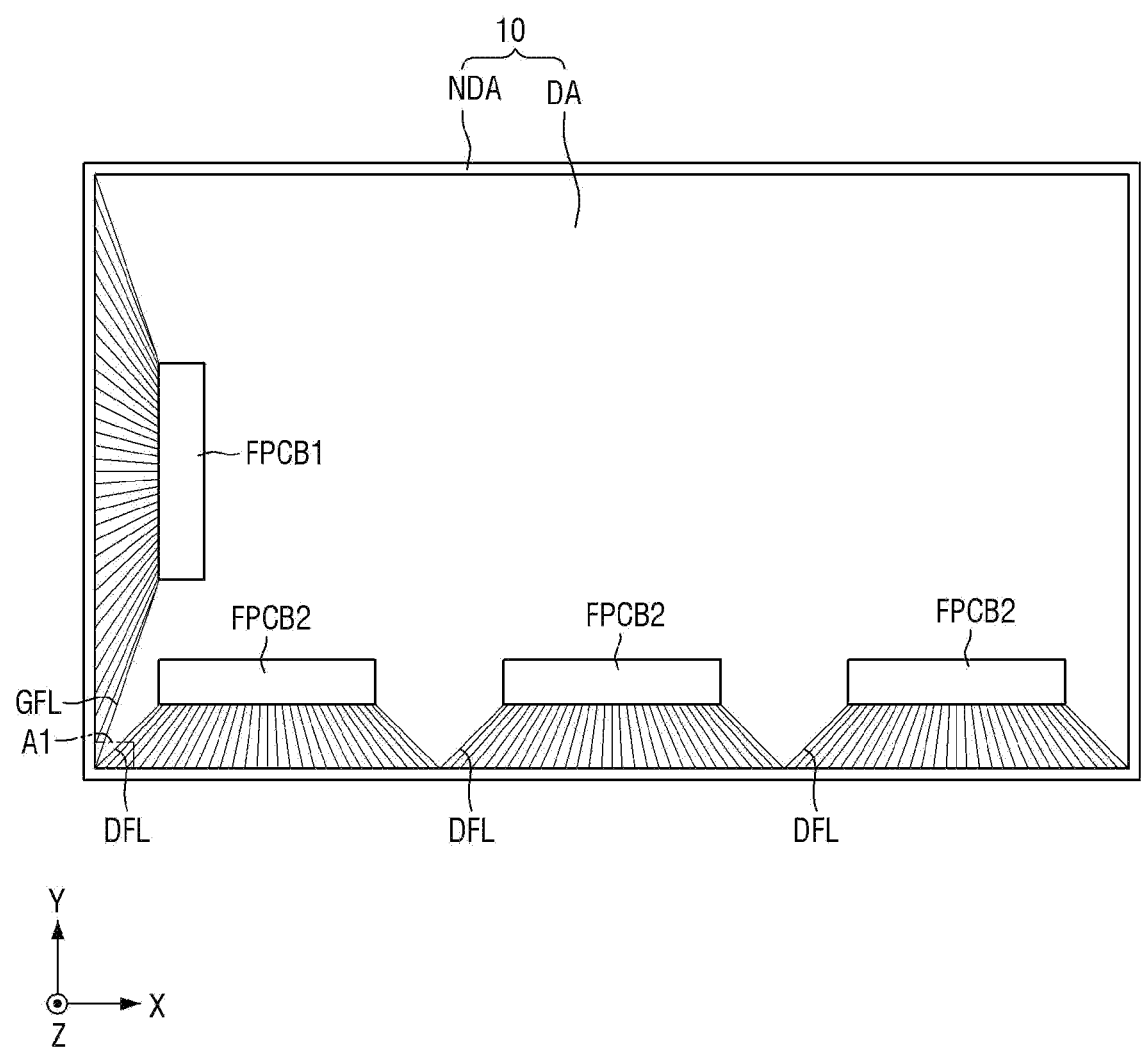
FIG. 4 is a plan view illustrating a first flexible film, a second flexible film, gate fan-out lines, and data fan-out lines in the display device according to one or more embodiments.

FIG. 4 is a plan view illustrating a first flexible film, a second flexible film, gate fan-out lines, and data fan-out lines in the display device according to one or more embodiments.

Referring to FIG. 4, the display device 10 may include a first flexible film FPCB1, a second flexible film FPCB2, a plurality of gate fan-out lines GFL, and a plurality of data fan-out lines DFL.

The first flexible film FPCB1 may be disposed on one side (e.g., the left side) of the display area DA. The gate fan-out lines GFL may be disposed at an edge of one side (e.g., an edge of the left side) of the display area DA and be connected to the first flexible film FPCB1. The first flexible film FPCB1 may be disposed under the first substrate SUB1 and may be connected to the gate fan-out lines GFL through the connection film ACF. For example, the first flexible film FPCB1 may supply gate signals received from a gate driver to the gate lines of the display area DA through the gate fan-out lines GFL.

The second flexible film FPCB2 may be disposed on the other side (e.g., the lower side) of the display area DA perpendicular to one side of the display area DA. The data fan-out lines DFL may be disposed at an edge of the other side (e.g., an edge of the lower side) of the display area DA and be connected to the second flexible film FPCB2. The second flexible film FPCB2 may be disposed under the first substrate SUB1 and may be connected to the data fan-out lines DFL through the connection film ACF. As an example, the second flexible film FPCB2 may supply data voltages received from a data driver to the data lines of the display area DA through the data fan-out lines DFL. As another example, the second flexible film FPCB2 may supply source voltages to the power lines of the display area DA through the data fan-out lines DFL. A plurality of second flexible films FPCB2 may be formed according to a size of the display device 10 or the number of pixels, but the number of second flexible films FPCB2 is not limited to that illustrated in FIG. 4.

The display device 10 includes the first and second flexible films FPCB1 and FPCB2 disposed under the first substrate SUB1 and the gate fan-out lines GFL and the data fan-out lines disposed in the display area DA, such that the area of the non-display area NDA may be minimized or reduced.

Figure 5:
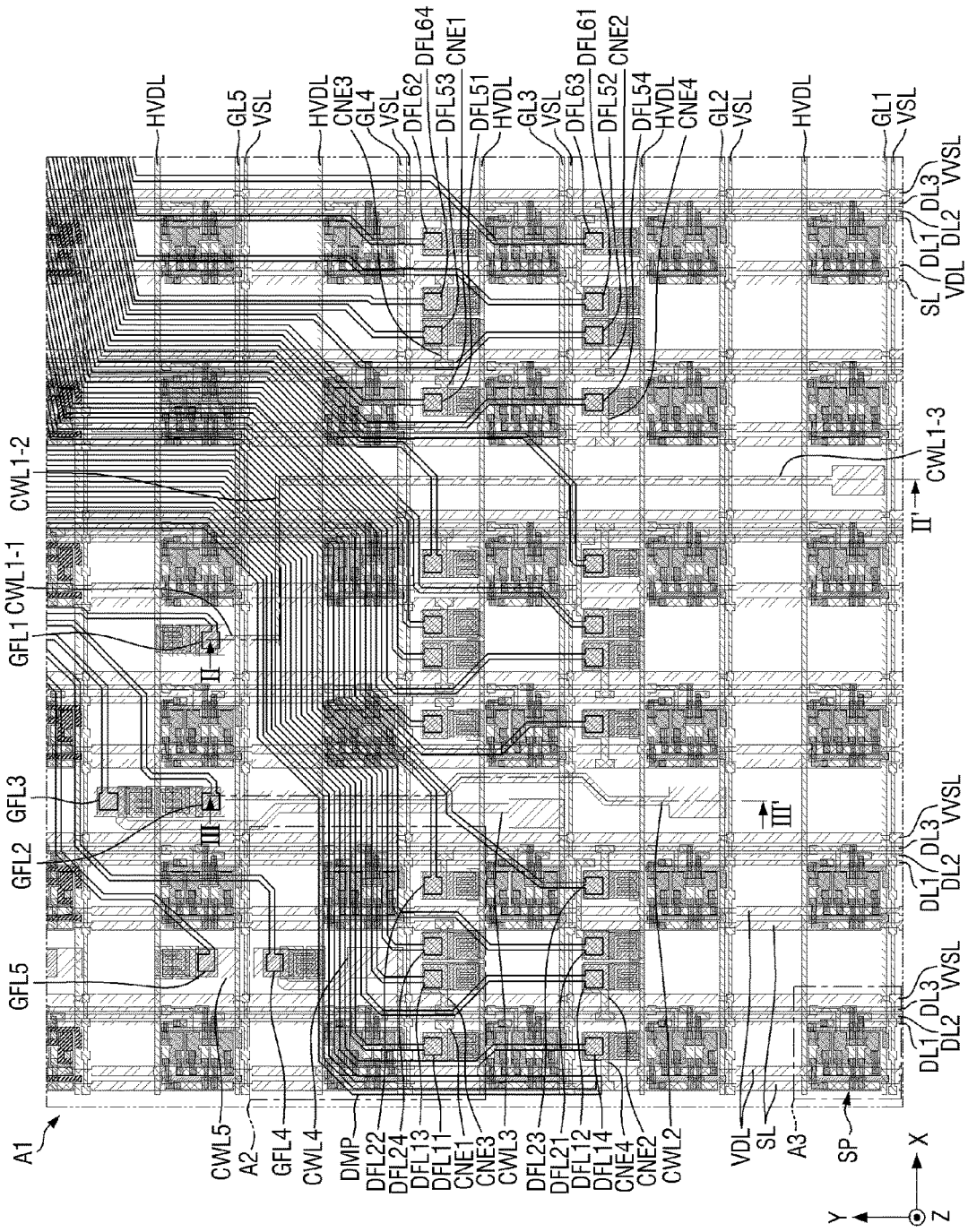
FIG. 5 is an enlarged view illustrating an example of area A1 of FIG. 4.
Figure 6:
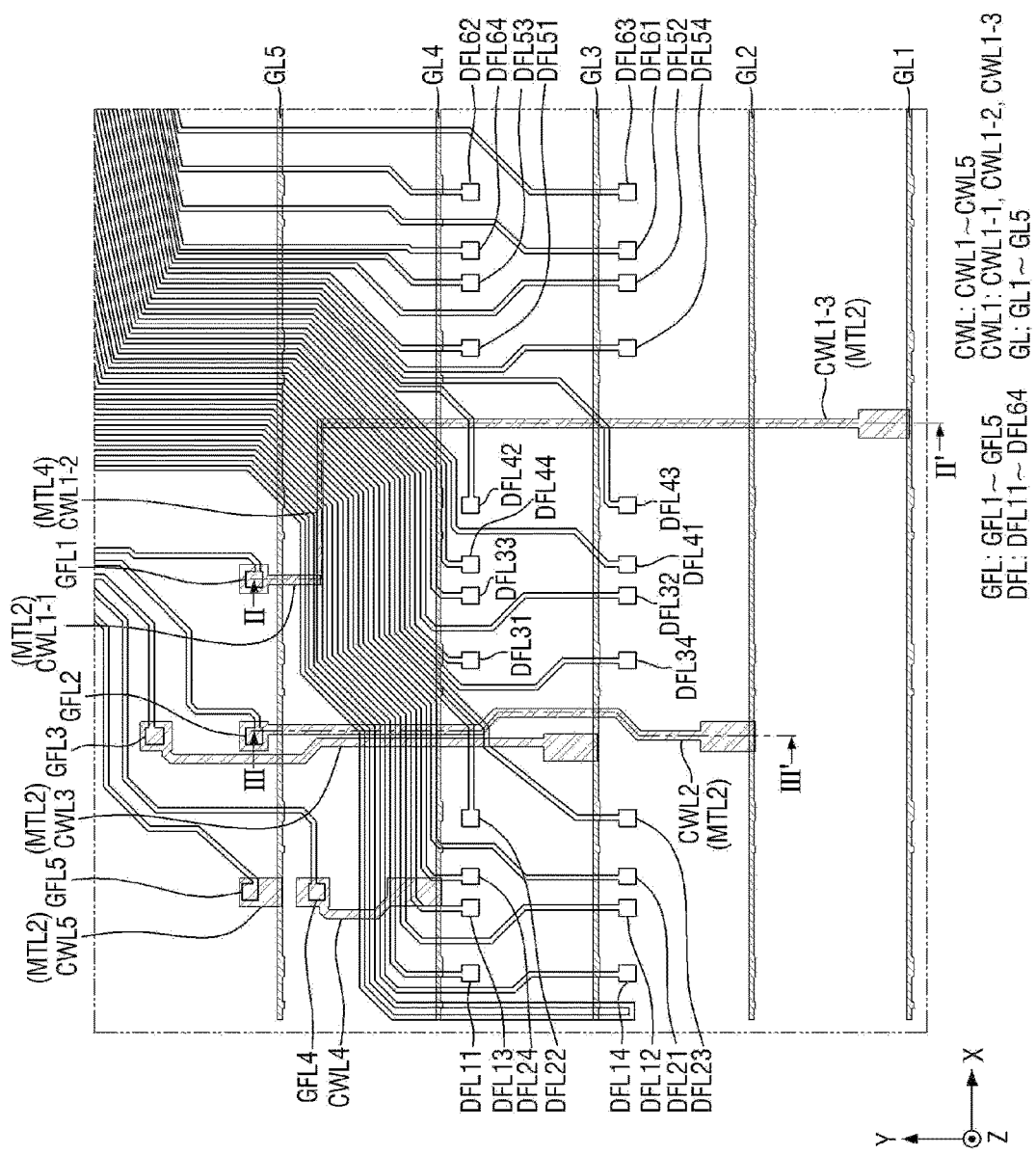
FIG. 6 is a view illustrating gate fan-out lines, data fan-out lines, connection lines, and gate lines in the display device of FIG. 5.
Figure 7:
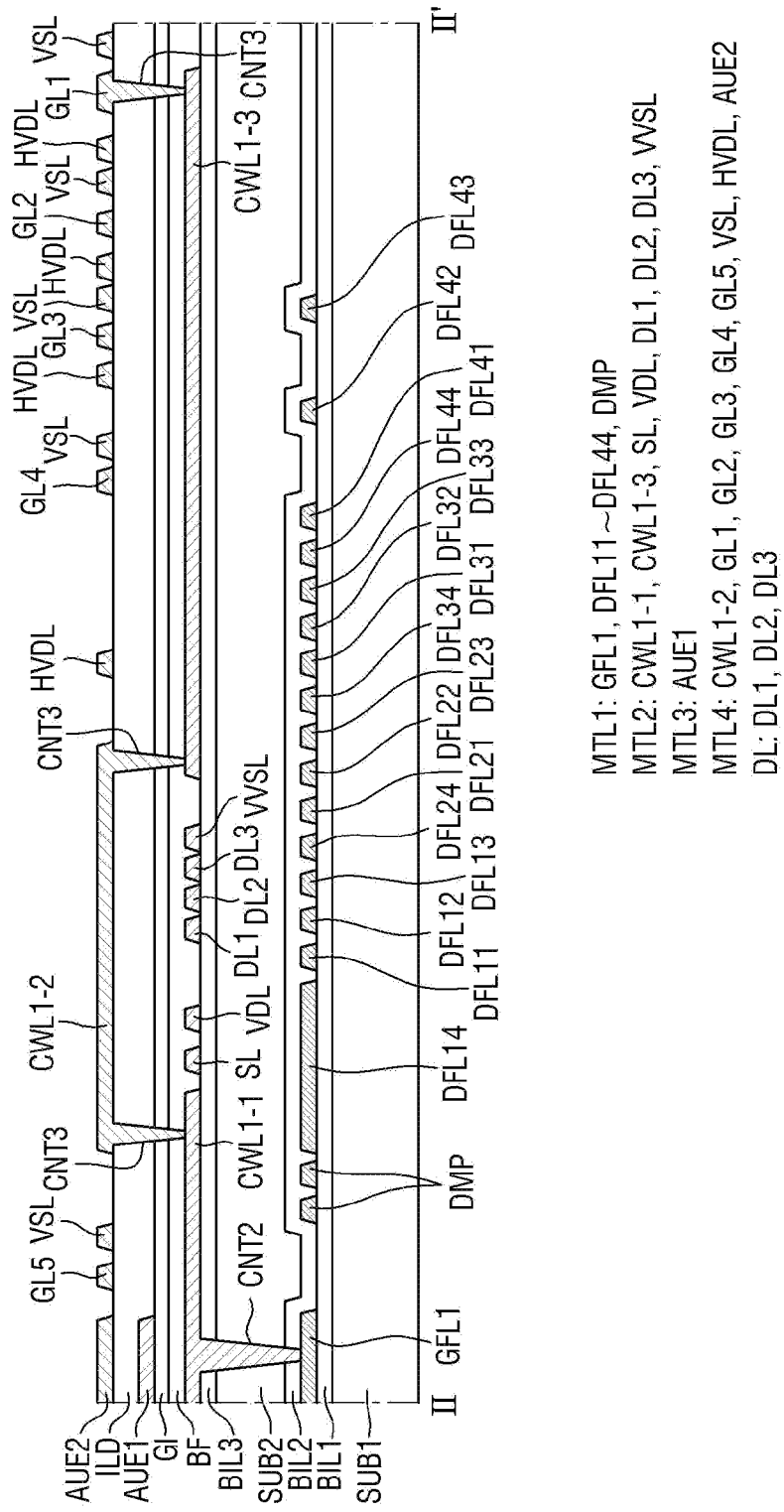
FIG. 7 is a cross-sectional view taken along the line II-II' of FIG. 5.
Figure 8:
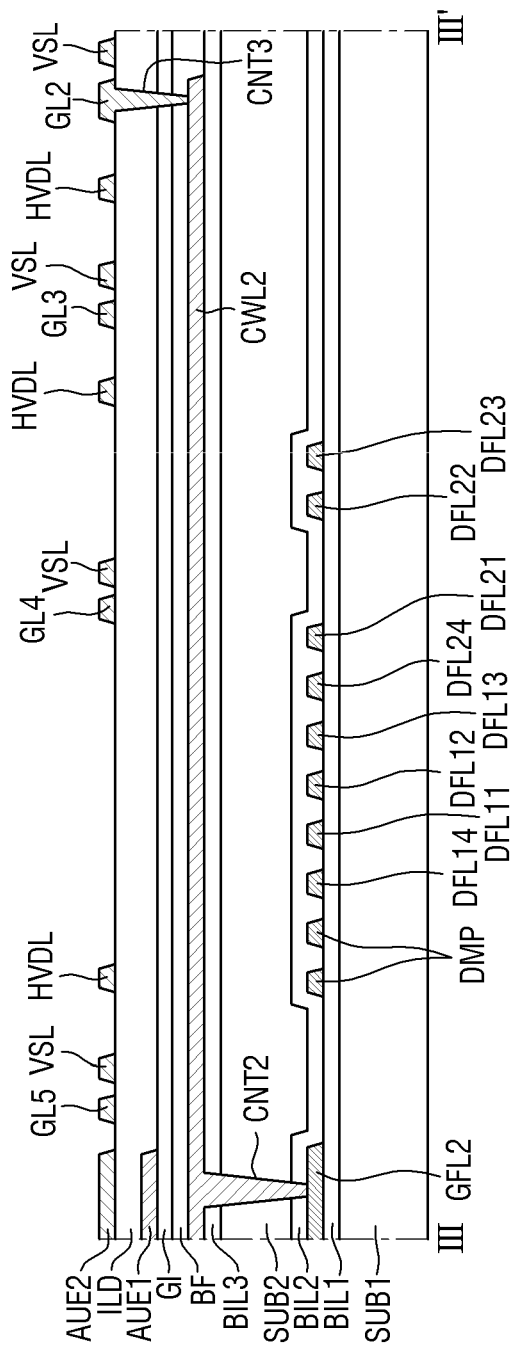
FIG. 8 is a cross-sectional view taken along the line III-III' of FIG. 5.

FIG. 5 is an enlarged view illustrating an example of area A1 of FIG. 4, and FIG. 6 is a view illustrating gate fan-out lines, data fan-out lines, connection lines, and gate lines in the display device of FIG. 5. FIG. 7 is a cross-sectional view taken along the line II-II' of FIG. 5, and FIG. 8 is a cross-sectional view taken along the line III-III' of FIG. 5.

Referring to FIGS. 5 to 8, the display device 10 may include a plurality of pixels SP, a plurality of gate lines GL, a plurality of first to third data lines DL1, DL2, and DL3, a plurality of vertical voltage lines VVSL, a plurality of first voltage lines VDL, a plurality of sensing lines SL, a plurality of horizontal voltage lines HVDL, a plurality of second voltage lines VSL, a plurality of gate fan-out lines GFL, first to fifth connection lines CWL1, CWL2, CWL3, CWL4, and CWL5, a plurality of data fan-out lines DFL, first to fourth connection electrodes CNE1, CNE2, CNE3, and CNE4, and dummy patterns DMP.

Each of the plurality of pixels SP may be formed in each of pixel areas defined by the first to third data lines DL1, DL2, and DL3 and the plurality of gate lines GL crossing each other. Each of the plurality of pixels SP may be connected to the gate line GL, the data line DL, the first voltage line VDL, the second voltage line VSL, and the sensing line SL. Each of the plurality of pixels SP may be defined as an area of a minimum unit outputting light.

The plurality of gate lines GL may extend in the first direction (X-axis direction) and may be spaced from each other in the second direction (Y-axis direction). The plurality of gate lines GL may include first to fifth gate lines GL1, GL2, GL3, GL4, and GL5. The first gate line GL1 may be arranged along a first pixel row arranged at the lowermost side of the display area DA. Each of the second to fifth gate lines GL2, GL3, GL4, and GL5 may be arranged along each of second to fifth pixel rows. The first to fifth pixel rows may be sequentially arranged from the lower side of the display area DA. Each of the plurality of gate lines GL may be disposed on the lower side of the pixel SP. The gate line GL may supply a gate signal to the pixel SP. The gate line GL may be disposed in a fourth metal layer MTL4. In one or more embodiments, the fourth metal layer MTL4 may be disposed on the interlayer insulating film ILD.

The plurality of first to third data lines DL1, DL2, and DL3 may extend in the second direction (Y-axis direction) and may be spaced from each other in the first direction (X-axis direction). The first to third data lines DL1, DL2, and DL3 may be arranged along pixel columns of the display area DA. The first to third data lines DL1, DL2, and DL3 may form one group and may be disposed on the right side of the pixel SP. Each of the first to third data lines DL1, DL2, and DL3 may supply a data voltage to the pixel SP. The first to third data lines DL1, DL2, and DL3 may be disposed in a second metal layer MTL2. In one or more embodiments, the second metal layer MTL2 may be disposed on the third barrier insulating film BIL3.

The plurality of vertical voltage lines VVSL may extend in the second direction (Y-axis direction) and may be spaced from each other in the first direction (X-axis direction). The plurality of vertical voltage lines VVSL may be arranged along the pixel columns of the display area DA. Each of the plurality of vertical voltage lines VVSL may be disposed on the right side of the third data line DL3. The vertical voltage line VVSL may be connected to the plurality of second voltage lines VSL and may supply a low potential voltage to the second voltage lines VSL. The vertical voltage line VVSL may be disposed in the second metal layer MTL2.

The plurality of first voltage lines VDL may extend in the second direction (Y-axis direction) and may be spaced from each other in the first direction (X-axis direction). The plurality of first voltage lines VDL may be arranged along the pixel columns of the display area DA. Each of the plurality of first voltage lines VDL may be disposed on the left side of the pixel SP. The first voltage line VDL may be connected to the horizontal voltage line HVDL, and may supply a driving voltage or a high potential voltage to the horizontal voltage line HVDL. The first voltage line VDL may supply a driving voltage or a high potential voltage to the pixel SP. The first voltage line VDL may be disposed in the second metal layer MTL2.

The plurality of sensing lines SL may extend in the second direction (Y-axis direction) and may be spaced from each other in the first direction (X-axis direction). The plurality of sensing lines SL may be arranged along the pixel columns of the display area DA. Each of the plurality of sensing lines SL may be disposed on the left side of the first voltage line VDL. The sensing line SL may be disposed in the second metal layer MTL2.

The plurality of horizontal voltage lines HVDL may extend in the first direction (X-axis direction) and may be spaced from each other in the second direction (Y-axis direction). The plurality of horizontal voltage lines HVDL may be arranged along the pixel rows of the display area DA. Each of the plurality of horizontal voltage lines HVDL may be disposed on the upper side of the pixel SP. The horizontal voltage line HVDL may be connected to the plurality of first voltage lines VDL, and may electrically connect the plurality of first voltage lines VDL to each other. The horizontal voltage line HVDL may be disposed in the fourth metal layer MTL4.

The plurality of second voltage lines VSL may extend in the first direction (X-axis direction) and may be spaced from each other in the second direction (Y-axis direction). The plurality of second voltage lines VSL may be arranged along the pixel rows of the display area DA. Each of the plurality of second voltage lines VSL may be disposed on the lower side of the gate line GL. The second voltage line VSL may supply a low potential voltage to the pixel SP. The second voltage line VSL may be disposed in the fourth metal layer MTL4.

The plurality of gate fan-out lines GFL may supply gate signals received from the first flexible film FPCB1 to the plurality of gate lines GL. The plurality of gate fan-out lines GFL may be arranged on one side (e.g., the left side) of the display area DA. One end of the gate fan-out line GFL may be connected to the first flexible film FPCB1, and the other end of the gate fan-out line GFL may be connected to the connection line CWL. The gate fan-out line GFL may supply the gate signal to the gate line GL through the connection line CWL. The gate fan-out line GFL may be disposed in a first metal layer MTL1. In one or more embodiments, the first metal layer MTL1 may be disposed on the first barrier insulating film BIL1.

The plurality of gate fan-out lines GFL may include first to fifth gate fan-out lines GFL1, GFL2, GFL3, GFL4, and GFL5. The first gate fan-out line GFL1 may be electrically connected to the first gate line GL1 through the first connection line CWL1. The first connection line CWL1 may include a first-first connection line CWL1-1, a first-second connection line CWL1-2, and a first-third connection line CWL1-3.

The first-first connection line CWL1-1 may be inserted into a second contact hole CNT2 to be connected to the first gate fan-out line GFL1. In one or more embodiments, the second contact hole CNT2 may penetrate through the third barrier insulating film BIL3, the second substrate SUB2, and the second barrier insulating film BIL2. The first-first connection line CWL1-1 may be disposed in the second metal layer MTL2 and extend in the second direction (the Y-axis direction). The first-first connection line CWL1-1 may cross the dummy patterns DMP and a fourteenth data fan-out line DFL14 disposed in the first metal layer MTL1. The first-first connection line CWL1-1 may be insulated from the dummy patterns DMP and the fourteenth data fan-out line DFL14. The first-first connection line CWL1-1 may cross the fifth gate line GL5 and the second voltage line VSL disposed in the fourth metal layer MTL4. The first-first connection line CWL1-1 may be insulated from the fifth gate line GL5 and the second voltage line VSL.

The first-second connection line CWL1-2 may be connected between the first-first connection line CWL1-1 and the first-third connection line CWL1-3. One end of the first-second connection line CWL1-2 may be inserted into a third contact hole CNT3 to be connected to the first-first connection line CWL1-1. In one or more embodiments, the third contact hole CNT3 may penetrate through the interlayer insulating film ILD, the gate insulating film GI, and the buffer layer BF. The other end of the first-second connection line CWL1-2 may be inserted into a third contact hole CNT3 to be connected to the first-third connection line CWL1-3. The first-second connection line CWL1-2 may be disposed in the fourth metal layer MTL4 and extend in the first direction (X-axis direction). The first-second connection line CWL1-2 may overlap the fourteenth data fan-out line DFL14 disposed in the first metal layer MTL1, and may cross eleventh to thirteenth data fan-out lines DFL11, DFL12, and DFL13, and twenty-first, twenty-second, and twenty-fourth data fan-out lines DFL21, DFL22, and DFL24 disposed in the first metal layer MTL1. The first-second connection line CWL1-2 may be insulated from the eleventh to fourteenth data fan-out lines DFL11, DFL12, DFL13, and DFL14, and the twenty-first, twenty-second, and twenty-fourth data fan-out lines DFL21, DFL22, and DFL24. The first-second connection line CWL1-2 may cross the first to third data lines DL1, DL2, and DL3, the sensing line SL, the first voltage line VDL, and the vertical voltage line WSL disposed in the second metal layer MTL2. The first-second connection line CWL1-2 may be insulated from the first to third data lines DL1, DL2, and DL3, the sensing line SL, the first voltage line VDL, and the vertical voltage line WSL.

The first-third connection line CWL1-3 may be connected between the first-second connection line CWL1-2 and the first gate line GL1. The first gate line GL1 may be inserted into a third contact hole CNT3 to be connected to the first-third connection line CWL1-3. The first-third connection line CWL1-3 may be disposed in the second metal layer MTL2 and extend in the second direction (Y-axis direction). The first-third connection line CWL1-3 may cross twenty-second and twenty-third data fan-out lines DFL22 and DFL23, thirty-first to thirty-fourth data fan-out lines DFL31, DFL32, DFL33, and DFL34, and forty-first to forty-fourth data fan-out lines DFL41, DFL42, DFL43, and DFL44 disposed in the first metal layer MTL1. The first-third connection line CWL1-3 may be insulated from the twenty-second and twenty-third data fan-out lines DFL22 and DFL23, the thirty-first to thirty-fourth data fan-out lines DFL31, DFL32, DFL33, and DFL34, and the forty-first to forty-fourth data fan-out lines DFL41, DFL42, DFL43, and DFL44. The first-third connection line CWL1-3 may cross the second to fourth gate lines GL2, GL3, and GL4, the second voltage lines VSL, and the horizontal voltage lines HVDL disposed in the fourth metal layer MTL4. The first-third connection line CWL1-3 may be insulated from the second to fourth gate lines GL2, GL3, and GL4, the second voltage lines VSL, and the horizontal voltage lines HVDL.

The first gate fan-out line GFL1 may be connected to the first gate line GL1 through the first-first connection line CWL1-1 disposed in the second metal layer MTL2, the first-second connection line CWL1-2 disposed in the fourth metal layer MTL4, and the first-third connection line CWL1-3 disposed in the second metal layer MTL2. The first connection line CWL1 may be insulated from the plurality of data fan-out lines DFL to supply a gate signal to the first gate line GL1. Accordingly, the display device 10 may include the first connection line CWL1 disposed in the second and fourth metal layers MTL2 and MTL4 of the thin film transistor layer TFTL to electrically connect the first gate fan-out line GFL1 disposed in the display area DA to the first gate line GL1 without including a separate metal layer or mask.

The second gate fan-out line GFL2 may be electrically connected to the second gate line GL2 through the second connection line CWL2. The second connection line CWL2 may be inserted into a second contact hole CNT2 to be connected to the second gate fan-out line GFL2. The second gate line GL2 may be inserted into a third contact hole CNT3 to be connected to the second connection line CWL2. The second connection line CWL2 may be disposed in the second metal layer MTL2 and extend in the second direction (Y-axis direction). The second connection line CWL2 may cross the dummy patterns DMP, the eleventh to fourteenth data fan-out lines DFL11, DFL12, DFL13, and DFL14, and the twenty-first to twenty-fourth data fan-out lines DFL21, DFL22, DFL23, and DFL24 disposed in the first metal layer MTL1. The second connection line CWL2 may be insulated from the dummy patterns DMP, the eleventh to fourteenth data fan-out lines DFL11, DFL12, DFL13, and DFL14, and the twenty-first to twenty-fourth data fan-out lines DFL21, DFL22, DFL23, and DFL24. The second connection line CWL2 may cross the third to fifth gate lines GL3, GL4, and GL5, the second voltage lines VSL, and the horizontal voltage lines HVDL disposed in the fourth metal layer MTL4. The second connection line CWL2 may be insulated from the third to fifth gate lines GL3, GL4, and GL5, the second voltage lines VSL, and the horizontal voltage lines HVDL.

The second connection line CWL2 may be insulated from the plurality of data fan-out lines DFL to supply a gate signal to the second gate line GL2. Accordingly, the display device 10 may include the second connection line CWL2 disposed in the second metal layer MTL2 of the thin film transistor layer TFTL to electrically connect the second gate fan-out line GFL2 disposed in the display area DA to the second gate line GL2 without including a separate metal layer or mask.

The third gate fan-out line GFL3 may be electrically connected to the third gate line GL3 through the third connection line CWL3 disposed in the second metal layer MTL2. The fourth gate fan-out line GFL4 may be electrically connected to the fourth gate line GL4 through the fourth connection line CWL4 disposed in the second metal layer MTL2. The fifth gate fan-out line GFL5 may be electrically connected to the fifth gate line GL5 through the fifth connection line CWL5 disposed in the second metal layer MTL2. Accordingly, the display device 10 may include the plurality of connection lines CWL disposed in the second metal layer MTL2 of the thin film transistor layer TFTL to electrically connect the plurality of gate fan-out lines GFL disposed in the display area DA to the plurality of gate lines GL without including a separate metal layer or mask.

The plurality of data fan-out lines DFL may supply the data voltages received from the second flexible film FPCB2 to the plurality of data lines DL. The plurality of data fan-out lines DFL may supply the source voltages received from the second flexible film FPCB2 to the power lines. The plurality of data fan-out lines DFL may be arranged on the other side (e.g., the lower side) of the display area DA. One end of the data fan-out line DFL may be connected to the second flexible film FPCB2, and the other end of the data fan-out line DFL may be connected to the connection line CWL. The data fan-out line DFL may supply the data voltage to the data line DL through the connection line CWL. The data fan-out line DFL may be disposed in the first metal layer MTL1.

The plurality of data fan-out lines DFL may include the eleventh to fourteenth data fan-out lines DFL11 to DFL14, the twenty-first to twenty-fourth data fan-out lines DFL21 to DFL24, the thirty-first to thirty-fourth data fan-out lines DFL31 to DFL34, the forty-first to forty-fourth data fan-out lines DFL41 to DFL44, fifty-first to fifty-fourth data fan-out lines DFL51 to DFL54, and sixty-first to sixty-fourth data fan-out lines DFL61 to DFL64.

The eleventh to fourteenth data fan-out lines DFL11 to DFL14 may be connected to a plurality of pixels SP disposed in a first pixel column. The eleventh data fan-out line DFL11 may be connected to the first data line DL1 through the first connection electrode CNE1 disposed in the fourth metal layer MTL4. The twelfth data fan-out line DFL12 may be connected to the second data line DL2 through the second connection electrode CNE2 disposed in the fourth metal layer MTL4. The thirteenth data fan-out line DFL13 may be connected to the third data line DL3 through the third connection electrode CNE3 disposed in the fourth metal layer MTL4. Each of the eleventh to thirteenth data fan-out lines DFL11 to DFL13 may supply a data voltage to each of the first to third data lines DL1, DL2 and DL3. The fourteenth data fan-out line DFL14 may be connected to the sensing line SL through the fourth connection electrode CNE4 disposed in the fourth metal layer MTL4. The fourteenth data fan-out line DFL14 may supply an initialization voltage to the sensing line SL.

The twenty-first to twenty-fourth data fan-out lines DFL21 to DFL24 may be connected to a plurality of pixels SP disposed in a second pixel column. Each of the twenty-first to twenty-third data fan-out lines DFL21 to DFL23 may supply a data voltage to each of the first to third data lines DL1, DL2, and DL3, and the twenty-fourth data fan-out line DFL24 may supply an initialization voltage to the sensing line SL.

The thirty-first to thirty-fourth data fan-out lines DFL31 to DFL34 may be connected to a plurality of pixels SP disposed in a third pixel column. Each of the thirty-first to thirty-third data fan-out lines DFL31 to DFL33 may supply a data voltage to each of the first to third data lines DL1, DL2, and DL3, and the thirty-fourth data fan-out line DFL34 may supply an initialization voltage to the sensing line SL.

The forty-first to forty-fourth data fan-out lines DFL41 to DFL44 may be connected to a plurality of pixels SP disposed in a fourth pixel column. Each of the forty-first to forty-third data fan-out lines DFL41 to DFL43 may supply a data voltage to each of the first to third data lines DL1, DL2, and DL3, and the forty-fourth data fan-out line DFL44 may supply an initialization voltage to the sensing line SL.

The fifty-first to fifty-fourth data fan-out lines DFL51 to DFL54 may be connected to a plurality of pixels SP disposed in a fifth pixel column. Each of the fifty-first to fifty-third data fan-out lines DFL51 to DFL53 may supply a data voltage to each of the first to third data lines DL1, DL2, and DL3, and the fifty-fourth data fan-out line DFL54 may supply an initialization voltage to the sensing line SL.

The sixty-first to sixty-fourth data fan-out lines DFL61 to DFL64 may be connected to a plurality of pixels SP disposed in a sixth pixel column. Each of the sixty-first to sixty-third data fan-out lines DFL61 to DFL63 may supply a data voltage to each of the first to third data lines DL1, DL2, and DL3, and the sixty-fourth data fan-out line DFL64 may supply an initialization voltage to the sensing line SL.

One ends of the twelfth, fourteenth, twenty-first, twenty-third, thirty-second, thirty-fourth, forty-first, forty-third, fifty-second, fifty-fourth, sixty-first, and sixty-third data fan-out lines DFL12, DFL14, DFL21, DFL23, DFL32, DFL34, DFL41, DFL43, DFL52, DFL54, DFL61, and DFL63 may be disposed in a first row. Here, one ends of the data fan-out lines DFL may be portions in contact with the connection lines CWL. As an example, the first row may be disposed between the second pixel row and the third pixel row, but is not limited thereto. As another example, the first row in which one ends of the data fan-out lines DFL are arranged may be more adjacent to or closer to the non-display area NDA than the second pixel row is to the non-display area NDA.

One ends of the eleventh, thirteenth, twenty-second, twenty-fourth, thirty-first, thirty-third, forth-second, forty-fourth, fifty-first, fifth-third, sixty-second, and sixty-fourth data fan-out lines DFL11, DFL13, DFL22, DFL24, DFL31, DFL33, DFL42, DFL44, DFL51, DFL53, DFL62, and DFL64 may be disposed in a second row. As an example, the second row may be disposed between the third pixel row and the fourth pixel row, but is not limited thereto. The first row and the second row in which one ends of the data fan-out lines DFL are disposed may be disposed adjacent to each other, but are not limited thereto.

As another example, one ends of the data fan-out lines DFL may be arranged in one row. As still another example, one ends of the data fan-out lines DFL may be arranged in three or more rows.

The dummy patterns DMP may surround the outside of the plurality of data fan-out lines DFL. The dummy patterns DMP may be adjacent to the fourteenth data fan-out line DFL14. As an example, the dummy patterns DMP may be floated. As another example, the dummy patterns DMP may receive a ground voltage or a DC voltage (e.g., a predetermined DC voltage). The dummy pattern DMP may protect the plurality of data fan-out lines DFL in the process of manufacturing the display device 10 and may prevent or reduce electrical interference of the plurality of data fan-out lines DFL.

Figure 9:
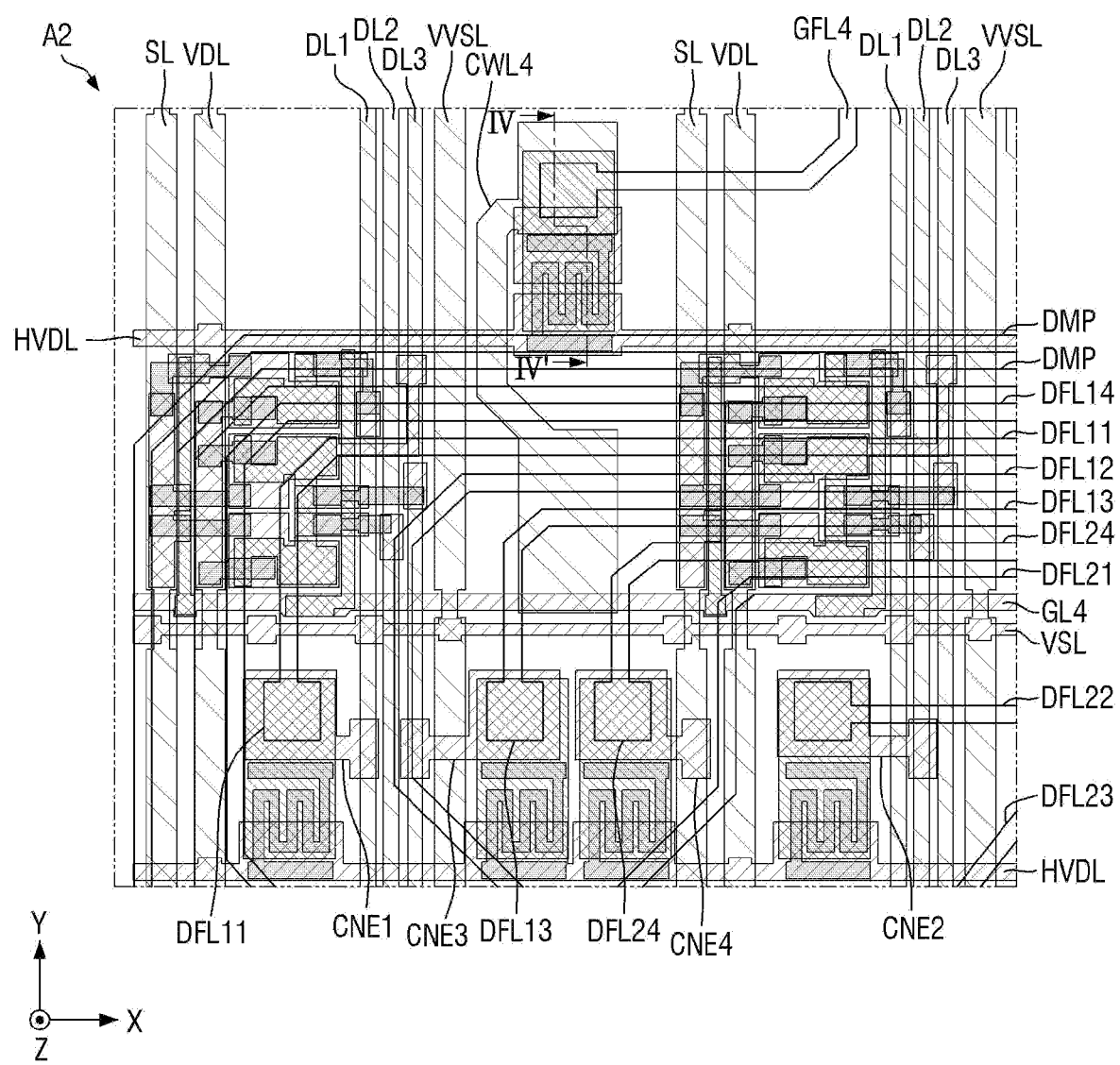
FIG. 9 is an enlarged view of area A2 of FIG. 5.
Figure 10:
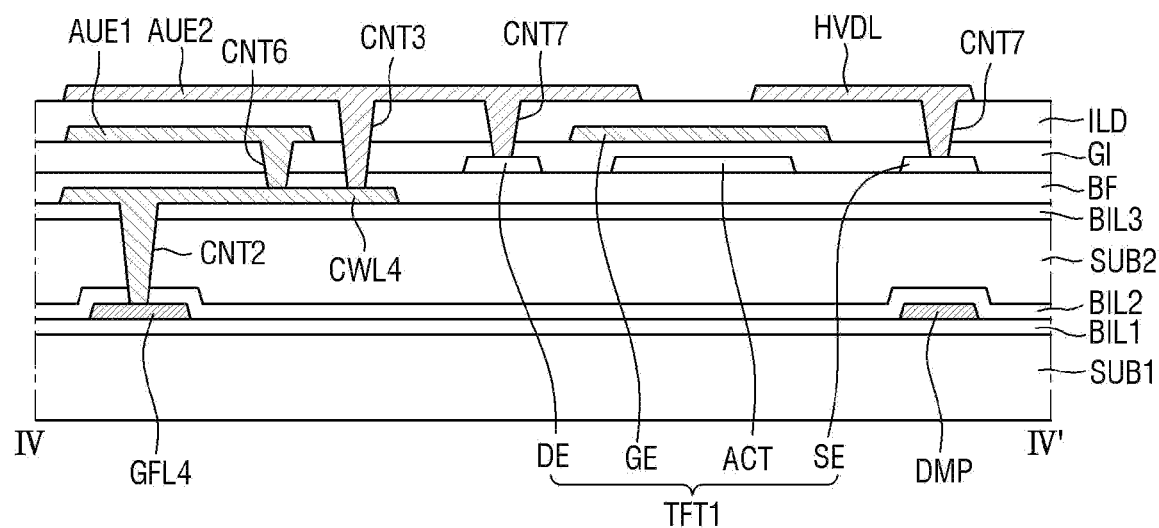
FIG. 10 is a cross-sectional view taken along the line IV-IV' of FIG. 9.

FIG. 9 is an enlarged view of area A2 of FIG. 5, and FIG. 10 is a cross-sectional view taken along the line IV-IV' of FIG. 9.

Referring to FIGS. 9 and 10, the display device 10 may include a first auxiliary electrode AUE1, a second auxiliary electrode AUE2, and a first thin film transistor TFT1.

The first auxiliary electrode AUE1 may be disposed in a third metal layer MTL3 and may overlap one end of the gate fan-out line GFL or one end of the data fan-out line DFL. The first auxiliary electrode AUE1 may be inserted into a sixth contact hole CNT6 to be connected to the fourth connection line CWL4. In one or more embodiments, the sixth contact hole CNT6 may penetrate through the gate insulating film GI and the buffer layer BF. The first auxiliary electrode AUE1 may be electrically connected to the fourth gate fan-out line GFL4 through the fourth connection line CWL4.

The second auxiliary electrode AUE2 may be disposed in the fourth metal layer MTL4 and may overlap one end of the gate fan-out line GFL or one end of the data fan-out line DFL. One end of the second auxiliary electrode AUE2 may be inserted into a third contact hole CNT3 to be connected to the fourth connection line CWL4, and the other end of the second auxiliary electrode AUE2 may be inserted into a seventh contact hole CNT7 to be connected to a drain electrode DE of the first thin film transistor TFT1. In one or more embodiments, the seventh contact hole CNT7 may penetrate through the interlayer insulating film ILD and the gate insulating film GI. The second auxiliary electrode AUE2 may be connected to the fourth gate fan-out line GFL4 through the fourth connection line CWL4. Accordingly, the second auxiliary electrode AUE2 may electrically connect the fourth gate fan-out line GFL4 and the first thin film transistor TFT1 to each other.

The first thin film transistor TFT1 may be electrically connected between the gate fan-out line GFL or the data fan-out line DFL and the horizontal voltage line HVDL. The first thin film transistor TFT may include a semiconductor region ACT, a gate electrode GE, the drain electrode DE, and a source electrode SE.

The semiconductor region ACT, the drain electrode DE, and the source electrode SE may be disposed on the buffer layer BF. The semiconductor region ACT may overlap the gate electrode GE in the thickness direction (Z-axis direction) of the display device 10, and may be insulated from the gate electrode GE by the gate insulating film GI. The drain electrode DE and the source electrode SE may be provided by making a material of the semiconductor region ACT into conductors. The gate electrode GE may be disposed on the gate insulating film GI. The gate electrode GE may overlap the semiconductor region ACT with the gate insulating film GI interposed therebetween.

The drain electrode DE of the first thin film transistor TFT1 may be electrically connected to the gate fan-out line GFL or the data fan-out line DFL. The horizontal voltage line HVDL may be disposed in the fourth metal layer MTL4, and may be inserted into the seventh contact hole CNT7 to be connected to the source electrode SE of the first thin film transistor TFT1. The first thin film transistor TFT1 may serve as a diode connected to one end of the gate fan-out line GFL or one end of the data fan-out line DFL. Accordingly, when an overvoltage or overcurrent is applied to the gate fan-out line GFL or the data fan-out line DFL, the first thin film transistor TFT1 may solve the overvoltage or overcurrent to protect the display device 10.

The fourth gate fan-out line GFL4 may be electrically connected to the fourth gate line GL4 through the fourth connection line CWL4 disposed in the second metal layer MTL2. The fourth connection line CWL4 may cross the dummy patterns DMP and the eleventh to fourteenth data fan-out lines DFL11, DFL12, DFL13, and DFL14 disposed in the first metal layer MTL1. The fourth connection line CWL4 may be insulated from the dummy patterns DMP and the eleventh to fourteenth data fan-out lines DFL11, DFL12, DFL13, and DFL14.

The eleventh data fan-out line DFL11 may be connected to the first data line DL1 through the first connection electrode CNE1 disposed in the fourth metal layer MTL4. The thirteenth data fan-out line DFL13 may be connected to the third data line DL3 through the third connection electrode CNE3 disposed in the fourth metal layer MTL4. The twenty-second data fan-out line DFL22 may be connected to the second data line DL2 through the second connection electrode CNE2 disposed in the fourth metal layer MTL4. The twenty-fourth data fan-out line DFL24 may be connected to the sensing line SL through the fourth connection electrode CNE4 disposed in the fourth metal layer MTL4.

Figure 11:
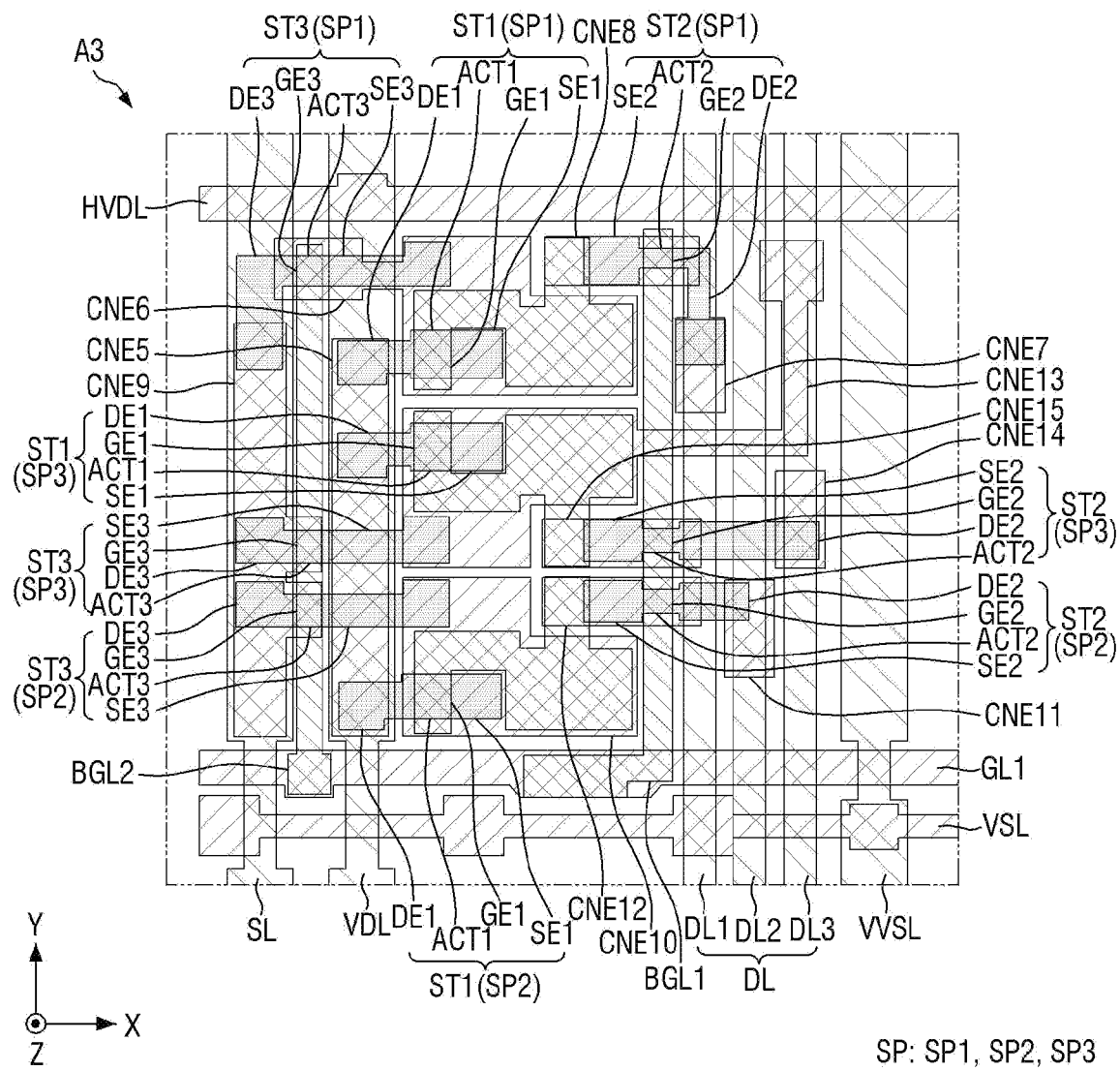
FIG. 11 is an enlarged view of area A3 of FIG. 5.
Figure 12:
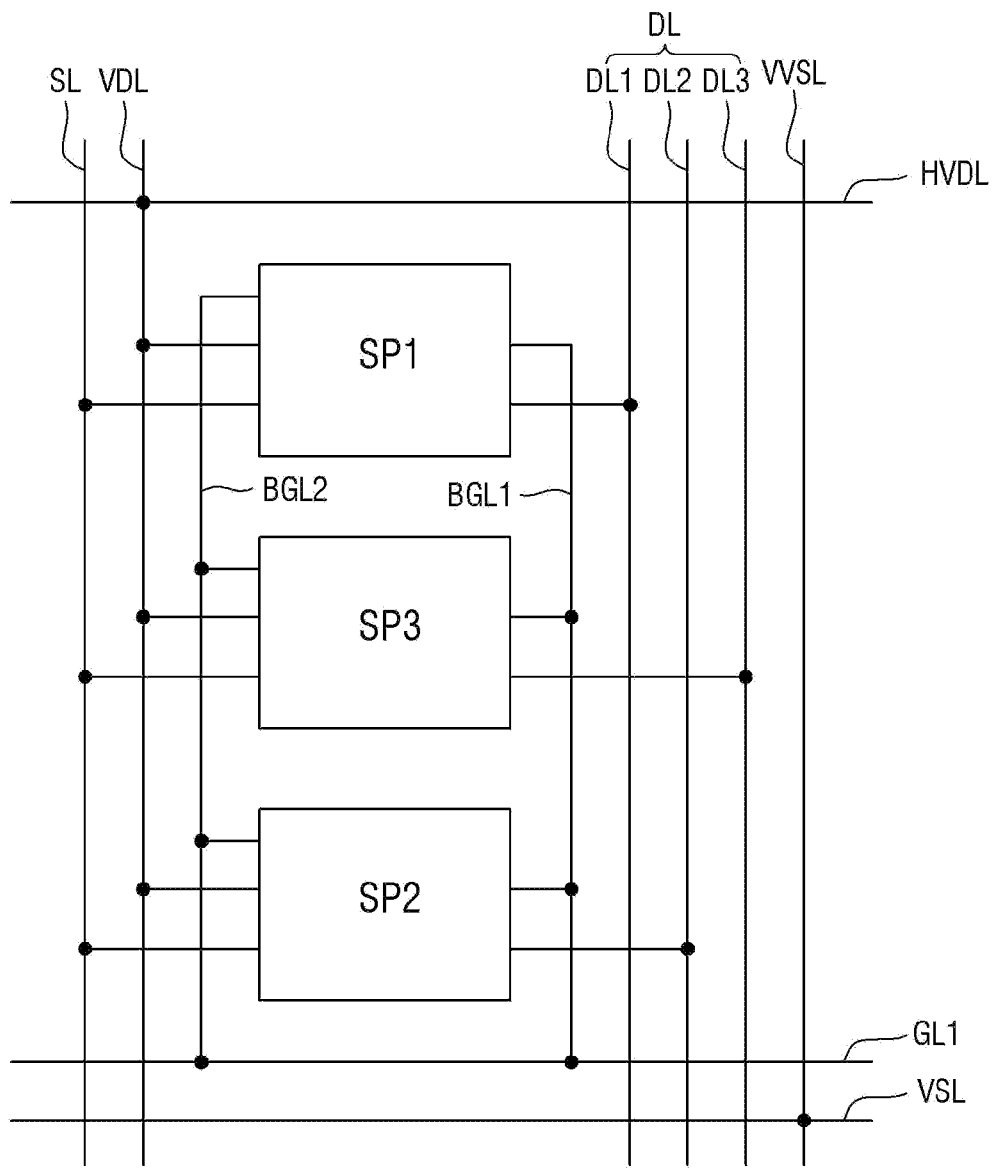
FIG. 12 is a schematic block diagram illustrating pixels illustrated in FIG. 11.
Figure 13:
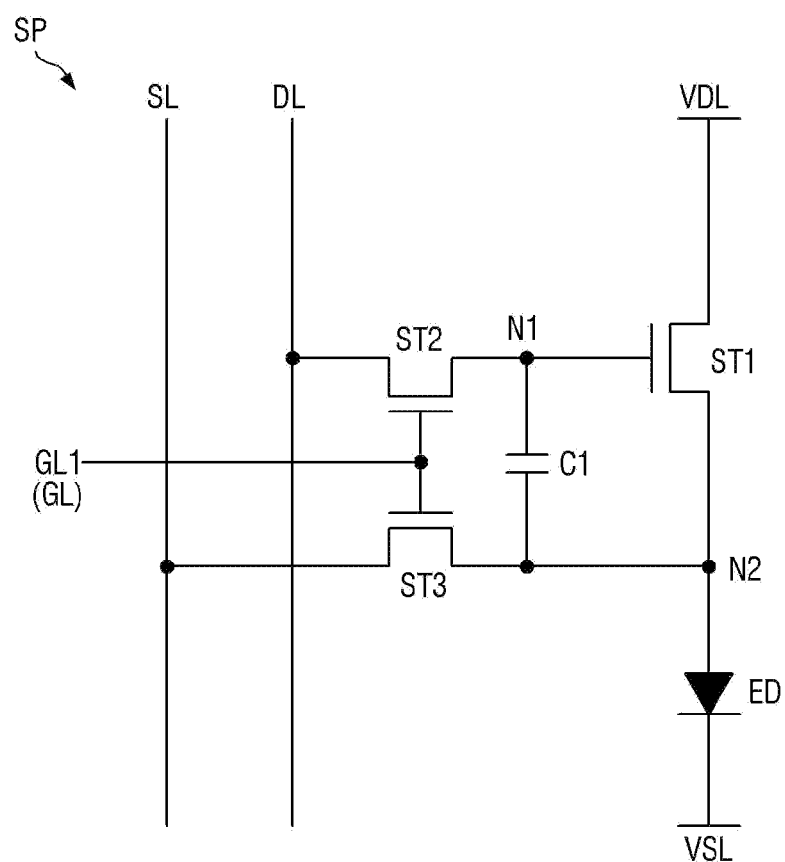
FIG. 13 is a circuit diagram illustrating the pixel of FIG. 12.

FIG. 11 is an enlarged view of area A3 of FIG. 5, FIG. 12 is a schematic block diagram illustrating pixels illustrated in FIG. 11, and FIG. 13 is a circuit diagram illustrating the pixel of FIG. 12.

Referring to FIGS. 11 to 13, the plurality of pixels SP may include first to third pixels SP1, SP2, and SP3. Each of the first to third pixels SP1, SP2, and SP3 may be connected to the gate line GL, the data line DL, the first voltage line VDL, the second voltage line VSL, and the sensing line SL.

Each of the first to third pixels SP1, SP2, and SP3 may include first to third transistors ST1, ST2, and ST3, a first capacitor C1, and a light emitting element ED.

The first transistor ST1 of the first pixel SP1 may include a semiconductor region ACT1, a gate electrode GE1, the drain electrode DE1, and a source electrode SE1. The semiconductor region ACT1 of the first transistor ST1 may be disposed in the buffer layer BF, and may overlap the gate electrode GE1 of the first transistor ST1 in the thickness direction (Z-axis direction) of the display device 10. The gate electrode GE1 of the first transistor ST1 may be disposed in the third metal layer MTL3. The gate electrode GE1 of the first transistor ST1 may correspond to a first node N1 of FIG. 13.

The drain electrode DE1 and the source electrode SE1 of the first transistor ST1 may be provided by heat-treating the semiconductor region ACT1 to make the semiconductor region ACT1 into conductors. The drain electrode DE1 of the first transistor ST1 may be connected to the first voltage line VDL of the second metal layer MTL2 through a fifth connection electrode CNE5 of the fourth metal layer MTL4. The drain electrode DE1 of the first transistor ST1 may receive a driving voltage from the first voltage line VDL.

The source electrode SE1 of the first transistor ST1 may be connected to a sixth connection electrode CNE6 of the fourth metal layer MTL4. The sixth connection electrode CNE6 may be connected to a source electrode SE3 of the third transistor ST3. The sixth connection electrode CNE6 may be electrically connected to a light emitting element ED of the first pixel SP1. The sixth connection electrode CNE6 may correspond to a second node N2 of FIG. 13.

The light emitting element ED may receive a driving current from the first transistor ST1 to emit light. A light emission amount or a luminance of the light emitting element ED may be proportional to a magnitude of the driving current. The light emitting element EL may be an inorganic light emitting element including a first electrode, a second electrode, and an inorganic semiconductor disposed between the first electrode and the second electrode. The first electrode of the light emitting element ED may be connected to the sixth connection electrode CNE6, and the second electrode of the light emitting element ED may be connected to the second voltage line VSL.

The second transistor ST2 of the first pixel SP1 may include a semiconductor region ACT2, a gate electrode GE2, a drain electrode DE2, and a source electrode SE2. The semiconductor region ACT2 of the second transistor ST2 may be disposed on the buffer layer BF, and may overlap the gate electrode GE2 of the second transistor ST2 in the thickness direction (Z-axis direction) of the display device 10. The gate electrode GE2 of the second transistor ST2 may be a portion of a first auxiliary gate line BGL1. The first auxiliary gate line BGL1 may be disposed in the third metal layer MTL3. The first auxiliary gate line BGL1 may be connected to the first gate line GL1 and extend in the second direction (Y-axis direction). The first auxiliary gate line BGL1 may receive a gate signal from the first gate line GL1.

The drain electrode DE2 of the second transistor ST2 may be connected to the first data line DL1 of the second metal layer MTL2 through a seventh connection electrode CNE7 of the fourth metal layer MTL4. The drain electrode DE2 of the second transistor ST2 may receive a data voltage of the first pixel SP1 from the first data line DL1.

The source electrode SE2 of the second transistor ST2 may be connected to the gate electrode GE1 of the first transistor ST1 through an eighth connection electrode CNE8 of the fourth metal layer MTL4. The source electrode SE2 of the second transistor ST2 may correspond to the first node N1 of FIG. 13.

The third transistor ST3 of the first pixel SP1 may include a semiconductor region ACT3, a gate electrode GE3, a drain electrode DE3, and the source electrode SE3. The semiconductor region ACT3 of the third transistor ST3 may be disposed on the buffer layer BF, and may overlap the gate electrode GE3 of the third transistor ST3 in the thickness direction (Z-axis direction) of the display device 10. The gate electrode GE3 of the third transistor ST3 may be a portion of a second auxiliary gate line BGL2. The second auxiliary gate line BGL2 may be disposed in the third metal layer MTL3. The second auxiliary gate line BGL2 may be connected to the first gate line GL1 and extend in the second direction (Y-axis direction). The second auxiliary gate line BGL2 may receive a gate signal from the first gate line GL1.

The drain electrode DE3 of the third transistor ST3 may be connected to the sensing line SL of the second metal layer MTL2 through a ninth connection electrode CNE9 of the fourth metal layer MTL4. The drain electrode DE3 of the third transistor ST3 may receive an initialization voltage from the sensing line SL. The drain electrode DE3 of the third transistor ST3 may supply a sensed signal to the sensing line SL.

The source electrode SE3 of the third transistor ST3 may be connected to the sixth connection electrode CNE6 of the fourth metal layer MTL4. The sixth connection electrode CNE6 may be connected to the source electrode SE1 of the first transistor ST1. The sixth connection electrode CNE6 may be electrically connected to the light emitting element ED of the first pixel SP1. The sixth connection electrode CNE6 may correspond to the second node N2 of FIG. 13.

The first transistor ST1 of the second pixel SP2 may include a semiconductor region ACT1, a gate electrode GE1, a drain electrode DE1, and a source electrode SE1. The semiconductor region ACT1 of the first transistor ST1 may be disposed in the buffer layer BF, and may overlap the gate electrode GE1 of the first transistor ST1 in the thickness direction (Z-axis direction) of the display device 10. The gate electrode GE1 of the first transistor ST1 may be disposed in the third metal layer MTL3. The gate electrode GE1 of the first transistor ST1 may correspond to the first node N1 of FIG. 13.

The drain electrode DE1 and the source electrode SE1 of the first transistor ST1 may be provided by heat-treating the semiconductor region ACT1 to make the semiconductor region ACT1 into conductors. The drain electrode DE1 of the first transistor ST1 may be connected to the first voltage line VDL of the second metal layer MTL2 through the fifth connection electrode CNE5 of the fourth metal layer MTL4. The drain electrode DE1 of the first transistor ST1 may receive a driving voltage from the first voltage line VDL.

The source electrode SE1 of the first transistor ST1 may be connected to a tenth connection electrode CNE10 of the fourth metal layer MTL4. The tenth connection electrode CNE10 may be connected to a source electrode SE3 of the third transistor ST3. The tenth connection electrode CNE10 may be electrically connected to a light emitting element ED of the second pixel SP2. The tenth connection electrode CNE10 may correspond to the second node N2 of FIG. 13.

The second transistor ST2 of the second pixel SP2 may include a semiconductor region ACT2, a gate electrode GE2, a drain electrode DE2, and a source electrode SE2. The semiconductor region ACT2 of the second transistor ST2 may be disposed on the buffer layer BF, and may overlap the gate electrode GE2 of the second transistor ST2 in the thickness direction (Z-axis direction) of the display device 10. The gate electrode GE2 of the second transistor ST2 may be a portion of the first auxiliary gate line BGL1. The first auxiliary gate line BGL1 may receive the gate signal from the first gate line GL1.

The drain electrode DE2 of the second transistor ST2 may be connected to the second data line DL2 of the second metal layer MTL2 through an eleventh connection electrode CNE11 of the fourth metal layer MTL4. The drain electrode DE2 of the second transistor ST2 may receive a data voltage of the second pixel SP2 from the second data line DL2.

The source electrode SE2 of the second transistor ST2 may be connected to the gate electrode GE1 of the first transistor ST1 through a twelfth connection electrode CNE12 of the fourth metal layer MTL4. The source electrode SE2 of the second transistor ST2 may correspond to the first node N1 of FIG. 13.

The third transistor ST3 of the second pixel SP2 may include a semiconductor region ACT3, a gate electrode GE3, a drain electrode DE3, and the source electrode SE3. The semiconductor region ACT3 of the third transistor ST3 may be disposed on the buffer layer BF, and may overlap the gate electrode GE3 of the third transistor ST3 in the thickness direction (Z-axis direction) of the display device 10. The gate electrode GE3 of the third transistor ST3 may be a portion of the second auxiliary gate line BGL2. The second auxiliary gate line BGL2 may receive a gate signal from the first gate line GL1.

The drain electrode DE3 of the third transistor ST3 may be connected to the sensing line SL of the second metal layer MTL2 through the ninth connection electrode CNE9 of the fourth metal layer MTL4. The drain electrode DE3 of the third transistor ST3 may receive an initialization voltage from the sensing line SL. The drain electrode DE3 of the third transistor ST3 may supply a sensed signal to the sensing line SL.

The source electrode SE3 of the third transistor ST3 may be connected to the tenth connection electrode CNE10 of the fourth metal layer MTL4. The tenth connection electrode CNE10 may be connected to the source electrode SE1 of the first transistor ST1. The tenth connection electrode CNE10 may be electrically connected to the light emitting element ED of the second pixel SP2. The tenth connection electrode CNE10 may correspond to the second node N2 of FIG. 13.

The first transistor ST1 of the third pixel SP3 may include a semiconductor region ACT1, a gate electrode GE1, the drain electrode DE1, and a source electrode SE1. The semiconductor region ACT1 of the first transistor ST1 may be disposed in the buffer layer BF, and may overlap the gate electrode GE1 of the first transistor ST1 in the thickness direction (Z-axis direction) of the display device 10. The gate electrode GE1 of the first transistor ST1 may be disposed in the third metal layer MTL3. The gate electrode GE1 of the first transistor ST1 may correspond to the first node N1 of FIG. 13.

The drain electrode DE1 and the source electrode SE1 of the first transistor ST1 may be provided by heat-treating the semiconductor region ACT1 to make the semiconductor region ACT1 into conductors. The drain electrode DE1 of the first transistor ST1 may be connected to the first voltage line VDL of the second metal layer MTL2 through the fifth connection electrode CNE5 of the fourth metal layer MTL4. The drain electrode DE1 of the first transistor ST1 may receive a driving voltage from the first voltage line VDL.

The source electrode SE1 of the first transistor ST1 may be connected to a thirteenth connection electrode CNE13 of the fourth metal layer MTL4. The thirteenth connection electrode CNE13 may be connected to a source electrode SE3 of the third transistor ST3. The thirteenth connection electrode CNE13 may be electrically connected to a light emitting element ED of the third pixel SP3. The thirteenth connection electrode CNE13 may correspond to the second node N2 of FIG. 13.

The second transistor ST2 of the third pixel SP3 may include a semiconductor region ACT2, a gate electrode GE2, a drain electrode DE2, and a source electrode SE2. The semiconductor region ACT2 of the second transistor ST2 may be disposed on the buffer layer BF, and may overlap the gate electrode GE2 of the second transistor ST2 in the thickness direction (Z-axis direction) of the display device 10. The gate electrode GE2 of the second transistor ST2 may be a portion of the first auxiliary gate line BGL1. The first auxiliary gate line BGL1 may receive the gate signal from the first gate line GL1.

The drain electrode DE2 of the second transistor ST2 may be connected to the third data line DL3 of the second metal layer MTL2 through a fourteenth connection electrode CNE14 of the fourth metal layer MTL4. The drain electrode DE2 of the second transistor ST2 may receive a data voltage of the third pixel SP3 from the third data line DL3.

The source electrode SE2 of the second transistor ST2 may be connected to the gate electrode GE1 of the first transistor ST1 through a fifteenth connection electrode CNE15 of the fourth metal layer MTL4. The source electrode SE2 of the second transistor ST2 may correspond to the first node N1 of FIG. 13.

The third transistor ST3 of the third pixel SP3 may include a semiconductor region ACT3, a gate electrode GE3, a drain electrode DE3, and the source electrode SE3. The semiconductor region ACT3 of the third transistor ST3 may be disposed on the buffer layer BF, and may overlap the gate electrode GE3 of the third transistor ST3 in the thickness direction (Z-axis direction) of the display device 10. The gate electrode GE3 of the third transistor ST3 may be a portion of the second auxiliary gate line BGL2. The second auxiliary gate line BGL2 may receive the gate signal from the first gate line GL1.

The drain electrode DE3 of the third transistor ST3 may be connected to the sensing line SL of the second metal layer MTL2 through the ninth connection electrode CNE9 of the fourth metal layer MTL4. The drain electrode DE3 of the third transistor ST3 may receive an initialization voltage from the sensing line SL. The drain electrode DE3 of the third transistor ST3 may supply a sensed signal to the sensing line SL.

The source electrode SE3 of the third transistor ST3 may be connected to the thirteenth connection electrode CNE13 of the fourth metal layer MTL4. The thirteenth connection electrode CNE13 may be connected to the source electrode SE1 of the first transistor ST1. The thirteenth connection electrode CNE13 may be electrically connected to the light emitting element ED of the third pixel SP3. The thirteenth connection electrode CNE13 may correspond to the second node N2 of FIG. 13.

Figure 14:
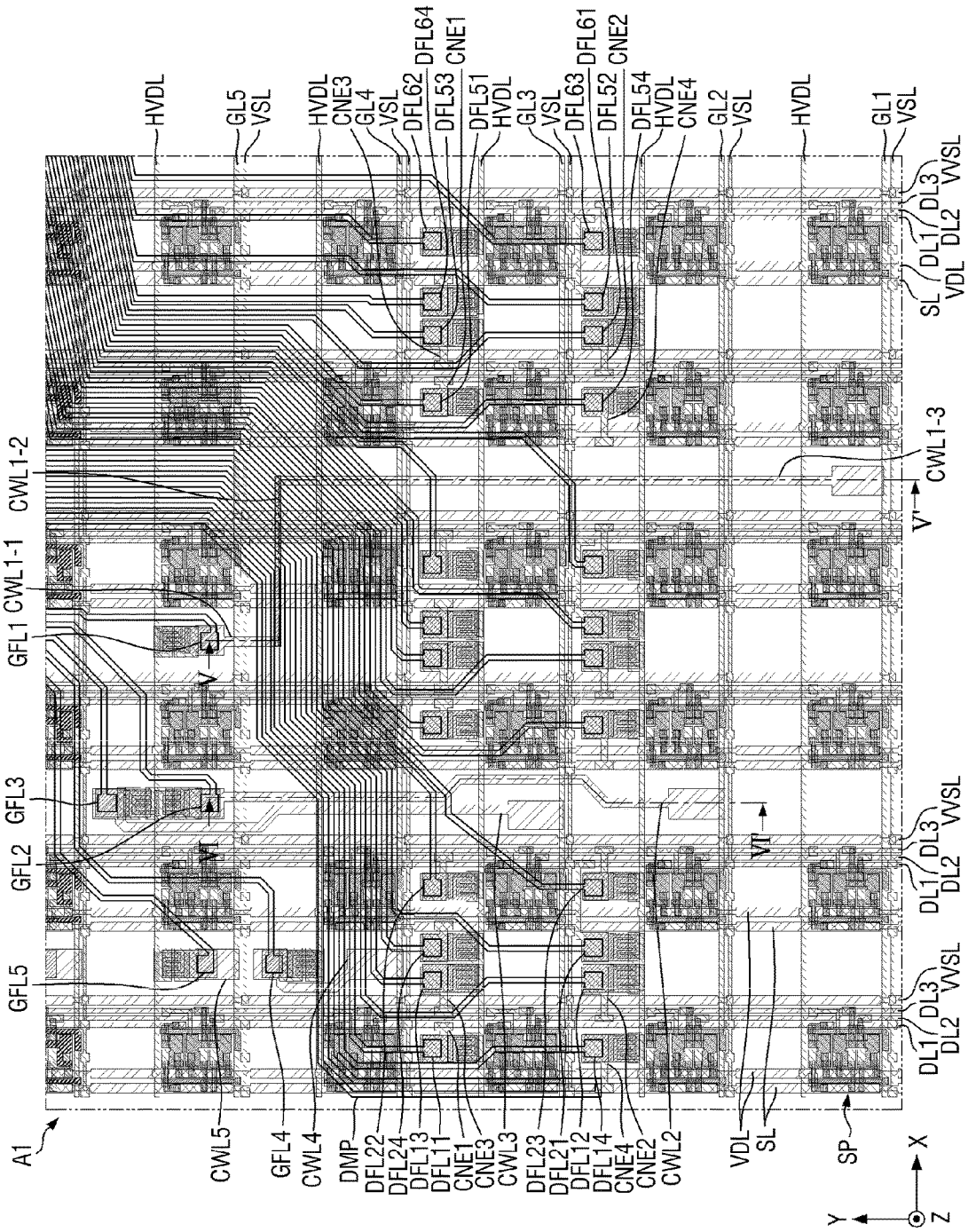
FIG. 14 is an enlarged view illustrating another example of area A1 of FIG. 4.
Figure 15:
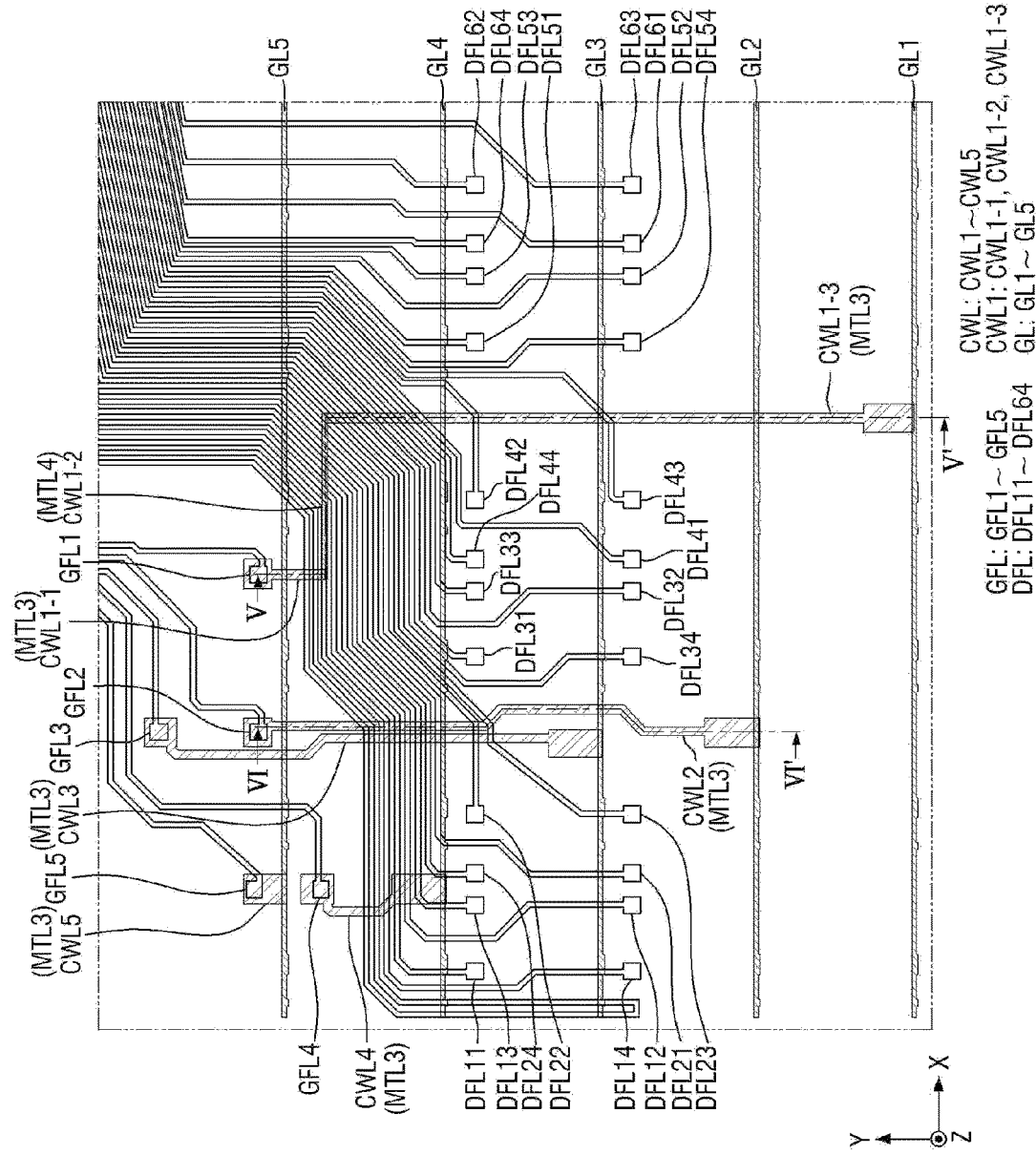
FIG. 15 is a view illustrating gate fan-out lines, data fan-out lines, connection lines, and gate lines in the display device of FIG. 14.
Figure 16:
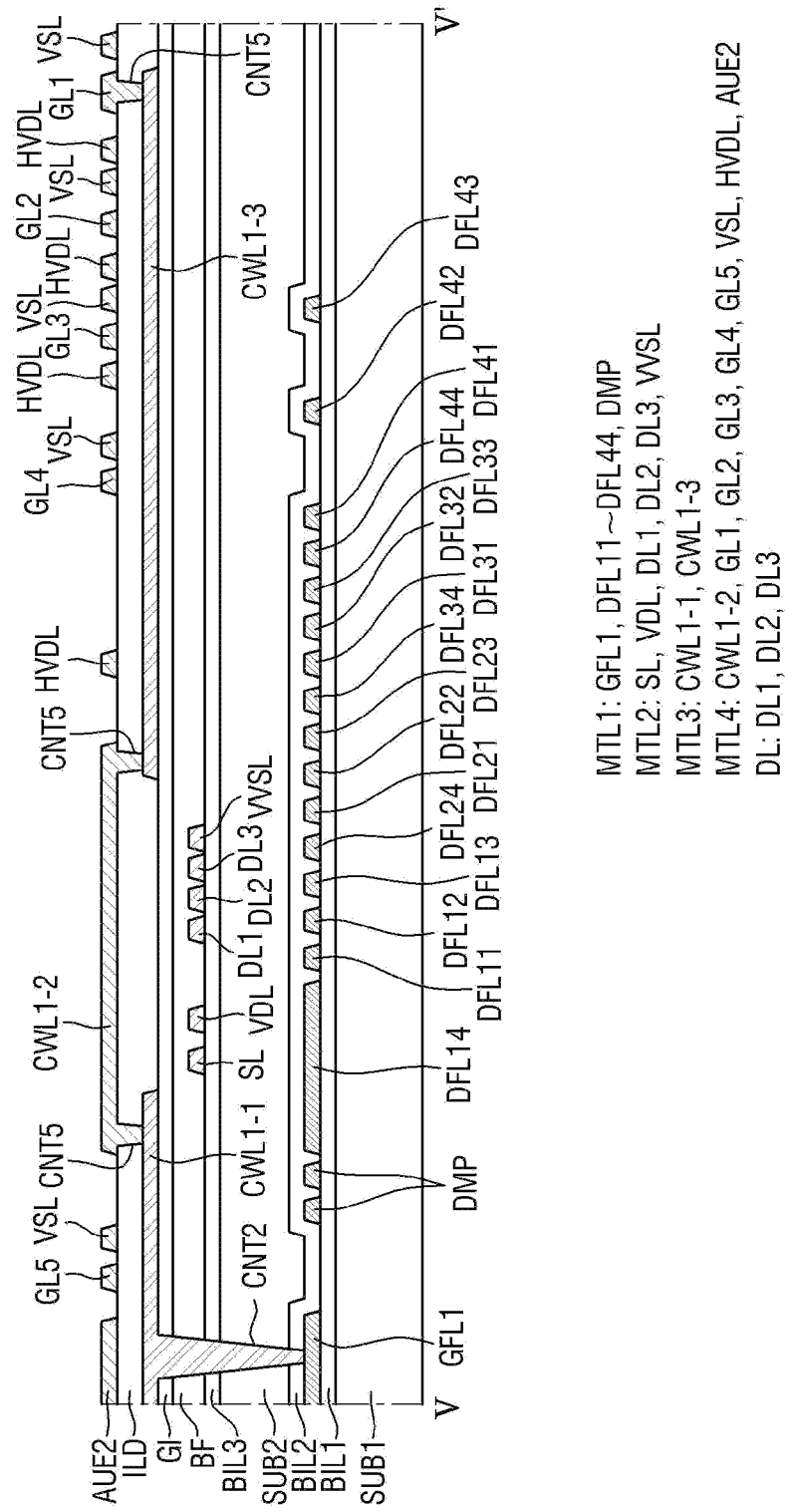
FIG. 16 is a cross-sectional view taken along the line V-V' of FIG. 14.
Figure 17:
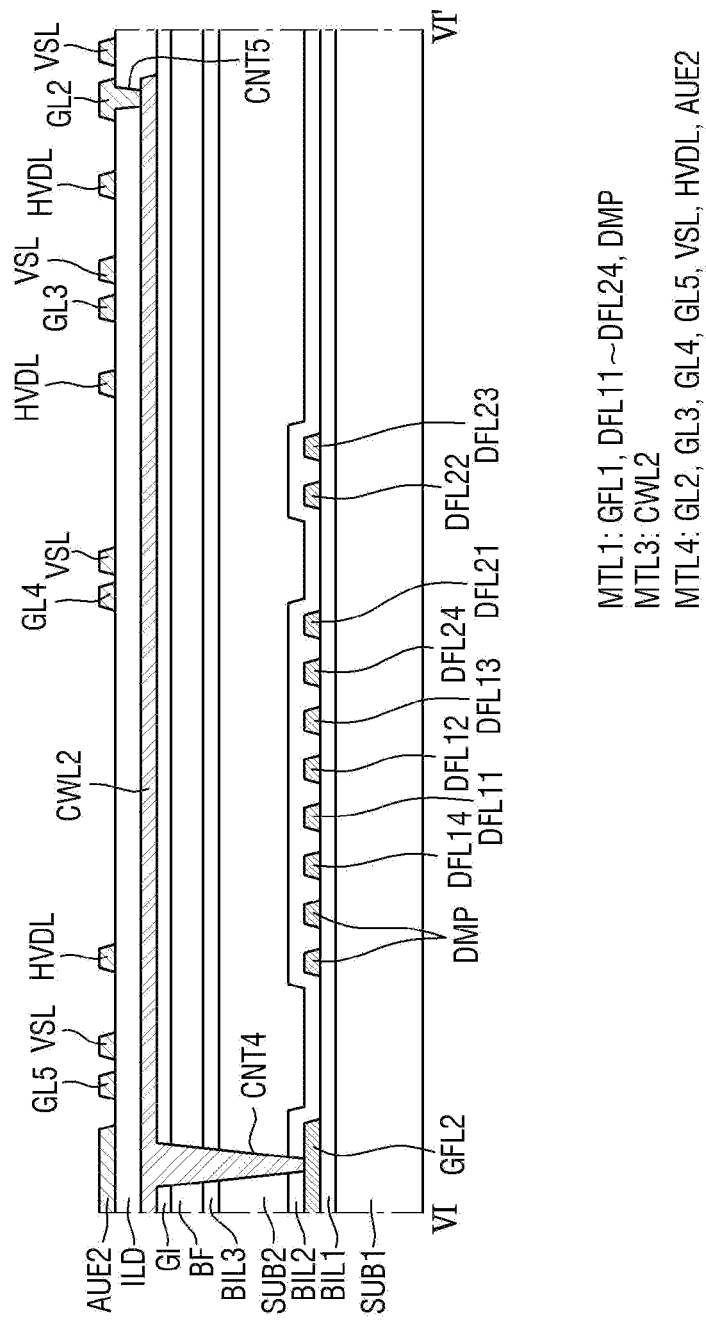
FIG. 17 is a cross-sectional view taken along the line VI-VI' of FIG. 14.

FIG. 14 is an enlarged view illustrating another example of area A1 of FIG. 4, and FIG. 15 is a view illustrating gate fan-out lines, data fan-out lines, connection lines, and gate lines in the display device of FIG. 14. FIG. 16 is a cross-sectional view taken along the line V-V' of FIG. 14, and FIG. 17 is a cross-sectional view taken along the line VI-VI' of FIG. 14. A display device of FIGS. 14 to 17 is different in configurations of connection lines CWL from the display device of FIGS. 5 to 8, and the same configurations as the configurations described above may be briefly described or a description thereof may be omitted.

Referring to FIGS. 14 to 17, the display device 10 may include a plurality of pixels SP, a plurality of gate lines GL, a plurality of first to third data lines DL1, DL2, and DL3, a plurality of vertical voltage lines VVSL, a plurality of first voltage lines VDL, a plurality of sensing lines SL, a plurality of horizontal voltage lines HVDL, a plurality of second voltage lines VSL, a plurality of gate fan-out lines GFL, first to fifth connection lines CWL1, CWL2, CWL3, CWL4, and CWL5, a plurality of data fan-out lines DFL, first to fourth connection electrodes CNE1, CNE2, CNE3, and CNE4, and dummy patterns DMP.

The plurality of gate fan-out lines GFL may supply gate signals received from the first flexible film FPCB1 to the plurality of gate lines GL. The plurality of gate fan-out lines GFL may be arranged on one side (e.g., the left side) of the display area DA. One end of the gate fan-out line GFL may be connected to the first flexible film FPCB1, and the other end of the gate fan-out line GFL may be connected to the connection line CWL. The gate fan-out line GFL may supply the gate signal to the gate line GL through the connection line CWL. The gate fan-out line GFL may be disposed in the first metal layer MTL1.

The plurality of gate fan-out lines GFL may include first to fifth gate fan-out lines GFL1, GFL2, GFL3, GFL4, and GFL5. The first gate fan-out line GFL1 may be electrically connected to the first gate line GL1 through the first connection line CWL1. The first connection line CWL1 may include a first-first connection line CWL1-1, a first-second connection line CWL1-2, and a first-third connection line CWL1-3.

The first-first connection line CWL1-1 may be inserted into a second contact hole CNT2 to be connected to the first gate fan-out line GFL1. In one or more embodiments, the second contact hole CNT2 may penetrate through the gate insulating film GI, the buffer layer BF, the third barrier insulating film BIL3, the second substrate SUB2, and the second barrier insulating film BIL2. The first-first connection line CWL1-1 may be disposed in the third metal layer MTL3 and extend in the second direction (the Y-axis direction). The first-first connection line CWL1-1 may cross the dummy patterns DMP and a fourteenth data fan-out line DFL14 disposed in the first metal layer MTL1. The first-first connection line CWL1-1 may be insulated from the dummy patterns DMP and the fourteenth data fan-out line DFL14. The first-first connection line CWL1-1 may cross the fifth gate line GL5 and the second voltage line VSL disposed in the fourth metal layer MTL4. The first-first connection line CWL1-1 may be insulated from the fifth gate line GL5 and the second voltage line VSL.

The first-second connection line CWL1-2 may be connected between the first-first connection line CWL1-1 and the first-third connection line CWL1-3. One end of the first-second connection line CWL1-2 may be inserted into a fifth contact hole CNT5 to be connected to the first-first connection line CWL1-1. In one or more embodiments, the fifth contact hole CNT5 may penetrate through the interlayer insulating film ILD. The other end of the first-second connection line CWL1-2 may be inserted into a fifth contact hole CNT5 to be connected to the first-third connection line CWL1-3. The first-second connection line CWL1-2 may be disposed in the fourth metal layer MTL4 and extend in the first direction (X-axis direction). The first-second connection line CWL1-2 may overlap the fourteenth data fan-out line DFL14 disposed in the first metal layer MTL1, and may cross eleventh to thirteenth data fan-out lines DFL11, DFL12, and DFL13, and twenty-first, twenty-second, and twenty-fourth data fan-out lines DFL21, DFL22, and DFL24 disposed in the first metal layer MTL1. The first-second connection line CWL1-2 may be insulated from the eleventh to fourteenth data fan-out lines DFL11, DFL12, DFL13, and DFL14, and the twenty-first, twenty-second, and twenty-fourth data fan-out lines DFL21, DFL22, and DFL24. The first-second connection line CWL1-2 may cross the first to third data lines DL1, DL2, and DL3, the sensing line SL, the first voltage line VDL, and the vertical voltage line VVSL disposed in the second metal layer MTL2. The first-second connection line CWL1-2 may be insulated from the first to third data lines DL1, DL2, and DL3, the sensing line SL, the first voltage line VDL, and the vertical voltage line VVSL.

The first-third connection line CWL1-3 may be connected between the first-second connection line CWL1-2 and the first gate line GL1. The first gate line GL1 may be inserted into a fifth contact hole CNT5 to be connected to the first-third connection line CWL1-3. The first-third connection line CWL1-3 may be disposed in the third metal layer MTL3 and extend in the second direction (the Y-axis direction). The first-third connection line CWL1-3 may cross twenty-second and twenty-third data fan-out lines DFL22 and DFL23, thirty-first to thirty-fourth data fan-out lines DFL31, DFL32, DFL33, and DFL34, and forty-first to forty-fourth data fan-out lines DFL41, DFL42, DFL43, and DFL44 disposed in the first metal layer MTL1. The first-third connection line CWL1-3 may be insulated from the twenty-second and twenty-third data fan-out lines DFL22 and DFL23, the thirty-first to thirty-fourth data fan-out lines DFL31, DFL32, DFL33, and DFL34, and the forty-first to forty-fourth data fan-out lines DFL41, DFL42, DFL43, and DFL44. The first-third connection line CWL1-3 may cross the second to fourth gate lines GL2, GL3, and GL4, the second voltage lines VSL, and the horizontal voltage lines HVDL disposed in the fourth metal layer MTL4. The first-third connection line CWL1-3 may be insulated from the second to fourth gate lines GL2, GL3, and GL4, the second voltage lines VSL, and the horizontal voltage lines HVDL.

The first gate fan-out line GFL1 may be connected to the first gate line GL1 through the first-first connection line CWL1-1 disposed in the third metal layer MTL3, the first-second connection line CWL1-2 disposed in the fourth metal layer MTL4, and the first-third connection line CWL1-3 disposed in the third metal layer MTL3. The first connection line CWL1 may be insulated from the plurality of data fan-out lines DFL to supply a gate signal to the first gate line GL1. Accordingly, the display device 10 may include the first connection line CWL1 disposed in the third and fourth metal layers MTL3 and MTL4 of the thin film transistor layer TFTL to electrically connect the first gate fan-out line GFL1 disposed in the display area DA to the first gate line GL1 without including a separate metal layer or mask.

The second gate fan-out line GFL2 may be electrically connected to the second gate line GL2 through the second connection line CWL2. The second connection line CWL2 may be inserted into a fourth contact hole CNT4 to be connected to the second gate fan-out line GFL2. The second gate line GL2 may be inserted into a fifth contact hole CNT5 to be connected to the second connection line CWL2. The second connection line CWL2 may be disposed in the third metal layer MTL3 and extend in the second direction (Y-axis direction). The second connection line CWL2 may cross the dummy patterns DMP, the eleventh to fourteenth data fan-out lines DFL11, DFL12, DFL13, and DFL14, and the twenty-first to twenty-fourth data fan-out lines DFL21, DFL22, DFL23, and DFL24 disposed in the first metal layer MTL1. The second connection line CWL2 may be insulated from the dummy patterns DMP, the eleventh to fourteenth data fan-out lines DFL11, DFL12, DFL13, and DFL14, and the twenty-first to twenty-fourth data fan-out lines DFL21, DFL22, DFL23, and DFL24. The second connection line CWL2 may cross the third to fifth gate lines GL3, GL4, and GL5, the second voltage lines VSL, and the horizontal voltage lines HVDL disposed in the fourth metal layer MTL4. The second connection line CWL2 may be insulated from the third to fifth gate lines GL3, GL4, and GL5, the second voltage lines VSL, and the horizontal voltage lines HVDL.

The second connection line CWL2 may be insulated from the plurality of data fan-out lines DFL to supply a gate signal to the second gate line GL2. Accordingly, the display device 10 may include the second connection line CWL2 disposed in the third metal layer MTL3 of the thin film transistor layer TFTL to electrically connect the second gate fan-out line GFL2 disposed in the display area DA to the second gate line GL2 without including a separate metal layer or mask.

The third gate fan-out line GFL3 may be electrically connected to the third gate line GL3 through the third connection line CWL3 disposed in the third metal layer MTL3. The fourth gate fan-out line GFL4 may be electrically connected to the fourth gate line GL4 through the fourth connection line CWL4 disposed in the third metal layer MTL3. The fifth gate fan-out line GFL5 may be electrically connected to the fifth gate line GL5 through the fifth connection line CWL5 disposed in the third metal layer MTL3. Accordingly, the display device 10 may include the plurality of connection lines CWL disposed in the third metal layer MTL3 of the thin film transistor layer TFTL to electrically connect the plurality of gate fan-out lines GFL disposed in the display area DA to the plurality of gate lines GL without including a separate metal layer or mask.

Figure 18:
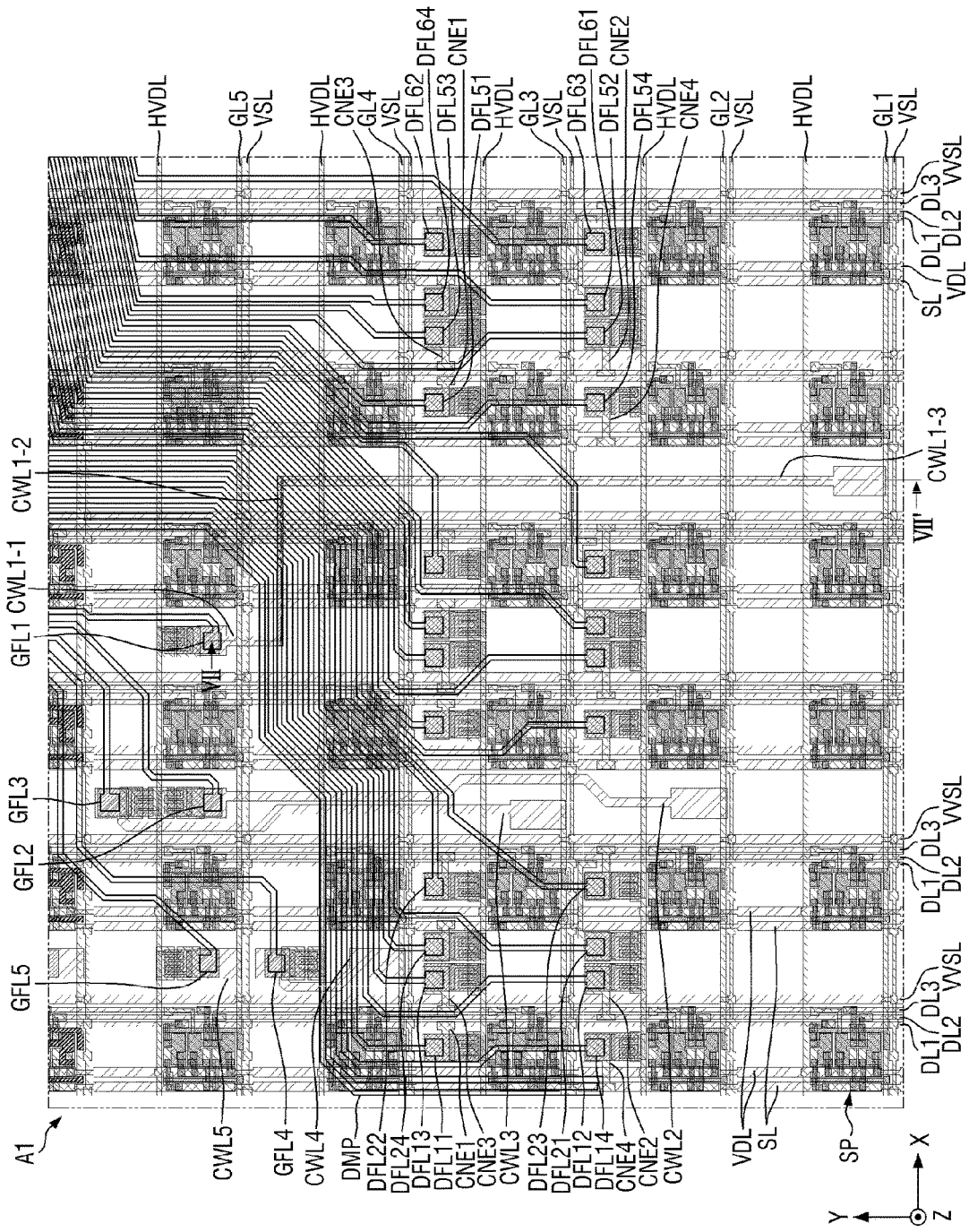
FIG. 18 is an enlarged view illustrating still another example of area A1 of FIG. 4.
Figure 19:
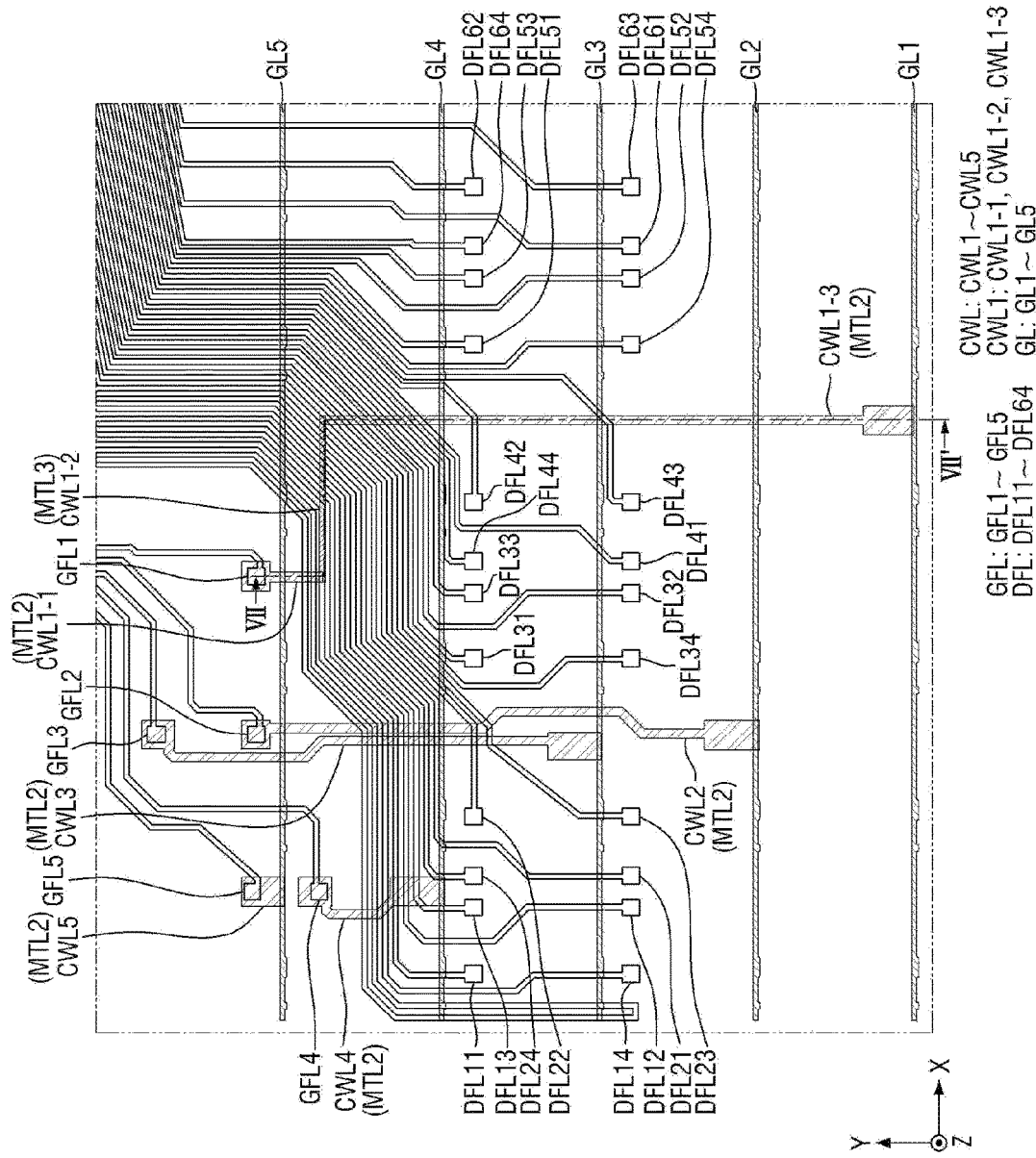
FIG. 19 is a view illustrating gate fan-out lines, data fan-out lines, connection lines, and gate lines in the display device of FIG. 18.
Figure 20:
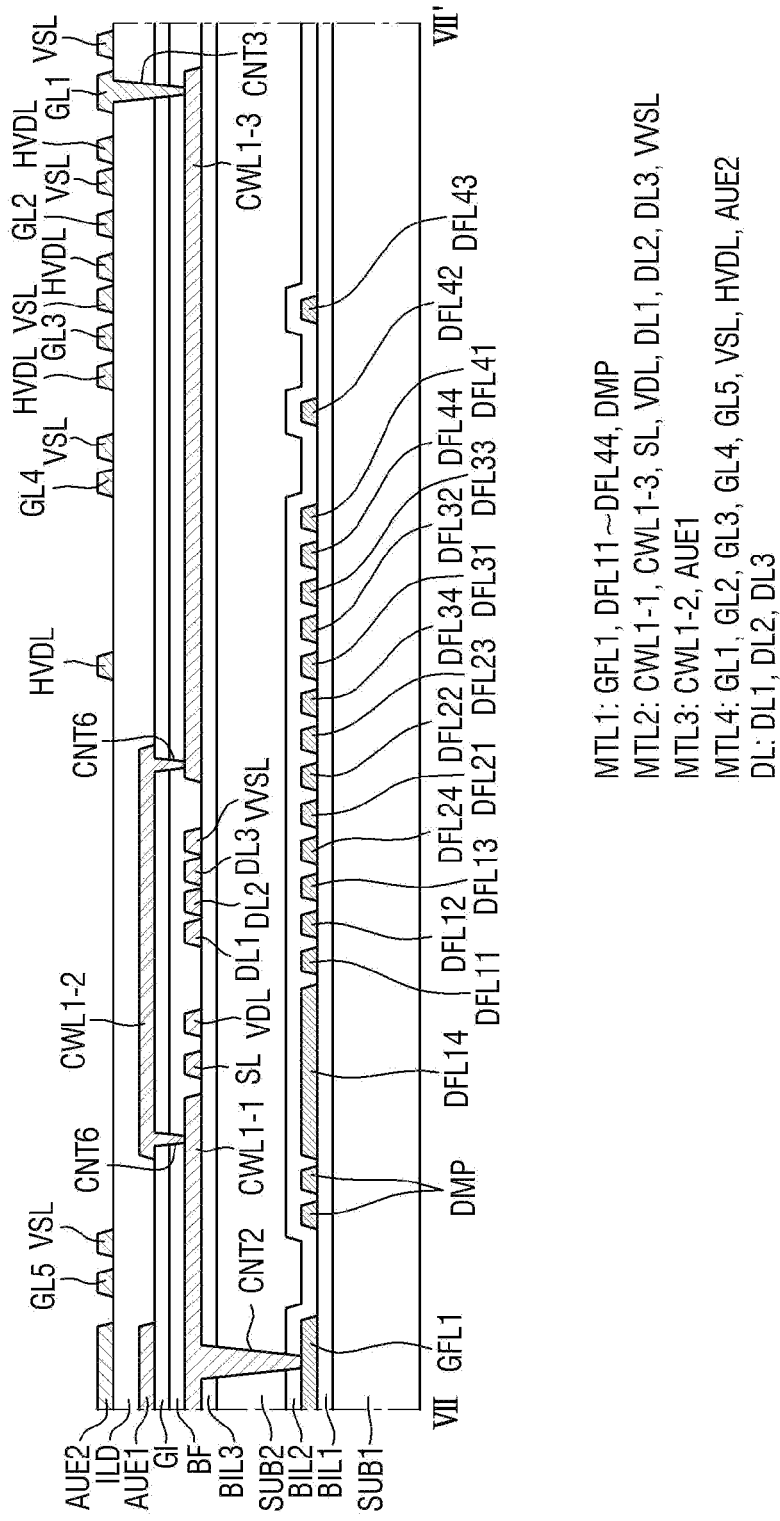
FIG. 20 is a cross-sectional view taken along the line VII-VII' of FIG. 18.

FIG. 18 is an enlarged view illustrating still another example of area A1 of FIG. 4, FIG. 19 is a view illustrating gate fan-out lines, data fan-out lines, connection lines, and gate lines in the display device of FIG. 18, and FIG. 20 is a cross-sectional view taken along the line VII-VII' of FIG. 18. A display device of FIGS. 18 to 20 is different in configurations of connection lines CWL from the display device of FIGS. 5 to 7, and the same configurations as the configurations described above may be briefly described or a description thereof may be omitted.

Referring to FIGS. 18 to 20, the display device 10 may include a plurality of pixels SP, a plurality of gate lines GL, a plurality of first to third data lines DL1, DL2, and DL3, a plurality of vertical voltage lines VVSL, a plurality of first voltage lines VDL, a plurality of sensing lines SL, a plurality of horizontal voltage lines HVDL, a plurality of second voltage lines VSL, a plurality of gate fan-out lines GFL, first to fifth connection lines CWL1, CWL2, CWL3, CWL4, and CWL5, a plurality of data fan-out lines DFL, first to fourth connection electrodes CNE1, CNE2, CNE3, and CNE4, and dummy patterns DMP.

The plurality of gate fan-out lines GFL may supply gate signals received from the first flexible film FPCB1 to the plurality of gate lines GL. The plurality of gate fan-out lines GFL may be arranged on one side (e.g., the left side) of the display area DA. One end of the gate fan-out line GFL may be connected to the first flexible film FPCB1, and the other end of the gate fan-out line GFL may be connected to the connection line CWL. The gate fan-out line GFL may supply the gate signal to the gate line GL through the connection line CWL. The gate fan-out line GFL may be disposed in the first metal layer MTL1.

The plurality of gate fan-out lines GFL may include first to fifth gate fan-out lines GFL1, GFL2, GFL3, GFL4, and GFL5. The first gate fan-out line GFL1 may be electrically connected to the first gate line GL1 through the first connection line CWL1. The first connection line CWL1 may include a first-first connection line CWL1-1, a first-second connection line CWL1-2, and a first-third connection line CWL1-3.

The first-first connection line CWL1-1 may be inserted into a second contact hole CNT2 to be connected to the first gate fan-out line GFL1. The first-first connection line CWL1-1 may be disposed in the second metal layer MTL2 and extend in the second direction (the Y-axis direction). The first-first connection line CWL1-1 may cross the dummy patterns DMP and a fourteenth data fan-out line DFL14 disposed in the first metal layer MTL1. The first-first connection line CWL1-1 may be insulated from the dummy patterns DMP and the fourteenth data fan-out line DFL14.

The first-first connection line CWL1-1 may cross the fifth gate line GL5 and the second voltage line VSL disposed in the fourth metal layer MTL4. The first-first connection line CWL1-1 may be insulated from the fifth gate line GL5 and the second voltage line VSL.

The first-second connection line CWL1-2 may be connected between the first-first connection line CWL1-1 and the first-third connection line CWL1-3. One end of the first-second connection line CWL1-2 may be inserted into a sixth contact hole CNT6 to be connected to the first-first connection line CWL1-1. The other end of the first-second connection line CWL1-2 may be inserted into a sixth contact hole CNT6 to be connected to the first-third connection line CWL1-3. The first-second connection line CWL1-2 may be disposed in the third metal layer MTL3 and extend in the first direction (X-axis direction). The first-second connection line CWL1-2 may overlap the fourteenth data fan-out line DFL14 disposed in the first metal layer MTL1, and may cross eleventh to thirteenth data fan-out lines DFL11, DFL12, and DFL13, and twenty-first, twenty-second, and twenty-fourth data fan-out lines DFL21, DFL22, and DFL24 disposed in the first metal layer MTL1. The first-second connection line CWL1-2 may be insulated from the eleventh to fourteenth data fan-out lines DFL11, DFL12, DFL13, and DFL14, and the twenty-first, twenty-second, and twenty-fourth data fan-out lines DFL21, DFL22, and DFL24. The first-second connection line CWL1-2 may cross the first to third data lines DL1, DL2, and DL3, the sensing line SL, the first voltage line VDL, and the vertical voltage line WSL disposed in the second metal layer MTL2. The first-second connection line CWL1-2 may be insulated from the first to third data lines DL1, DL2, and DL3, the sensing line SL, the first voltage line VDL, and the vertical voltage line WSL.

The first-third connection line CWL1-3 may be connected between the first-second connection line CWL1-2 and the first gate line GL1. The first gate line GL1 may be inserted into a third contact hole CNT3 to be connected to the first-third connection line CWL1-3. The first-third connection line CWL1-3 may be disposed in the second metal layer MTL2 and extend in the second direction (Y-axis direction). The first-third connection line CWL1-3 may cross twenty-second and twenty-third data fan-out lines DFL22 and DFL23, thirty-first to thirty-fourth data fan-out lines DFL31, DFL32, DFL33, and DFL34, and forty-first to forty-fourth data fan-out lines DFL41, DFL42, DFL43, and DFL44 disposed in the first metal layer MTL1. The first-third connection line CWL1-3 may be insulated from the twenty-second and twenty-third data fan-out lines DFL22 and DFL23, the thirty-first to thirty-fourth data fan-out lines DFL31, DFL32, DFL33, and DFL34, and the forty-first to forty-fourth data fan-out lines DFL41, DFL42, DFL43, and DFL44. The first-third connection line CWL1-3 may cross the second to fourth gate lines GL2, GL3, and GL4, the second voltage lines VSL, and the horizontal voltage lines HVDL disposed in the fourth metal layer MTL4. The first-third connection line CWL1-3 may be insulated from the second to fourth gate lines GL2, GL3, and GL4, the second voltage lines VSL, and the horizontal voltage lines HVDL.

The first gate fan-out line GFL1 may be connected to the first gate line GL1 through the first-first connection line CWL1-1 disposed in the second metal layer MTL2, the first-second connection line CWL1-2 disposed in the third metal layer MTL3, and the first-third connection line CWL1-3 disposed in the second metal layer MTL2. The first connection line CWL1 may be insulated from the plurality of data fan-out lines DFL to supply a gate signal to the first gate line GL1. Accordingly, the display device 10 may include the first connection line CWL1 disposed in the second and third metal layers MTL2 and MTL3 of the thin film transistor layer TFTL to electrically connect the first gate fan-out line GFL1 disposed in the display area DA to the first gate line GL1 without including a separate metal layer or mask.

The second gate fan-out line GFL2 may be electrically connected to the second gate line GL2 through the second connection line CWL2 disposed in the second metal layer MTL2. The third gate fan-out line GFL3 may be electrically connected to the third gate line GL3 through the third connection line CWL3 disposed in the second metal layer MTL2. The fourth gate fan-out line GFL4 may be electrically connected to the fourth gate line GL4 through the fourth connection line CWL4 disposed in the second metal layer MTL2. The fifth gate fan-out line GFL5 may be electrically connected to the fifth gate line GL5 through the fifth connection line CWL5 disposed in the second metal layer MTL2. Accordingly, the display device 10 may include the plurality of connection lines CWL disposed in the second metal layer MTL2 of the thin film transistor layer TFTL to electrically connect the plurality of gate fan-out lines GFL disposed in the display area DA to the plurality of gate lines GL without including a separate metal layer or mask.

Figure 21:
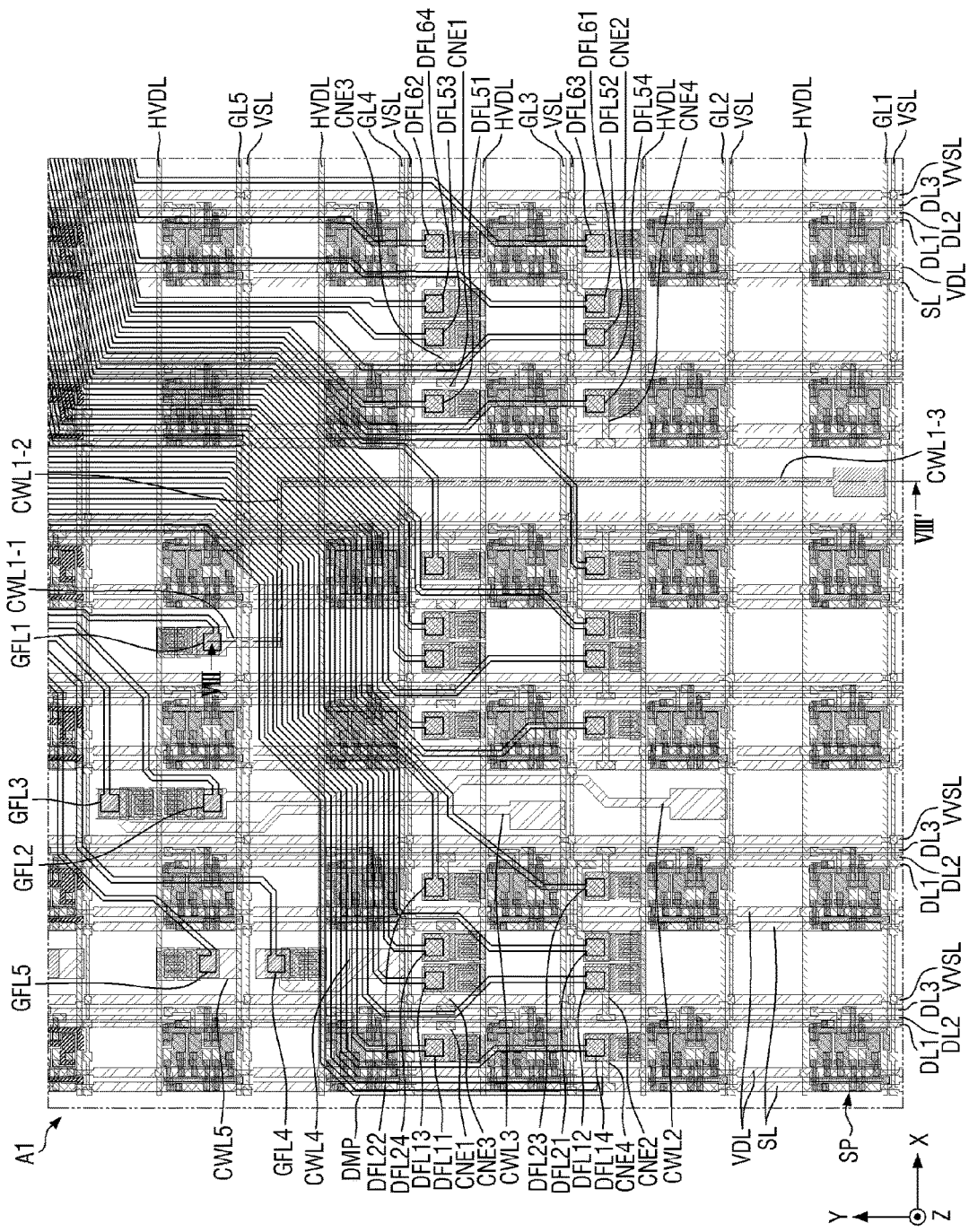
FIG. 21 is an enlarged view illustrating still another example of area A1 of FIG. 4.
Figure 22:
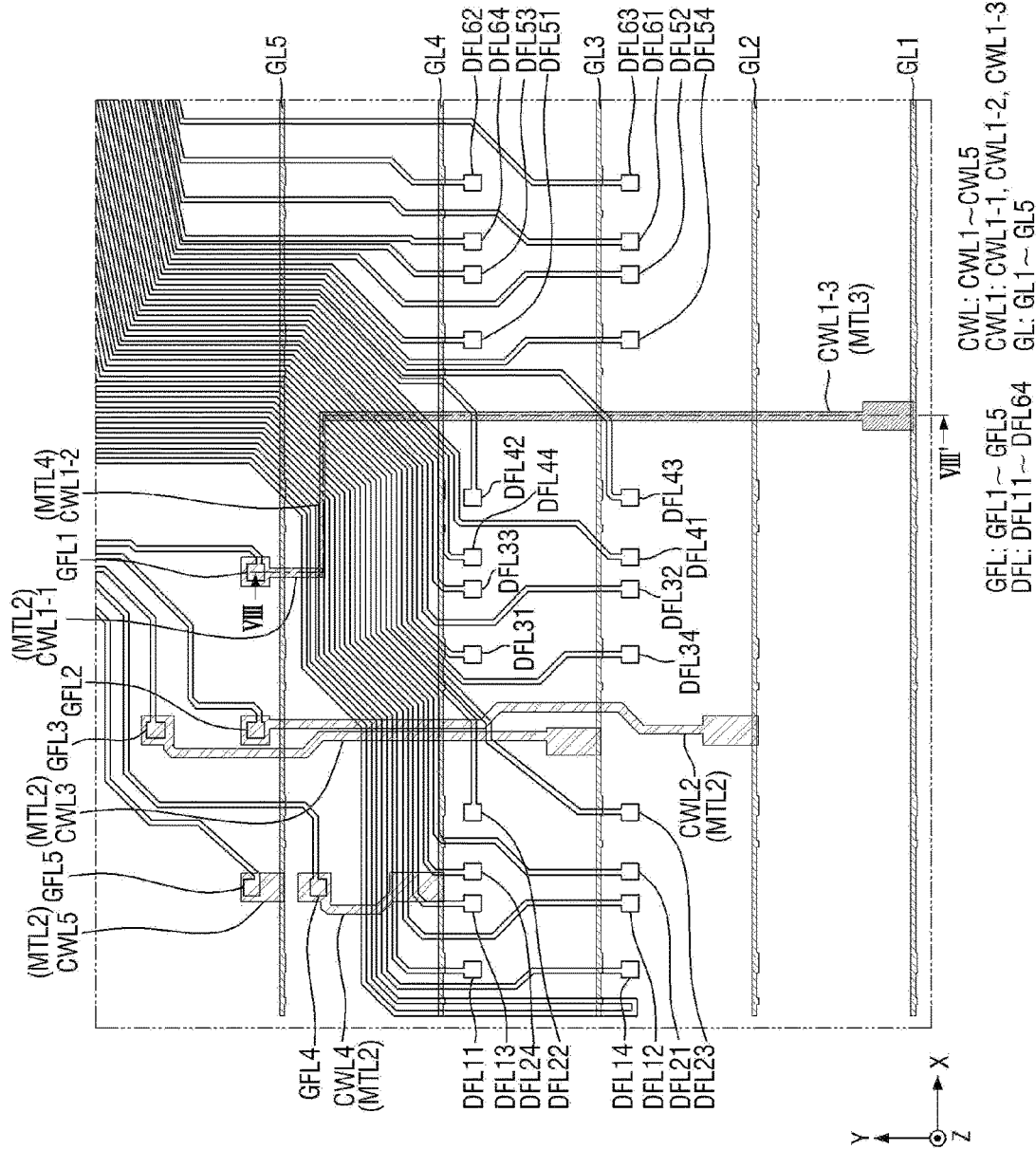
FIG. 22 is a view illustrating gate fan-out lines, data fan-out lines, connection lines, and gate lines in the display device of FIG. 21.
Figure 23:
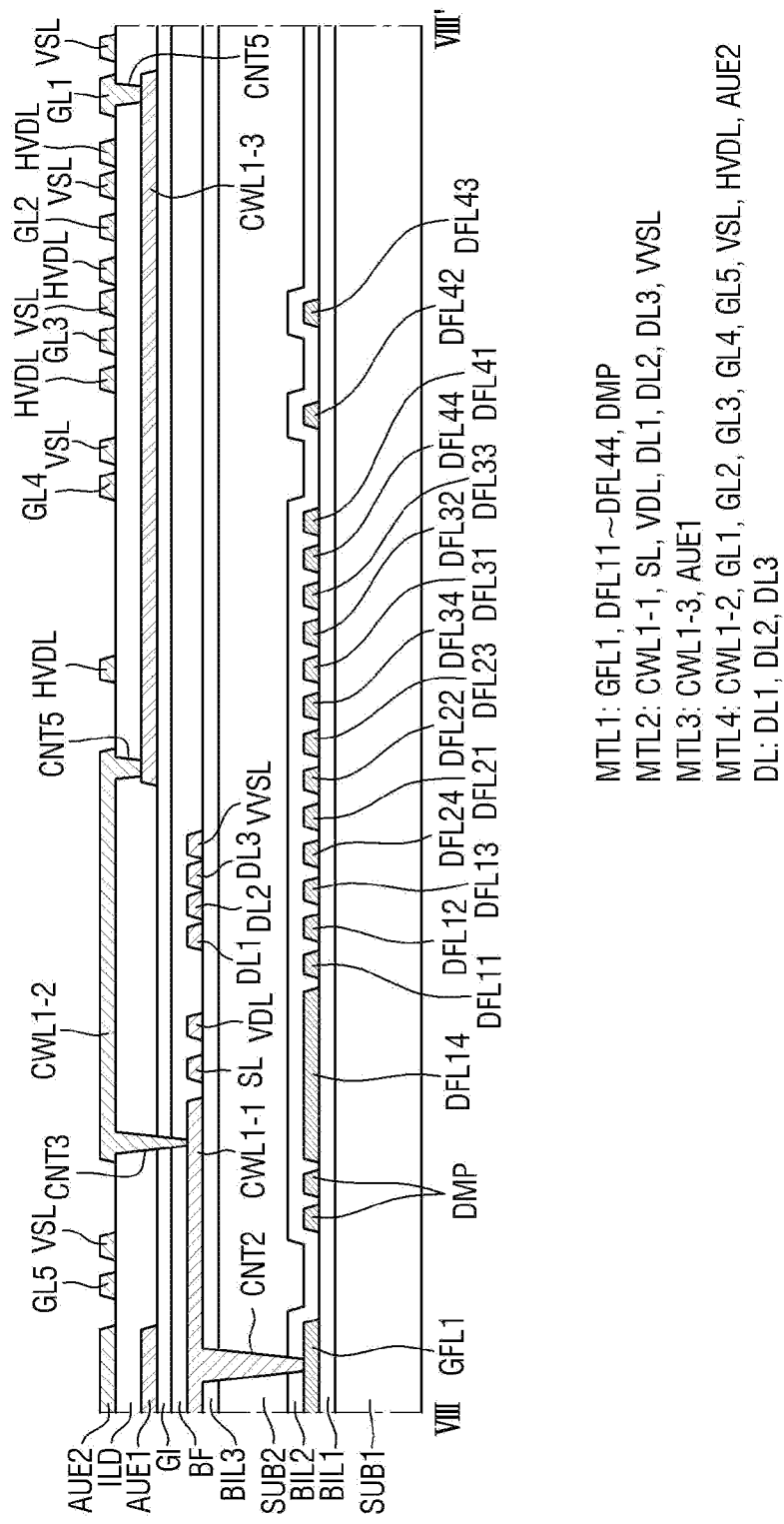
FIG. 23 is a cross-sectional view taken along the line VIII-VIII' of FIG. 21.

FIG. 21 is an enlarged view illustrating still another example of area A1 of FIG. 4, FIG. 22 is a view illustrating gate fan-out lines, data fan-out lines, connection lines, and gate lines in the display device of FIG. 21, and FIG. 23 is a cross-sectional view taken along the line VIII-VIII' of FIG. 21. A display device of FIGS. 21 to 23 is different in configurations of connection lines CWL from the display device of FIGS. 5 to 7, and the same configurations as the configurations described above may be briefly described or a description thereof may be omitted.

Referring to FIGS. 21 to 23, the display device 10 may include a plurality of pixels SP, a plurality of gate lines GL, a plurality of first to third data lines DL1, DL2, and DL3, a plurality of vertical voltage lines VVSL, a plurality of first voltage lines VDL, a plurality of sensing lines SL, a plurality of horizontal voltage lines HVDL, a plurality of second voltage lines VSL, a plurality of gate fan-out lines GFL, first to fifth connection lines CWL1, CWL2, CWL3, CWL4, and CWL5, a plurality of data fan-out lines DFL, first to fourth connection electrodes CNE1, CNE2, CNE3, and CNE4, and dummy patterns DMP.

The plurality of gate fan-out lines GFL may supply gate signals received from the first flexible film FPCB1 to the plurality of gate lines GL. The plurality of gate fan-out lines GFL may be arranged on one side (e.g., the left side) of the display area DA. One end of the gate fan-out line GFL may be connected to the first flexible film FPCB1, and the other end of the gate fan-out line GFL may be connected to the connection line CWL. The gate fan-out line GFL may supply the gate signal to the gate line GL through the connection line CWL. The gate fan-out line GFL may be disposed in the first metal layer MTL1.

The plurality of gate fan-out lines GFL may include first to fifth gate fan-out lines GFL1, GFL2, GFL3, GFL4, and GFL5. The first gate fan-out line GFL1 may be electrically connected to the first gate line GL1 through the first connection line CWL1. The first connection line CWL1 may include a first-first connection line CWL1-1, a first-second connection line CWL1-2, and a first-third connection line CWL1-3.

The first-first connection line CWL1-1 may be inserted into a second contact hole CNT2 to be connected to the first gate fan-out line GFL1. The first-first connection line CWL1-1 may be disposed in the second metal layer MTL2 and extend in the second direction (the Y-axis direction). The first-first connection line CWL1-1 may cross the dummy patterns DMP and a fourteenth data fan-out line DFL14 disposed in the first metal layer MTL1. The first-first connection line CWL1-1 may be insulated from the dummy patterns DMP and the fourteenth data fan-out line DFL14. The first-first connection line CWL1-1 may cross the fifth gate line GL5 and the second voltage line VSL disposed in the fourth metal layer MTL4. The first-first connection line CWL1-1 may be insulated from the fifth gate line GL5 and the second voltage line VSL.

The first-second connection line CWL1-2 may be connected between the first-first connection line CWL1-1 and the first-third connection line CWL1-3. One end of the first-second connection line CWL1-2 may be inserted into a third contact hole CNT3 to be connected to the first-first connection line CWL1-1. The other end of the first-second connection line CWL1-2 may be inserted into a fifth contact hole CNT5 to be connected to the first-third connection line CWL1-3. The first-second connection line CWL1-2 may be disposed in the fourth metal layer MTL4 and extend in the first direction (X-axis direction). The first-second connection line CWL1-2 may overlap the fourteenth data fan-out line DFL14 disposed in the first metal layer MTL1, and may cross eleventh to thirteenth data fan-out lines DFL11, DFL12, and DFL13, and twenty-first, twenty-second, and twenty-fourth data fan-out lines DFL21, DFL22, and DFL24 disposed in the first metal layer MTL1. The first-second connection line CWL1-2 may be insulated from the eleventh to fourteenth data fan-out lines DFL11, DFL12, DFL13, and DFL14, and the twenty-first, twenty-second, and twenty-fourth data fan-out lines DFL21, DFL22, and DFL24. The first-second connection line CWL1-2 may cross the first to third data lines DL1, DL2, and DL3, the sensing line SL, the first voltage line VDL, and the vertical voltage line WSL disposed in the second metal layer MTL2. The first-second connection line CWL1-2 may be insulated from the first to third data lines DL1, DL2, and DL3, the sensing line SL, the first voltage line VDL, and the vertical voltage line WSL.

The first-third connection line CWL1-3 may be connected between the first-second connection line CWL1-2 and the first gate line GL1. The first gate line GL1 may be inserted into a fifth contact hole CNT5 to be connected to the first-third connection line CWL1-3. The first-third connection line CWL1-3 may be disposed in the third metal layer MTL3 and extend in the second direction (the Y-axis direction). The first-third connection line CWL1-3 may cross twenty-second and twenty-third data fan-out lines DFL22 and DFL23, thirty-first to thirty-fourth data fan-out lines DFL31, DFL32, DFL33, and DFL34, and forty-first to forty-fourth data fan-out lines DFL41, DFL42, DFL43, and DFL44 disposed in the first metal layer MTL1. The first-third connection line CWL1-3 may be insulated from the twenty-second and twenty-third data fan-out lines DFL22 and DFL23, the thirty-first to thirty-fourth data fan-out lines DFL31, DFL32, DFL33, and DFL34, and the forty-first to forty-fourth data fan-out lines DFL41, DFL42, DFL43, and DFL44. The first-third connection line CWL1-3 may cross the second to fourth gate lines GL2, GL3, and GL4, the second voltage lines VSL, and the horizontal voltage lines HVDL disposed in the fourth metal layer MTL4. The first-third connection line CWL1-3 may be insulated from the second to fourth gate lines GL2, GL3, and GL4, the second voltage lines VSL, and the horizontal voltage lines HVDL.

The first gate fan-out line GFL1 may be connected to the first gate line GL1 through the first-first connection line CWL1-1 disposed in the second metal layer MTL2, the first-second connection line CWL1-2 disposed in the fourth metal layer MTL4, and the first-third connection line CWL1-3 disposed in the third metal layer MTL3. The first connection line CWL1 may be insulated from the plurality of data fan-out lines DFL to supply a gate signal to the first gate line GL1. Accordingly, the display device 10 may include the first connection line CWL1 disposed in the second to fourth metal layers MTL2, MTL3, and MTL4 of the thin film transistor layer TFTL to electrically connect the first gate fan-out line GFL1 disposed in the display area DA to the first gate line GL1 without including a separate metal layer or mask.

The second gate fan-out line GFL2 may be electrically connected to the second gate line GL2 through the second connection line CWL2 disposed in the second metal layer MTL2. The third gate fan-out line GFL3 may be electrically connected to the third gate line GL3 through the third connection line CWL3 disposed in the second metal layer MTL2. The fourth gate fan-out line GFL4 may be electrically connected to the fourth gate line GL4 through the fourth connection line CWL4 disposed in the second metal layer MTL2. The fifth gate fan-out line GFL5 may be electrically connected to the fifth gate line GL5 through the fifth connection line CWL5 disposed in the second metal layer MTL2. Accordingly, the display device 10 may include the plurality of connection lines CWL disposed in the second metal layer MTL2 of the thin film transistor layer TFTL to electrically connect the plurality of gate fan-out lines GFL disposed in the display area DA to the plurality of gate lines GL without including a separate metal layer or mask.

Figure 24:
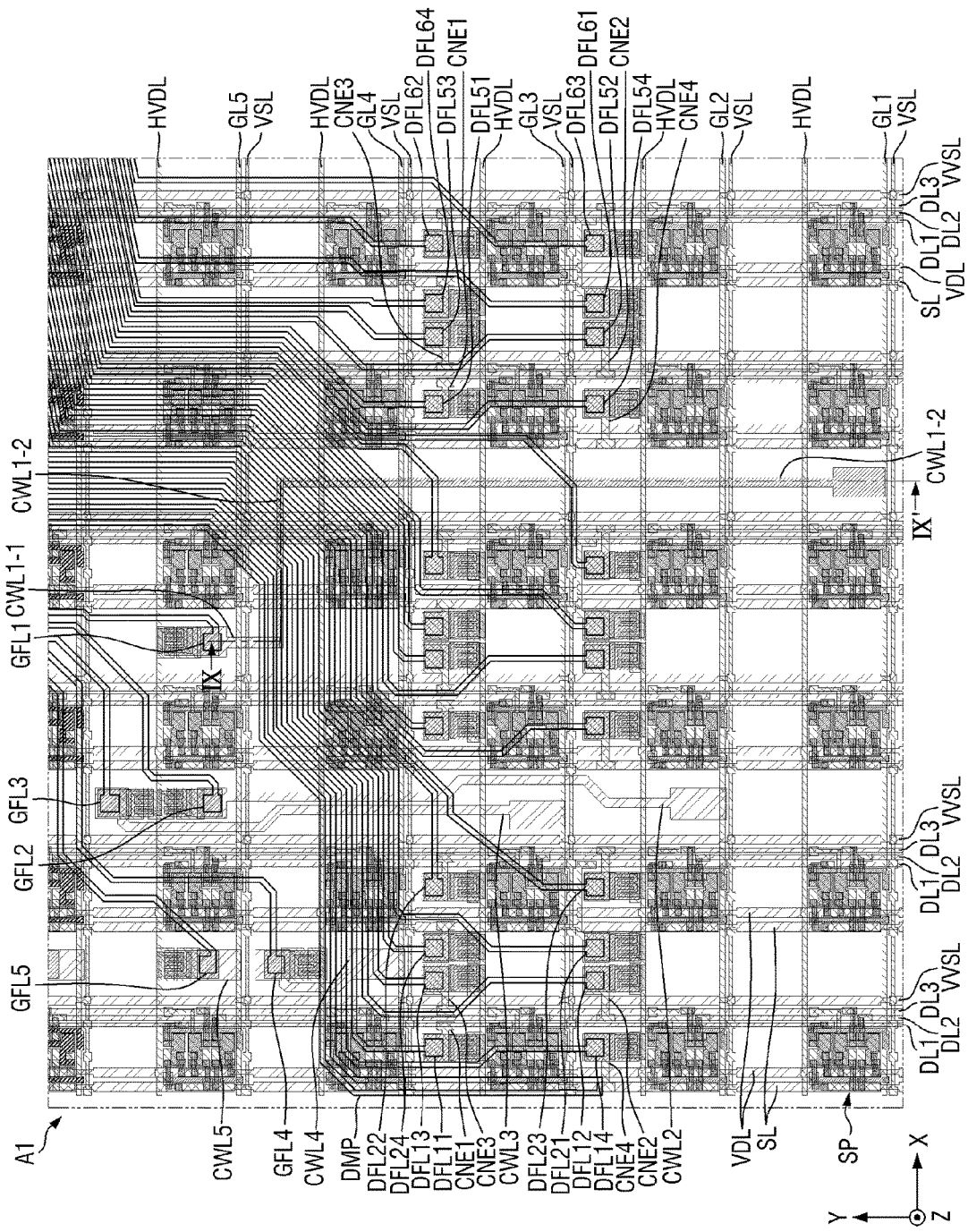
FIG. 24 is an enlarged view illustrating still another example of area A1 of FIG. 4.
Figure 25:
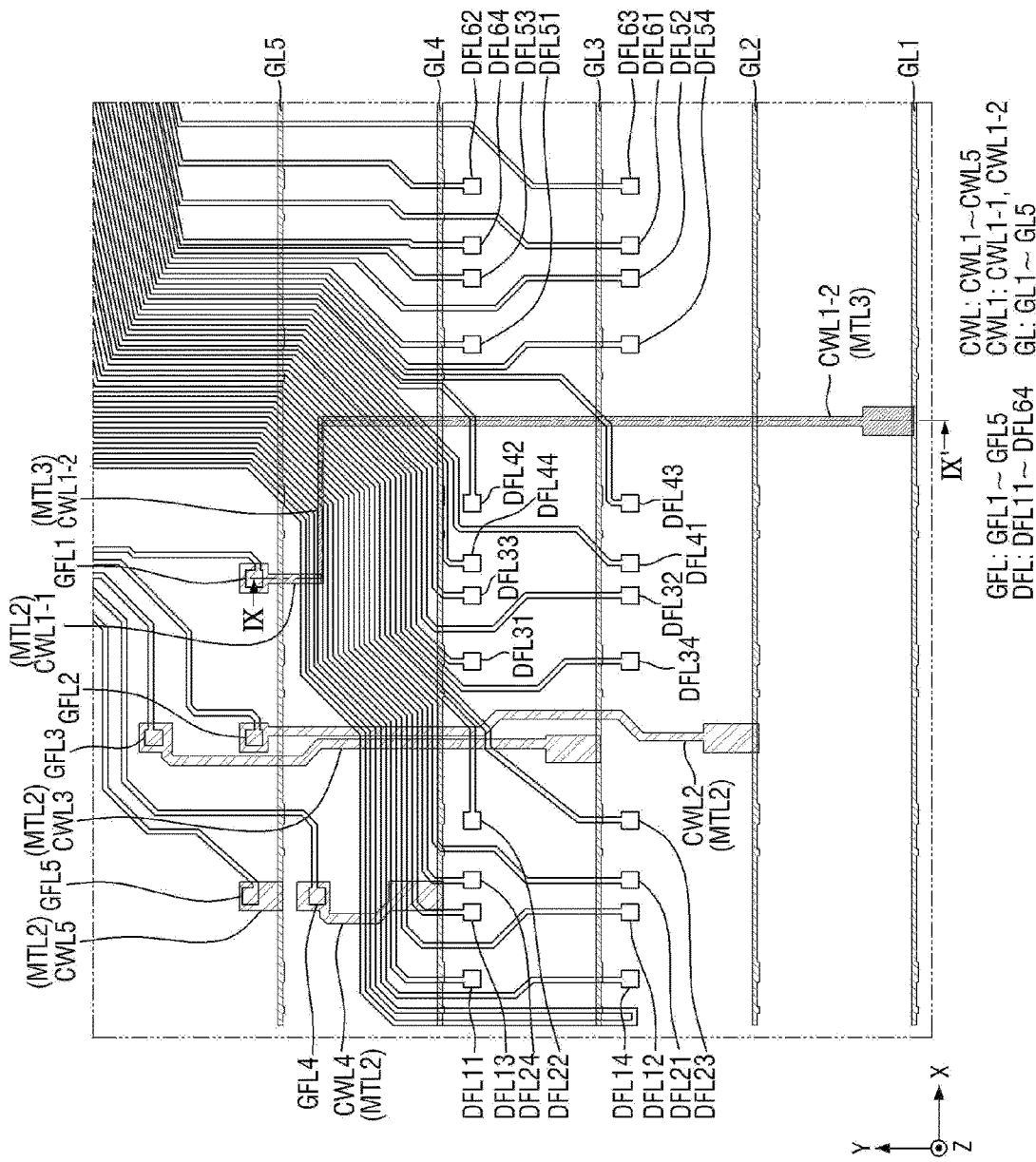
FIG. 25 is a view illustrating gate fan-out lines, data fan-out lines, connection lines, and gate lines in the display device of FIG. 24.
Figure 26:
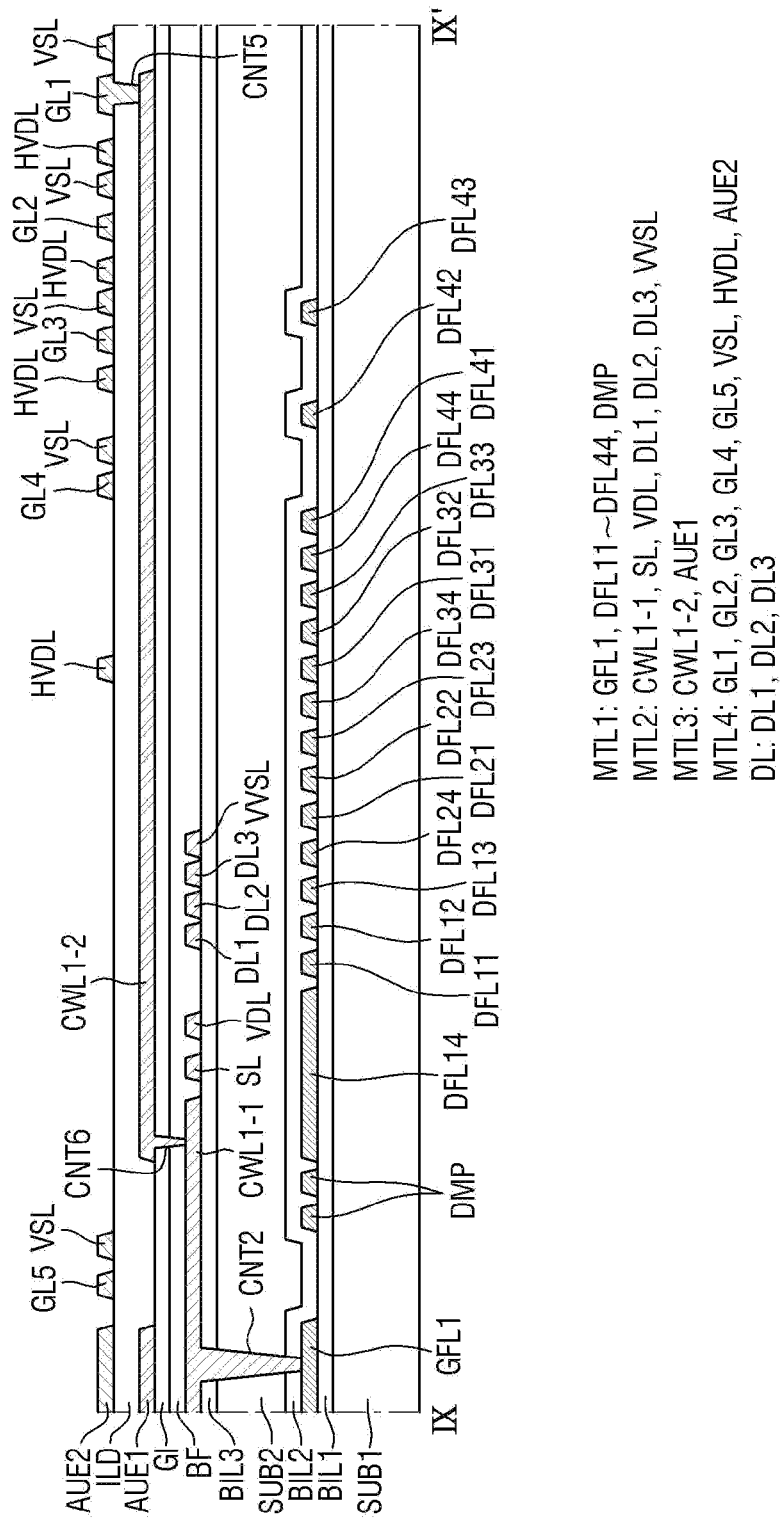
FIG. 26 is a cross-sectional view taken along the line IX-IX' of FIG. 24.

FIG. 24 is an enlarged view illustrating still another example of area A1 of FIG. 4, FIG. 25 is a view illustrating gate fan-out lines, data fan-out lines, connection lines, and gate lines in the display device of FIG. 24, and FIG. 26 is a cross-sectional view taken along the line IX-IX' of FIG. 24. A display device of FIGS. 24 to 26 is different in configurations of connection lines CWL from the display device of FIGS. 5 to 7, and the same configurations as the configurations described above may be briefly described or a description thereof may be omitted.

Referring to FIGS. 24 to 26, the display device 10 may include a plurality of pixels SP, a plurality of gate lines GL, a plurality of first to third data lines DL1, DL2, and DL3, a plurality of vertical voltage lines VVSL, a plurality of first voltage lines VDL, a plurality of sensing lines SL, a plurality of horizontal voltage lines HVDL, a plurality of second voltage lines VSL, a plurality of gate fan-out lines GFL, first to fifth connection lines CWL1, CWL2, CWL3, CWL4, and CWL5, a plurality of data fan-out lines DFL, first to fourth connection electrodes CNE1, CNE2, CNE3, and CNE4, and dummy patterns DMP.

The plurality of gate fan-out lines GFL may supply gate signals received from the first flexible film FPCB1 to the plurality of gate lines GL. The plurality of gate fan-out lines GFL may be arranged on one side (e.g., the left side) of the display area DA. One end of the gate fan-out line GFL may be connected to the first flexible film FPCB1, and the other end of the gate fan-out line GFL may be connected to the connection line CWL. The gate fan-out line GFL may supply the gate signal to the gate line GL through the connection line CWL. The gate fan-out line GFL may be disposed in the first metal layer MTL1.

The plurality of gate fan-out lines GFL may include first to fifth gate fan-out lines GFL1, GFL2, GFL3, GFL4, and GFL5. The first gate fan-out line GFL1 may be electrically connected to the first gate line GL1 through the first connection line CWL1. The first connection line CWL1 may include a first-first connection line CWL1-1 and a first-second connection line CWL1-2.

The first-first connection line CWL1-1 may be inserted into a second contact hole CNT2 to be connected to the first gate fan-out line GFL1. The first-first connection line CWL1-1 may be disposed in the second metal layer MTL2 and extend in the second direction (the Y-axis direction). The first-first connection line CWL1-1 may cross the dummy patterns DMP and a fourteenth data fan-out line DFL14 disposed in the first metal layer MTL1. The first-first connection line CWL1-1 may be insulated from the dummy patterns DMP and the fourteenth data fan-out line DFL14. The first-first connection line CWL1-1 may cross the fifth gate line GL5 and the second voltage line VSL disposed in the fourth metal layer MTL4. The first-first connection line CWL1-1 may be insulated from the fifth gate line GL5 and the second voltage line VSL.

The first-second connection line CWL1-2 may be connected between the first-first connection line CWL1-1 and the first gate line GL1. One end of the first-second connection line CWL1-2 may be inserted into a sixth contact hole CNT6 to be connected to the first-first connection line CWL1-1. The first gate line GL1 may be inserted into a fifth contact hole CNT5 to be connected to the other end of the first-second connection line CWL1-2. The first-second connection line CWL1-2 may extend in the first direction (X-axis direction) and be then bent in the third metal layer MTL3, and may extend in an opposite direction to the second direction (Y-axis direction). The first-second connection line CWL1-2 may overlap the fourteenth data fan-out line DFL14 disposed in the first metal layer MTL1, and may cross eleventh to thirteenth data fan-out lines DFL11, DFL12, and DFL13, twenty-first to twenty-fourth data fan-out lines DFL21, DFL22, DFL23, and DFL24, thirty-first to thirty-fourth data fan-out lines DFL31, DFL32, DFL33, and DFL34, and forty-first to forty-fourth data fan-out lines DFL41, DFL42, DFL43, and DFL44 disposed in the first metal layer MTL1. The first-second connection line CWL1-2 may be insulated from the eleventh to fourteenth data fan-out lines DFL11, DFL12, DFL13, and DFL14, the twenty-first to twenty-fourth data fan-out lines DFL21, DFL22, DFL23, and DFL24, the thirty-first to thirty-fourth data fan-out lines DFL31, DFL32, DFL33, and DFL34, and the forty-first to forty-fourth data fan-out lines DFL41, DFL42, DFL43, and DFL44. The first-second connection line CWL1-2 may cross the first to third data lines DL1, DL2, and DL3, the sensing line SL, the first voltage line VDL, and the vertical voltage line VVSL disposed in the second metal layer MTL2. The first-second connection line CWL1-2 may be insulated from the first to third data lines DL1, DL2, and DL3, the sensing line SL, the first voltage line VDL, and the vertical voltage line VVSL. The first-second connection line CWL1-2 may cross the second to fourth gate lines GL2, GL3, and GL4, the second voltage lines VSL, and the horizontal voltage lines HVDL disposed in the fourth metal layer MTL4. The first-second connection line CWL1-2 may be insulated from the second to fourth gate lines GL2, GL3, and GL4, the second voltage lines VSL, and the horizontal voltage lines HVDL.

The first gate fan-out line GFL1 may be connected to the first gate line GL1 through the first-first connection line CWL1-1 disposed in the second metal layer MTL2 and the first-second connection line CWL1-2 disposed in the third metal layer MTL3. The first connection line CWL1 may be insulated from the plurality of data fan-out lines DFL to supply a gate signal to the first gate line GL1. Accordingly, the display device 10 may include the first connection line CWL1 disposed in the second and third metal layers MTL2 and MTL3 of the thin film transistor layer TFTL to electrically connect the first gate fan-out line GFL1 disposed in the display area DA to the first gate line GL1 without including a separate metal layer or mask.

The second gate fan-out line GFL2 may be electrically connected to the second gate line GL2 through the second connection line CWL2 disposed in the second metal layer MTL2. The third gate fan-out line GFL3 may be electrically connected to the third gate line GL3 through the third connection line CWL3 disposed in the second metal layer MTL2. The fourth gate fan-out line GFL4 may be electrically connected to the fourth gate line GL4 through the fourth connection line CWL4 disposed in the second metal layer MTL2. The fifth gate fan-out line GFL5 may be electrically connected to the fifth gate line GL5 through the fifth connection line CWL5 disposed in the second metal layer MTL2. Accordingly, the display device 10 may include the plurality of connection lines CWL disposed in the second metal layer MTL2 of the thin film transistor layer TFTL to electrically connect the plurality of gate fan-out lines GFL disposed in the display area DA to the plurality of gate lines GL without including a separate metal layer or mask.

Figure 27:
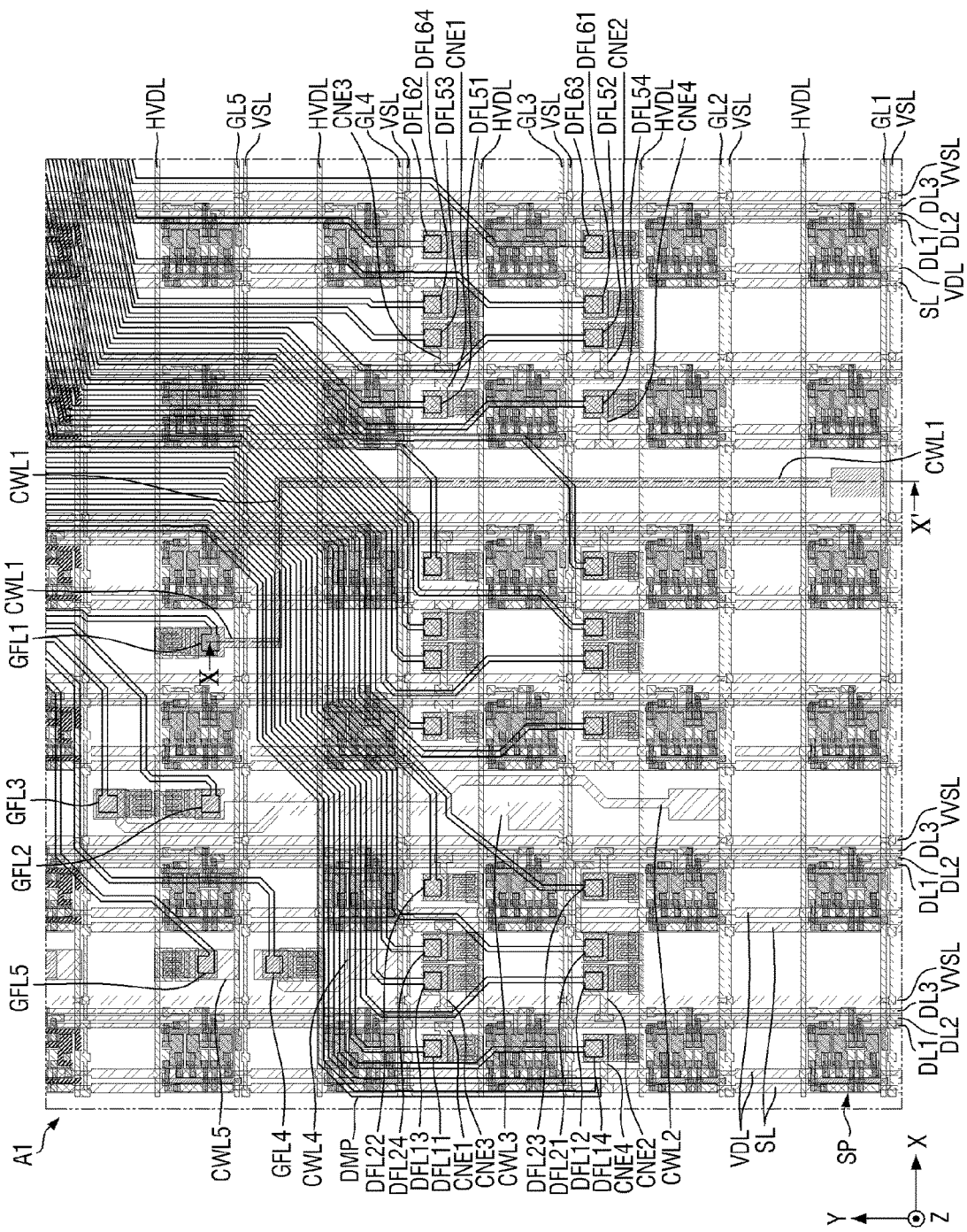
FIG. 27 is an enlarged view illustrating still another example of area A1 of FIG. 4.
Figure 28:
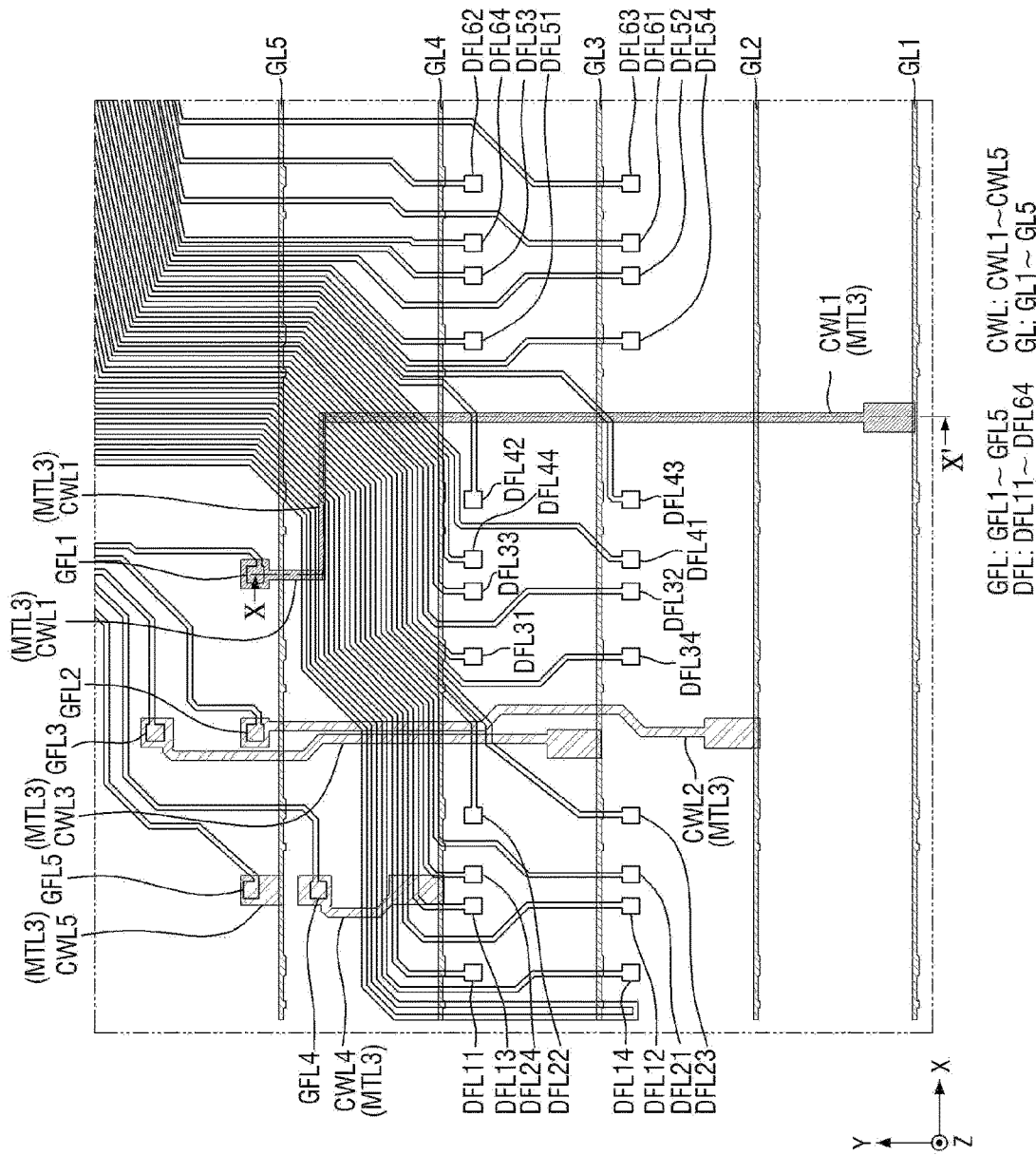
FIG. 28 is a view illustrating gate fan-out lines, data fan-out lines, connection lines, and gate lines in the display device of FIG. 27.
Figure 29:
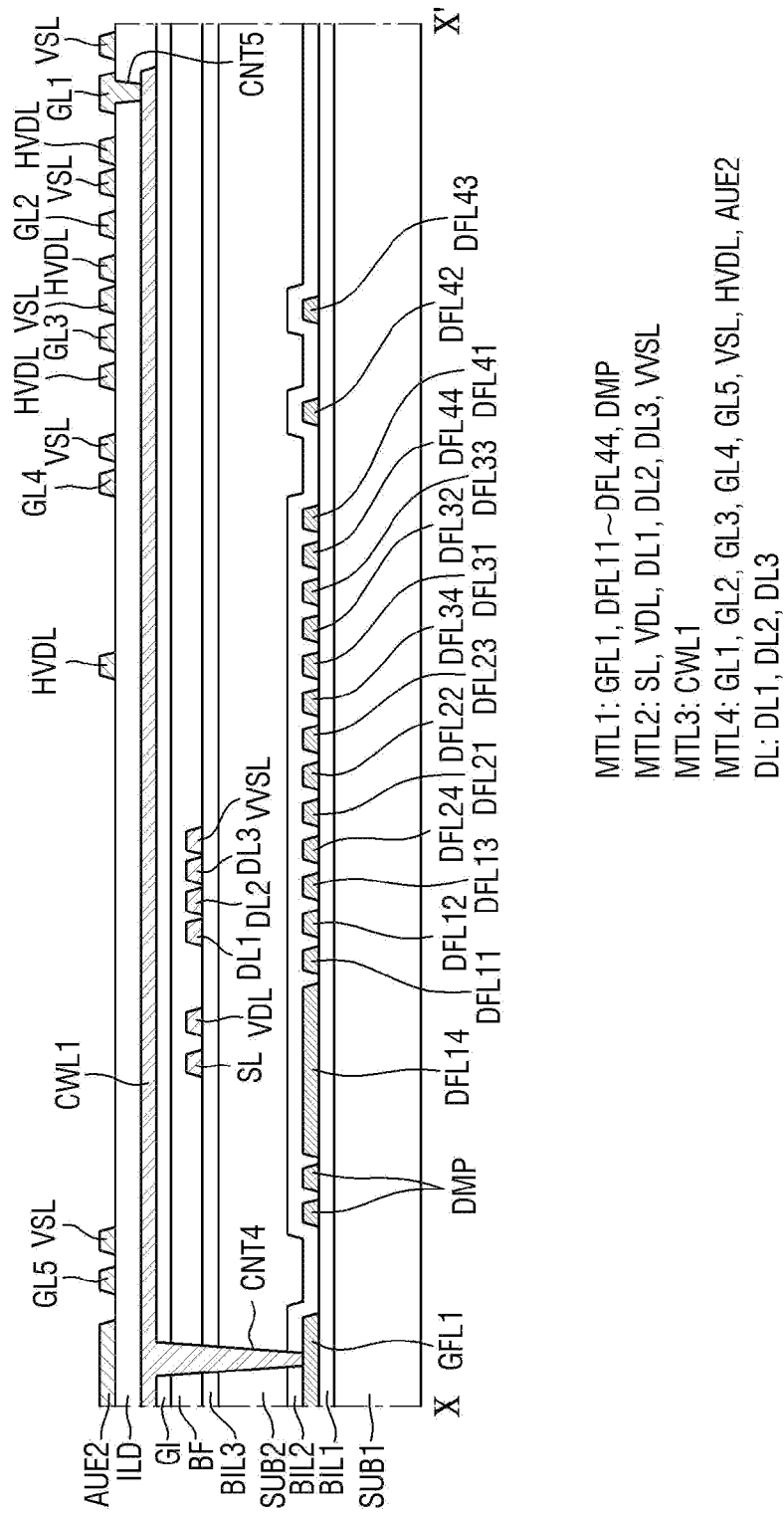
FIG. 29 is a cross-sectional view taken along the line X-X' of FIG. 27.

FIG. 27 is an enlarged view illustrating still another example of area A1 of FIG. 4, FIG. 28 is a view illustrating gate fan-out lines, data fan-out lines, connection lines, and gate lines in the display device of FIG. 27, and FIG. 29 is a cross-sectional view taken along the line X-X' of FIG. 27. A display device of FIGS. 27 to 29 is different in configurations of connection lines CWL from the display device of FIGS. 5 to 7, and the same configurations as the configurations described above may be briefly described or a description thereof may be omitted.

Referring to FIGS. 27 to 29, the display device 10 may include a plurality of pixels SP, a plurality of gate lines GL, a plurality of first to third data lines DL1, DL2, and DL3, a plurality of vertical voltage lines VVSL, a plurality of first voltage lines VDL, a plurality of sensing lines SL, a plurality of horizontal voltage lines HVDL, a plurality of second voltage lines VSL, a plurality of gate fan-out lines GFL, first to fifth connection lines CWL1, CWL2, CWL3, CWL4, and CWL5, a plurality of data fan-out lines DFL, first to fourth connection electrodes CNE1, CNE2, CNE3, and CNE4, and dummy patterns DMP.

The plurality of gate fan-out lines GFL may supply gate signals received from the first flexible film FPCB1 to the plurality of gate lines GL. The plurality of gate fan-out lines GFL may be arranged on one side (e.g., the left side) of the display area DA. One end of the gate fan-out line GFL may be connected to the first flexible film FPCB1, and the other end of the gate fan-out line GFL may be connected to the connection line CWL. The gate fan-out line GFL may supply the gate signal to the gate line GL through the connection line CWL. The gate fan-out line GFL may be disposed in the first metal layer MTL1.

The plurality of gate fan-out lines GFL may include first to fifth gate fan-out lines GFL1, GFL2, GFL3, GFL4, and GFL5. The first gate fan-out line GFL1 may be electrically connected to the first gate line GL1 through the first connection line CWL1.

One end of the first connection line CWL1 may be inserted into a fourth contact hole CNT4 to be connected to the first gate fan-out line GFL1. The first gate line GL1 may be inserted into a fifth contact hole CNT5 to be connected to the other end of the first connection line CWL1. The first connection line CWL1 may be disposed in the third metal layer MTL3 and extend in an opposite direction to the second direction (Y-axis direction) and be then bent toward the first side, extend in the first direction (X-axis direction) and be then bent to a second side, which is an opposite side to the first side, and extend in the opposite direction to the second direction (Y-axis direction). The first connection line CWL1 may cross the dummy patterns DMP, eleventh to fourteenth data fan-out lines DFL11, DFL12, DFL13, and DFL14, twenty-first to twenty-fourth data fan-out lines DFL21, DFL22, DFL23, and DFL24, thirty-first to thirty-fourth data fan-out lines DFL31, DFL32, DFL33, and DFL34, and forty-first to forty-fourth data fan-out lines DFL41, DFL42, DFL43, and DFL44 disposed in the first metal layer MTL1. The first connection line CWL1 may be insulated from the plurality of data fan-out lines DFL.

The first connection line CWL1 may cross the first to third data lines DL1, DL2, and DL3, the sensing line SL, the first voltage line VDL, and the vertical voltage line WSL disposed in the second metal layer MTL2. The first connection line CWL1 may be insulated from the first to third data lines DL1, DL2, and DL3, the sensing line SL, the first voltage line VDL, and the vertical voltage line WSL. The first connection line CWL1 may cross the second to fifth gate lines GL2, GL3, GL4, and GL5, the second voltage lines VSL, and the horizontal voltage lines HVDL disposed in the fourth metal layer MTL4. The first connection line CWL1 may be insulated from the second to fifth gate lines GL2, GL3, GL4, and GL5, the second voltage lines VSL, and the horizontal voltage lines HVDL.

The first gate fan-out line GFL1 may be connected to the first gate line GL1 through the first connection line CWL1 disposed in the third metal layer MTL3. The first connection line CWL1 may be insulated from the plurality of data fan-out lines DFL to supply a gate signal to the first gate line GL1. Accordingly, the display device 10 may include the first connection line CWL1 disposed in the third metal layer MTL3 of the thin film transistor layer TFTL to electrically connect the first gate fan-out line GFL1 disposed in the display area DA to the first gate line GL1 without including a separate metal layer or mask.

The second gate fan-out line GFL2 may be electrically connected to the second gate line GL2 through the second connection line CWL2 disposed in the third metal layer MTL3. The third gate fan-out line GFL3 may be electrically connected to the third gate line GL3 through the third connection line CWL3 disposed in the third metal layer MTL3. The fourth gate fan-out line GFL4 may be electrically connected to the fourth gate line GL4 through the fourth connection line CWL4 disposed in the third metal layer MTL3. The fifth gate fan-out line GFL5 may be electrically connected to the fifth gate line GL5 through the fifth connection line CWL5 disposed in the third metal layer MTL3. Accordingly, the display device 10 may include the plurality of connection lines CWL disposed in the third metal layer MTL3 of the thin film transistor layer TFTL to electrically connect the plurality of gate fan-out lines GFL disposed in the display area DA to the plurality of gate lines GL without including a separate metal layer or mask.

Figure 30:
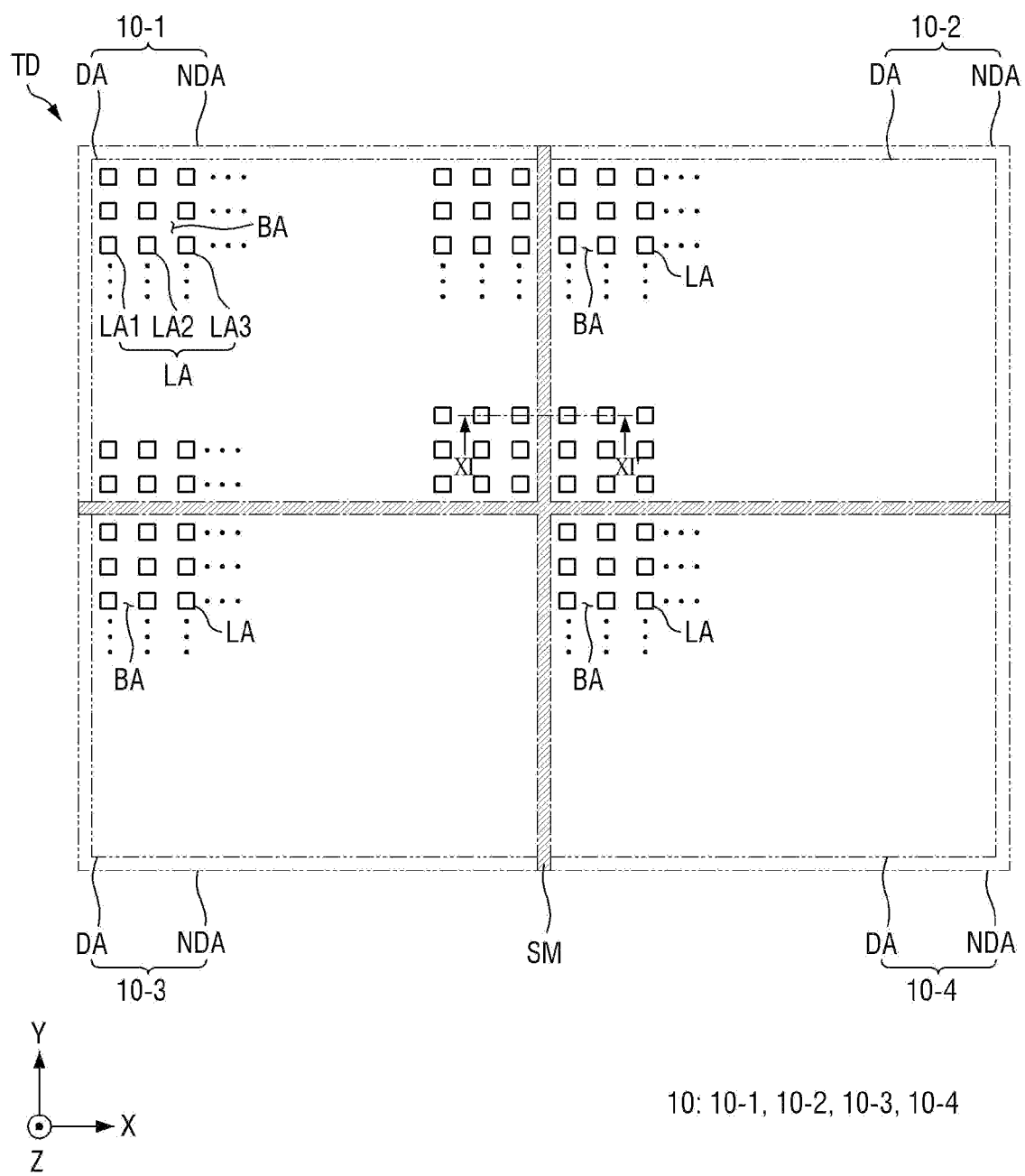
FIG. 30 is a plan view illustrating a coupling structure of the tiled display device according to one or more embodiments.
Figure 31:
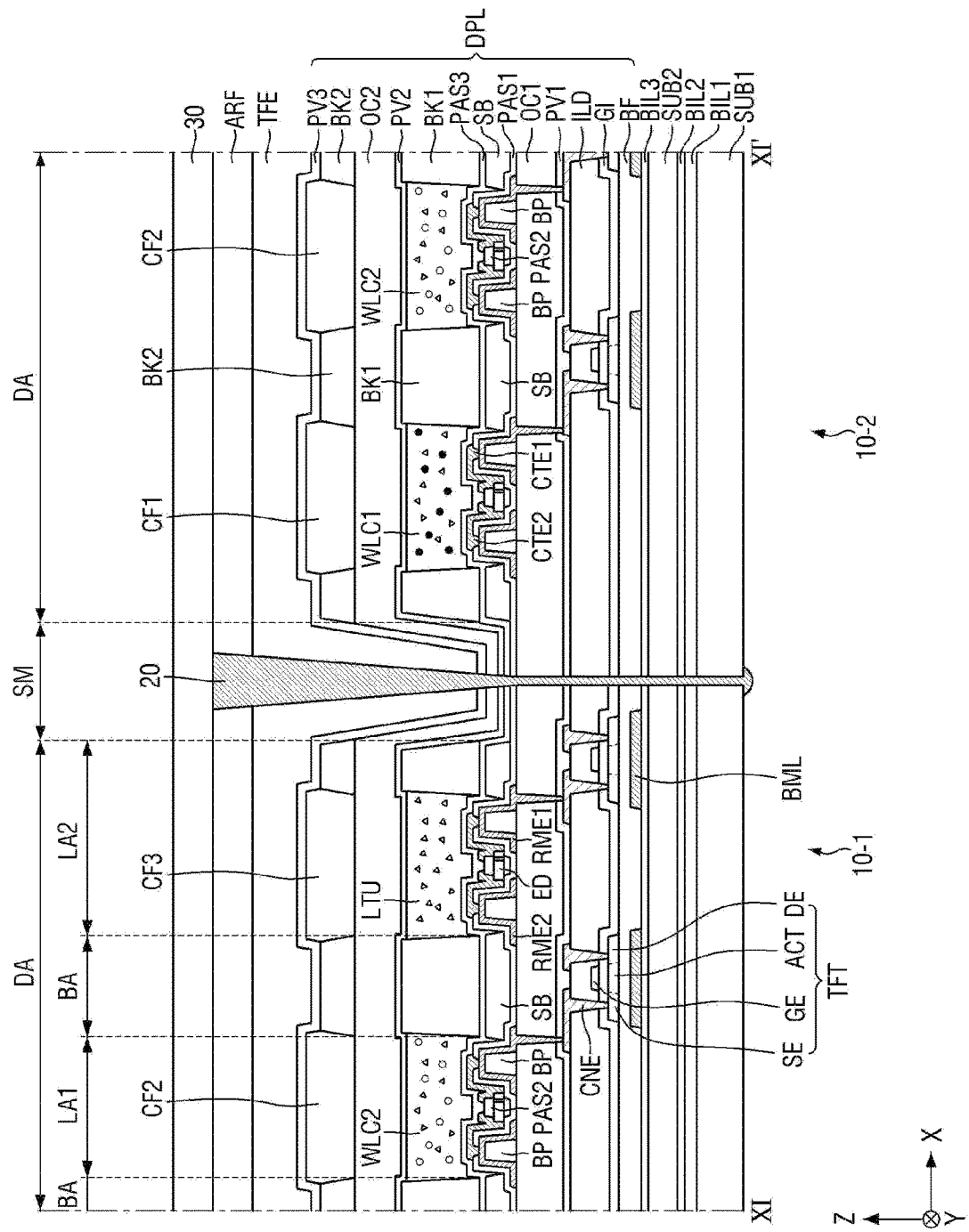
FIG. 31 is a cross-sectional view taken along the line XI-XI' of FIG. 30.

FIG. 30 is a plan view illustrating a coupling structure of the tiled display device according to one or more embodiments, and FIG. 31 is a cross-sectional view taken along the line XI-XI' of FIG. 30.

Referring to FIGS. 30 and 31, the tiled display device TD may include a plurality of display devices 10, coupling parts 20, and a cover member 30. The plurality of display devices 10 may be arranged in a lattice shape, but are not limited thereto. The plurality of display devices 10 may be connected to each other in the first direction (X-axis direction) or the second direction (Y-axis direction), and the tiled display device TD may have a specific shape. As an example, the plurality of display devices 10 may have the same size, but are not limited thereto. For example, the plurality of display devices 10 may have different sizes.

The tiled display device TD may include first to fourth display devices 10-1 to 10-4. The number of display devices 10 and a coupling relationship between the display devices 10 are not limited to those shown in FIG. 30. The number of display devices 10 may be determined according to sizes of each of the display devices 10 and the tiled display device TD. For example, the tiled display device TD may include the display device 10 illustrated in FIG. 5, 14, 18, 21, 24, or 27.

The display device 10 may include a display area DA and a non-display area NDA. The display area DA may include a plurality of pixels to display an image. The non-display area NDA may be disposed around the display area DA to surround the display area DA, and may not display an image.

The tiled display device TD may include coupling areas SM disposed between the plurality of display areas DA. The tiled display device TD may be formed by connecting the non-display areas NDA of each of adjacent display devices 10 to each other. The plurality of display devices 10 may be connected to each other through coupling parts 20 or adhesive members disposed in the coupling areas SM between the plurality of display devices 10. The coupling areas SM of each of the plurality of display devices 10 may not include pad parts, fan-out lines, or flexible films. Accordingly, a distance between the display areas DA of each of the plurality of display devices 10 may be too small for the coupling areas SM between the plurality of display devices 10 to be recognized by the user. In addition, an external light reflectivity of the display areas DA of each of the plurality of display devices 10 may be substantially the same as an external light reflectivity of the coupling areas SM between the plurality of display devices 10. Accordingly, the tiled display device TD may remove or reduce a sense of discontinuity between the plurality of display devices 10 and improve a degree of immersion of an image by preventing or substantially preventing the coupling areas SM between the plurality of display devices 10 from being recognized by the user.

The display device 10 may include a plurality of pixels arranged along a plurality of rows and columns in the display area DA. Each of the plurality of pixels may include an emission area LA defined by a pixel defining film or a bank, and may emit light having a peak wavelength (e.g., a predetermined peak wavelength) through the emission area LA. For example, the display area DA of the display device 10 may include first to third emission areas LA1, LA2, and LA3. Each of the first to third emission areas LA1, LA2, and LA3 may be an area in which light generated by a light emitting element of the display device 10 is emitted to the outside of the display device 10.

The first to third emission areas LA1, LA2, and LA3 may be sequentially and repeatedly disposed along the first direction (X-axis direction) of the display area DA. As an example, an area of the first emission area LA1 may be greater than that of the second emission area LA2, and an area of the second emission area LA2 may be greater than that of the third emission area LA3. As another example, an area of the first emission area LA1, an area of the second emission area LA2, and an area of the third emission area LA3 may be substantially the same as each other.

The display area DA of the display device 10 may include light blocking areas BA surrounding a plurality of emission areas LA. The light blocking areas BA may prevent or reduce color mixing of light emitted from the first to third emission areas LA1, LA2, and LA3.

In the tiled display device TD, side surfaces of adjacent display devices 10 may be coupled to each other using the coupling parts 20 disposed between the plurality of display devices 10. The coupling parts 20 may connect side surfaces of the first to fourth display devices 10-1 to 10-4 arranged in a lattice shape to each other to implement the tiled display device TD. The coupling part 20 may couple side surfaces of the first substrates SUB1, side surfaces of the first and second barrier insulating films BIL1 and BIL2, side surfaces of the second substrates SUB2, side surfaces of the third barrier insulating films BIL3, side surfaces of the display layers DPL, side surfaces of the encapsulation layers TFE, and side surfaces of the anti-reflection films ARF of the adjacent display devices 10 to each other.

As an example, the coupling part 20 may be formed of an adhesive or a double-sided tape having a relatively small thickness to minimize or reduce an interval between the plurality of display devices 10. As another example, the coupling part 20 may be formed of a coupling frame having a relatively small thickness to minimize or reduce an interval between the plurality of display devices 10. Accordingly, the tiled display device TD may prevent or substantially prevent the coupling areas SM between the plurality of display devices 10 from being recognized by the user.

The cover member 30 may be disposed on upper surfaces of the plurality of display devices 10 and the coupling parts 20 to cover the plurality of display devices 10 and the coupling parts 20. For example, the cover member 30 may be disposed on an upper surface of the anti-reflection film ARF of each of the plurality of display devices 10. The cover member 30 may protect an upper surface of the tiled display device TD.

While the present disclosure has been particularly shown and described with reference to embodiments thereof, it will be understood by those of ordinary skill in the art that various changes in form and details may be made therein without departing from the spirit and scope of the present disclosure as set forth in the following claims, and their equivalents.

What is claimed is:

1. A display device comprising:
   a first substrate;
   a plurality of gate fan-out lines and a plurality of data fan-out lines in a first metal layer on the first substrate;
   a second substrate on the first metal layer;
   a data line in a second metal layer on the second substrate and extending in a first direction;
   a gate insulating film on the second metal layer and the second substrate;
   a gate electrode of a thin film transistor in a third metal layer on the gate insulating film;
   an interlayer insulating film on the third metal layer and the gate insulating film;
   a plurality of gate lines in a fourth metal layer on the interlayer insulating film and extending in a second direction crossing the first direction; and
   at least one connection line in at least one of the second, the third, or the fourth metal layers, crossing the plurality of data fan-out lines in a plan view, and electrically connecting some of the plurality of gate fan-out lines to corresponding gate lines of the plurality of gate lines.

2. The display device of claim 1, wherein the at least one connection line comprises a first connection line electrically connecting a first gate fan-out line of the plurality of gate fan-out lines to a first gate line of the plurality of gate lines, and
wherein the first connection line comprises:
a first-first connection line in the second metal layer, the first-first connection line being connected to the first gate fan-out line;
a first-second connection line in the fourth metal layer, the first-second connection line being connected to the first-first connection line; and
a first-third connection line in the second metal layer, the first-third connection line electrically connecting the first-second connection line and the first gate line to each other.

3. The display device of claim 2, further comprising a sensing line and a first voltage line in the second metal layer, the sensing line and the first voltage line extending in the first direction,
wherein the first-second connection line crosses the data line, the sensing line, and the first voltage line in a plan view.

4. The display device of claim 2, further comprising a second voltage line in the fourth metal layer, the second voltage line extending in the second direction,
wherein the first-first connection line and the first-third connection line cross at least one of the plurality of gate lines and the second voltage line in a plan view.

5. The display device of claim 2, wherein the at least one connection line further comprises a second connection line electrically connecting a second gate fan-out line of the plurality of gate fan-out lines to a second gate line of the plurality of gate lines, and
wherein the second connection line is in the second metal layer and extends in the first direction.

6. The display device of claim 5, wherein the second connection line crosses at least one of the plurality of gate lines in a plan view.

7. The display device of claim 1, wherein the at least one connection line comprises a first connection line electrically connecting a first gate fan-out line of the plurality of gate fan-out lines to a first gate line of the plurality of gate lines, and
wherein the first connection line comprises:
a first-first connection line in the third metal layer, the first-first connection line being connected to the first gate fan-out line;
a first-second connection line in the fourth metal layer, the first-second connection line being connected to the first-first connection line; and
a first-third connection line in the third metal layer, the first-third connection line electrically connecting the first-second connection line and the first gate line to each other.

8. The display device of claim 7, wherein the at least one connection line further comprises a second connection line electrically connecting a second gate fan-out line of the plurality of gate fan-out lines to a second gate line of the plurality of gate lines, and
wherein the second connection line is in the third metal layer, the second connection line extending in the first direction.

9. The display device of claim 1, wherein the at least one connection line comprises a first connection line electrically connecting a first gate fan-out line of the plurality of gate fan-out lines to a first gate line of the plurality of gate lines, and
wherein the first connection line comprises:
a first-first connection line in the second metal layer, the first-first connection line being connected to the first gate fan-out line;
a first-second connection line in the third metal layer, the first-second connection line being connected to the first-first connection line; and
a first-third connection line in the second metal layer, the first-third connection line electrically connecting the first-second connection line and the first gate line to each other.

10. The display device of claim 1, wherein the at least one connection line comprises a first connection line electrically connecting a first gate fan-out line of the plurality of gate fan-out lines to a first gate line of the plurality of gate lines, and
wherein the first connection line comprises:
a first-first connection line in the second metal layer, the first-first connection line being connected to the first gate fan-out line;
a first-second connection line in the fourth metal layer, the first-second connection line being connected to the first-first connection line; and
a first-third connection line in the third metal layer, the first-third connection line electrically connecting the first-second connection line and the first gate line to each other.

11. The display device of claim 1, wherein the at least one connection line comprises a first connection line electrically connecting a first gate fan-out line of the plurality of gate fan-out lines to a first gate line of the plurality of gate lines, and
wherein the first connection line comprises:
a first-first connection line in the second metal layer, the first-first connection line being connected to the first gate fan-out line; and
a first-second connection line in the third metal layer, the first-second connection line electrically connecting the first-first connection line and the first gate line to each other.

12. The display device of claim 11, wherein the first-first connection line extends in the first direction, and
wherein the first-second connection line extends from the first-first connection line in the second direction and is then bent, and extends in the first direction.

13. The display device of claim 1, wherein the at least one connection line comprises a first connection line electrically connecting a first gate fan-out line of the plurality of gate fan-out lines to a first gate line of the plurality of gate lines, and
wherein the first connection line is in the third metal layer, the first connection line being bent multiple times.

14. A tiled display device comprising:
a plurality of display devices each including a display area comprising a plurality of pixels and a non-display area around the display area; and
a coupling part coupling the plurality of display devices to each other,
wherein each of the plurality of display devices comprises:

a first substrate;

a plurality of gate fan-out lines and a plurality of data fan-out lines in a first metal layer on the first substrate;

a second substrate on the first metal layer;

a data line in a second metal layer on the second substrate and extending in a first direction;

a gate insulating film on the second metal layer and the second substrate;

a gate electrode of a thin film transistor in a third metal layer on the gate insulating film;

an interlayer insulating film on the third metal layer and the gate insulating film;

a plurality of gate lines in a fourth metal layer on the interlayer insulating film and extending in a second direction crossing the first direction; and at least one connection line in at least one of the second, the third, or the fourth metal layers, crossing the plurality of data fan-out lines in a plan view, and electrically connecting some of the plurality of gate fan-out lines to corresponding gate lines of the plurality of gate lines.

15. An electronic device comprising:

a first substrate;

a plurality of gate fan-out lines and a plurality of data fan-out lines in a first metal layer on the first substrate;

a second substrate on the first metal layer;

a data line in a second metal layer on the second substrate and extending in a first direction;

a gate insulating film on the second metal layer and the second substrate;

a gate electrode of a thin film transistor in a third metal layer on the gate insulating film;

an interlayer insulating film on the third metal layer and the gate insulating film;

a plurality of gate lines in a fourth metal layer on the interlayer insulating film and extending in a second direction crossing the first direction; and at least one connection line in at least one of the second, the third, or the fourth metal layers, crossing the plurality of data fan-out lines in a plan view, and electrically connecting some of the plurality of gate fan-out lines to corresponding gate lines of the plurality of gate lines.

* * * * *